(12) United States Patent
Lu

(10) Patent No.: US 12,706,124 B2
(45) Date of Patent: Aug. 11, 2026

(54) SEMICONDUCTOR DEVICE STRUCTURE

(71) Applicant: Etron Technology, Inc., Hsinchu (TW)

(72) Inventor: Chao-Chun Lu, Taipei City (TW)

(73) Assignee: Etron Technology, Inc., Hsinchu (TW)

( * ) Notice: Subject to any disclaimer, the term of this patent is extended or adjusted under 35 U.S.C. 154(b) by 408 days.

(21) Appl. No.: 18/408,510

(22) Filed: Jan. 9, 2024

(65) Prior Publication Data

US 2024/0153540 A1 May 9, 2024

Related U.S. Application Data

(63) Continuation-in-part of application No. 17/858,986, filed on Jul. 6, 2022, now Pat. No. 12,148,500, which is a continuation of application No. 17/065,543, filed on Oct. 8, 2020, now Pat. No. 11,417,369.

(60) Provisional application No. 63/607,577, filed on Dec. 8, 2023, provisional application No. 63/003,302, filed on Apr. 1, 2020, provisional application No. 62/955,457, filed on Dec. 31, 2019.

(51) Int. Cl.
*H10B 12/00* (2023.01)
*G11C 5/06* (2006.01)
*H10D 62/10* (2025.01)

(52) U.S. Cl.
CPC ......... *G11C 5/063* (2013.01); *H10B 12/0335* (2023.02); *H10B 12/053* (2023.02); *H10B 12/315* (2023.02); *H10B 12/34* (2023.02); *H10B 12/482* (2023.02); *H10B 12/488* (2023.02); *H10D 62/116* (2025.01)

(58) Field of Classification Search
CPC .. G11C 5/063; H10D 62/116; H10B 12/0335; H10B 12/053; H10B 12/315; H10B 12/34; H10B 12/482; H10B 12/488
See application file for complete search history.

(56) References Cited

U.S. PATENT DOCUMENTS

| | | | | |
|---|---|---|---|---|
| 6,452,249 | B1 * | 9/2002 | Maeda | H10W 20/497 257/E27.026 |
| 9,397,180 | B1 | 7/2016 | Yang | |
| 2003/0211683 | A1 | 11/2003 | Kim | |
| 2004/0106252 | A1 | 6/2004 | Jeong | |
| 2007/0155148 | A1 | 7/2007 | Kim | |
| 2011/0073925 | A1 | 3/2011 | Park | |
| 2018/0166553 | A1 | 6/2018 | Lee | |
| 2024/0145536 | A1 * | 5/2024 | Lu | H10B 12/053 |

FOREIGN PATENT DOCUMENTS

| | | | |
|---|---|---|---|
| JP | 2007-184518 | A | 7/2007 |
| KR | 10-0720232 | B1 | 5/2007 |
| KR | 10-2011-0035686 | A | 4/2011 |
| KR | 10-2015-0053020 | A | 5/2015 |
| KR | 10-2018-0068846 | A | 6/2018 |
| TW | 202240856 | A | 10/2022 |

* cited by examiner

*Primary Examiner* — Hoai V Pham
(74) *Attorney, Agent, or Firm* — Winston Hsu

(57) ABSTRACT

A semiconductor device structure includes a silicon substrate, a transistor, and an interconnection. The silicon substrate has a silicon surface. The transistor includes a gate structure, a first conductive region, a second conductive region, and a channel under the silicon surface. The interconnection is extended beyond the transistor and coupled to the first conductive region of the transistor. The interconnection is disposed under the silicon surface and isolated from the silicon substrate by an isolation region.

11 Claims, 45 Drawing Sheets

(a)

(b)

(a)

(b)

(a)

(b)

(a)

(b)

(a)

(b)

SEMICONDUCTOR DEVICE STRUCTURE

CROSS REFERENCE TO RELATED APPLICATIONS

This application is a continuation-in-part of U.S. application Ser. No. 17/858,986, filed on Jul. 6, 2022, which is a continuation application of U.S. application Ser. No. 17/065,543, filed on Oct. 8, 2020, which claims the benefit of U.S. Provisional Application No. 62/955,457, filed on Dec. 31, 2019, and claims the benefit of U.S. Provisional Application No. 63/003,302, filed on Apr. 1, 2020. Further, this application claims the benefit of U.S. Provisional Application No. 63/607,577, filed on Dec. 8, 2023. The contents of these applications are incorporated herein by reference.

BACKGROUND OF THE INVENTION

1. Field of the Invention

The present invention relates to a semiconductor device structure, and particularly to a semiconductor device structure that has an underground interconnection embedded into a silicon substrate with both high conductivity and effectively optimized isolations from the silicon substrate.

2. Description of the Prior Art

In the state-of-the-art integrated circuits, there are many transistors which are connected by conductive interconnections (e.g., metal wires, polysilicon wires, etc.) to facilitate a signal transfer among gate, source, and drain (GSD) of the transistors. All the metal wires depend on many contact holes and connection plugs to connect themselves with GSD, respectively, which causes significant challenges and difficulties with respect to chip-design targets of reducing area, power and noise and increasing performances of the integrated circuits especially when dimensions of the integrated circuits on dice need to be shrunk significantly owing to demands on scaling device dimensions in order to satisfy Moore's Law.

Taking concerning on an area penalty as an example: a much larger source or drain diffusion area in contrast to the contact-hole size for connecting metal wires to either source or drain must be designed so that the unavoidable photolithographic misalignment due to limitations of lithographic tools should not cause the contact holes to be made outside the underneath edges of source or drain region, respectively. The larger source or drain diffusion area inevitably increases diffusion areas of transistors and a die area where the transistors are located, which also induces large capacitances to cause significant penalties to alternating current (ac) performance of circuits including the transistors, to consume higher power, and to add larger noises.

Therefore, how to introduce a better self-aligned contact structure and technology to use the least surface areas for connecting a transistor to a first interconnect (metal) layer corresponding to the transistor to transmit and receive signals becomes an important issue for further effective scaling down and improving performance of the transistor.

SUMMARY OF THE INVENTION

The present invention discloses a structural invention of transistors by new technologies (including new process integrations) which achieves an underground interconnection embedded into a silicon substrate with both high conductivity and effectively optimized isolations from the silicon substrate. The underground interconnection can be connected vertically (bridged) to either source or drain by a compact self-alignment invention, resulting in many device and circuit design innovations being created. For example, underground interconnections can be vertically connected to various sources and drains, respectively, and the other ends of the underground interconnections can be linked to various signal sources, Ground and VDD. Further, chip architecture can even introduce different layers or various levels of supply voltages vertically distributed in the silicon substrate but embedded with necessary isolations underneath the horizontal silicon surface (HSS), wherein the chip architecture can enhance both transistor and circuit performances (speed, power and noise, etc.) accordingly and reduce more complexities above the HSS (e.g., the current complicated chip design may need to use tenth layer of interconnections as the VDD but the below nine layers of interconnections above HSS are needed to transfer signals in the current complicated chip design, wherein the ten interconnection layers are quite complicated to be stacked and consume quite large contact areas, etc.). To give an analogy for the present invention: to buildup different ladders from wires under the HSS to wires above the HSS, the wires under the HSS can be designed to have different depths which allow the wires under the HSS to be distributed across a die for supplying various signals, Ground or VDD levels without colliding one another in pretty wide or even wild dimensions into the silicon substrate.

An embodiment of the present invention provides a semiconductor device structure. The semiconductor device structure includes a silicon substrate, a transistor, and an interconnection. The silicon substrate has a silicon surface. The transistor includes a gate structure, a first conductive region, a second conductive region, and a channel under the silicon surface. The interconnection is extended beyond the transistor and coupled to the first conductive region of the transistor. The interconnection is disposed under the silicon surface and isolated from the silicon substrate by an isolation region.

According to another aspect of the invention, the semiconductor device structure further includes another transistor and a signal line electrically coupled to the another transistor, wherein the signal line is distributed under the silicon surface and separated from the interconnection.

According to another aspect of the invention, a distance between the silicon surface and a top surface of the interconnection is different from a distance between the silicon surface and a top surface of the signal line.

According to another aspect of the invention, the semiconductor device structure further includes another transistor and a power line electrically coupled to the another transistor, wherein the power line is distributed under the silicon surface and separated from the interconnection.

According to another aspect of the invention, the power line is coupled to a voltage source or a ground source.

Another embodiment of the present invention provides a semiconductor device structure. The semiconductor device structure includes a silicon substrate, a transistor, and an interconnection. The silicon substrate has a silicon surface. The transistor includes a gate structure, a first conductive region, a second conductive region, and a channel under the silicon surface. The interconnection is extended beyond the transistor and coupled to the gate structure of the transistor. The interconnection includes an upper portion which is above the silicon surface, and a sidewall of the upper portion of the interconnection is aligned with a sidewall of the gate structure.

According to another aspect of the invention, the semiconductor device structure further includes a first spacer and a second spacer, wherein the first spacer covers a first side of the gate structure and is positioned above the silicon surface; and the second spacer covers a second side of the gate structure and is positioned above the silicon surface.

According to another aspect of the invention, the first spacer abuts against the sidewall of the upper portion of the interconnection.

According to another aspect of the invention, the semiconductor device structure further includes a dielectric layer disposed under the first spacer, the second spacer, and the gate structure.

According to another aspect of the invention, at least part of the gate structure extends downward from the silicon surface, and at least part of the channel positioned under and extending along a bottom of the dielectric layer.

Another embodiment of the present invention provides a semiconductor device structure. The semiconductor device structure includes a silicon substrate, a transistor, and an interconnection. The silicon substrate has a silicon surface. The transistor includes a gate structure, a first conductive region, a second conductive region, and a channel under the silicon surface. The interconnection is extended beyond the transistor and electrically coupled to the first conductive region of the transistor through a bridge contact. A first sidewall of the bridge contact is aligned with an edge of the first conductive region and a second sidewall of the bridge contact is aligned with an edge of the interconnection.

According to another aspect of the invention, the bridge contact includes an upper portion and a lower portion, the upper portion of the bridge contact abuts against the silicon substrate and the lower portion is separated from the silicon substrate.

According to another aspect of the invention, a first isolating layer at least covers the first sidewall, the second sidewall and a bottom of the lower portion of the bridge contact.

According to another aspect of the invention, the first isolating layer further covers a third sidewall of the lower portion of the bridge contact, and a second isolating layer further covers a fourth sidewall of the lower portion of the bridge contact, wherein the third sidewall of the lower portion is substantially parallel to the fourth sidewall of the lower portion, and a width of the second isolating layer is different from a width of the first isolating layer.

According to another aspect of the invention, the interconnection is disposed under the silicon surface, and the lower portion of the bridge contact abuts against the interconnection.

Another embodiment of the present invention provides a semiconductor device structure. The semiconductor device structure includes a silicon substrate, a first transistor, and an interconnection. The silicon substrate has a silicon surface. The first transistor includes a gate structure, a first conductive region, a second conductive region, and a channel under the silicon surface. The interconnection is electrically coupled to the first conductive region of the first transistor through a bridge contact. The interconnection is positioned under the silicon surface and an isolation cap is disposed on the bridge contact to isolate the bridge contact. The bridge contact includes an upper portion and a lower portion, and at least a first sidewall of the lower portion of the bridge contact abuts against an isolating layer, and an edge of the isolation cap is aligned with an edge of the isolating layer.

According to another aspect of the invention, the semiconductor device structure further includes a first spacer disposed between the first conductive region and the gate structure of the first transistor, and the isolation cap contacting with the first conductive region of the first transistor.

According to another aspect of the invention, the semiconductor device structure further includes a second transistor next to the first transistor, wherein the second transistor includes a gate structure, a first conductive region and a second conductive region, the first conductive region of the second transistor contacts with isolation cap and is electrically coupled to the interconnection through the bridge contact.

According to another aspect of the invention, the semiconductor device structure further includes a third transistor next to the first transistor, wherein the third transistor includes a gate structure, a first conductive region and a second conductive region, the second conductive region of the third transistor is isolated from the second conductive region of the first transistor.

Another embodiment of the present invention provides a semiconductor device structure. The semiconductor device structure includes a silicon substrate, a trench, a first spacer, and a second spacer. The silicon substrate has a silicon surface. At least part of the trench is formed under the silicon surface. The first spacer covers a first side of the trench and the second spacer covers a second side of the trench. A material of the first spacer is different from a material of the second spacer.

According to another aspect of the invention, the first side of the trench and the second side of the trench are symmetrical.

Another embodiment of the present invention provides a semiconductor device structure. The semiconductor device structure includes a silicon substrate, a first interconnection, and a second interconnection. The silicon substrate has a silicon surface. The first interconnection is disposed under the silicon surface. The second interconnection is disposed under the silicon surface. A depth of the first interconnection from the silicon surface is substantially the same as a depth of the second interconnection from the silicon surface, and the first interconnection is separated from the second interconnection.

According to another aspect of the invention, a material of the first interconnection is a same as a material of the second interconnection.

Another embodiment of the present invention provides a semiconductor device structure. The semiconductor device structure includes a silicon substrate, a first transistor, a bridge contact, and an interconnection. The silicon substrate has a silicon surface. The first transistor includes a gate structure, a first conductive region, a second conductive region, and a channel under the silicon surface. The bridge contact includes an upper portion and a lower portion, wherein the bridge contact is electrically coupled to the first conductive region of the first transistor. The interconnection is positioned under the silicon surface and contacting the lower portion of the bridge contact.

According to another aspect of the invention, the first transistor is an n-type metal-oxide-semiconductor (NMOS) transistor and the first conductive region includes an n+ doping zone.

According to another aspect of the invention, the first transistor is a p-type metal-oxide-semiconductor (PMOS) transistor and the first conductive region includes a p+ doping zone.

Another embodiment of the present invention provides a semiconductor device structure. The semiconductor device structure includes a silicon substrate, an NMOS (n-type metal-oxide-semiconductor) transistor, a PMOS (p-type metal-oxide-semiconductor) transistor, a bridge contact, and an interconnection. The silicon substrate has a silicon surface. The NMOS transistor includes a gate structure, a first conductive region, and a first channel under the silicon surface. The PMOS transistor includes a gate structure, a second conductive region, and a second channel under the silicon surface. The bridge contact includes an upper portion and a lower portion, wherein the bridge contact is electrically coupled to the first conductive region of the NMOS transistor and electrically coupled to the second conductive region of the PMOS transistor. The interconnection is positioned under the silicon surface and contacting the lower portion of the bridge contact.

According to another aspect of the invention, the first conductive region of the NMOS transistor includes an n+ doping zone and the second conductive region of the PMOS transistor includes a p+ doping zone.

According to another aspect of the invention, a material of the bridge contact is a same as a material of the interconnection.

Another embodiment of the present invention provides a method to form a semiconductor device structure. The method comprises: preparing a semiconductor substrate with an original surface; based on the semiconductor substrate, forming a set of active regions and forming a shallow trench isolation region between two adjacent active regions of the set of active regions; forming asymmetrical spacers within the shallow trench isolation region between the two adjacent active regions, wherein a first spacer of the asymmetrical spacers is an oxide spacer covering a sidewall of a first active region of the two adjacent active regions, and a second spacer of the asymmetrical spacers is deposited within a narrow slot which reveal a sidewall of a second active region of the two adjacent active regions; and forming a first interconnection layer between the asymmetrical spacers; wherein the first interconnection layer is within the shallow trench isolation region and under the original surface of the semiconductor substrate.

According to another aspect of the invention, the material of the first spacer is different from that of the second spacer.

According to another aspect of the invention, the material of the first spacer is different from that of the second spacer.

According to another aspect of the invention, the second spacer is made of SiOCN.

According to another aspect of the invention, the method further comprises: forming a gate region of a transistor within the second active region and forming a second interconnection layer, wherein the gate region of the transistor is connected to the second interconnection layer; and forming a connection plug in the second active region to electrically connect the first interconnection layer.

According to another aspect of the invention, the step of forming the gate region of the transistor and the second interconnection layer comprises: etching the second active region to create a concave therein; depositing a high-k insulator layer in the concave; and depositing a first conductive material to form the gate region of the transistor and the second interconnection.

According to another aspect of the invention, the step of forming the connection plug comprises: etching the second active region to create a hole and forming a dielectric layer in the hole; based on the hole, removing the second spacer to reveal a sidewall of the first interconnection layer; and depositing a second conductive material in the hole to contact the sidewall of the first interconnection layer.

According to another aspect of the invention, the semiconductor structure is a DRAM cell, the first interconnection layer is a bit line, the transistor is an access transistor of a DRAM cell, and the second interconnection layer is a word line.

According to another aspect of the invention, the step of forming the asymmetrical spacers comprises: forming the oxide spacer to cover the sidewall of the first active region, and forming a temporary oxide spacer to cover the second active region; depositing a sacrificial layer over the shallow trench isolation region and covering the oxide spacer and the temporary oxide spacer; forming the narrow slot by removing a first portion of the sacrificial layer and the temporary oxide spacer to reveal the sidewall of the second active region; and depositing the second spacer within the narrow slot to cover the sidewall of the second active region.

According to another aspect of the invention, the narrow slot is fully occupied by the second spacer.

According to another aspect of the invention, the step of forming the narrow slot comprises: forming a patterned photo-resistance layer to reveal the first portion of the sacrificial layer; and removing the first portion of the sacrificial layer and the temporary oxide spacer covered by the first portion of the sacrificial layer to form the narrow slot. Wherein a width of the narrow slot is 2~5 nm.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
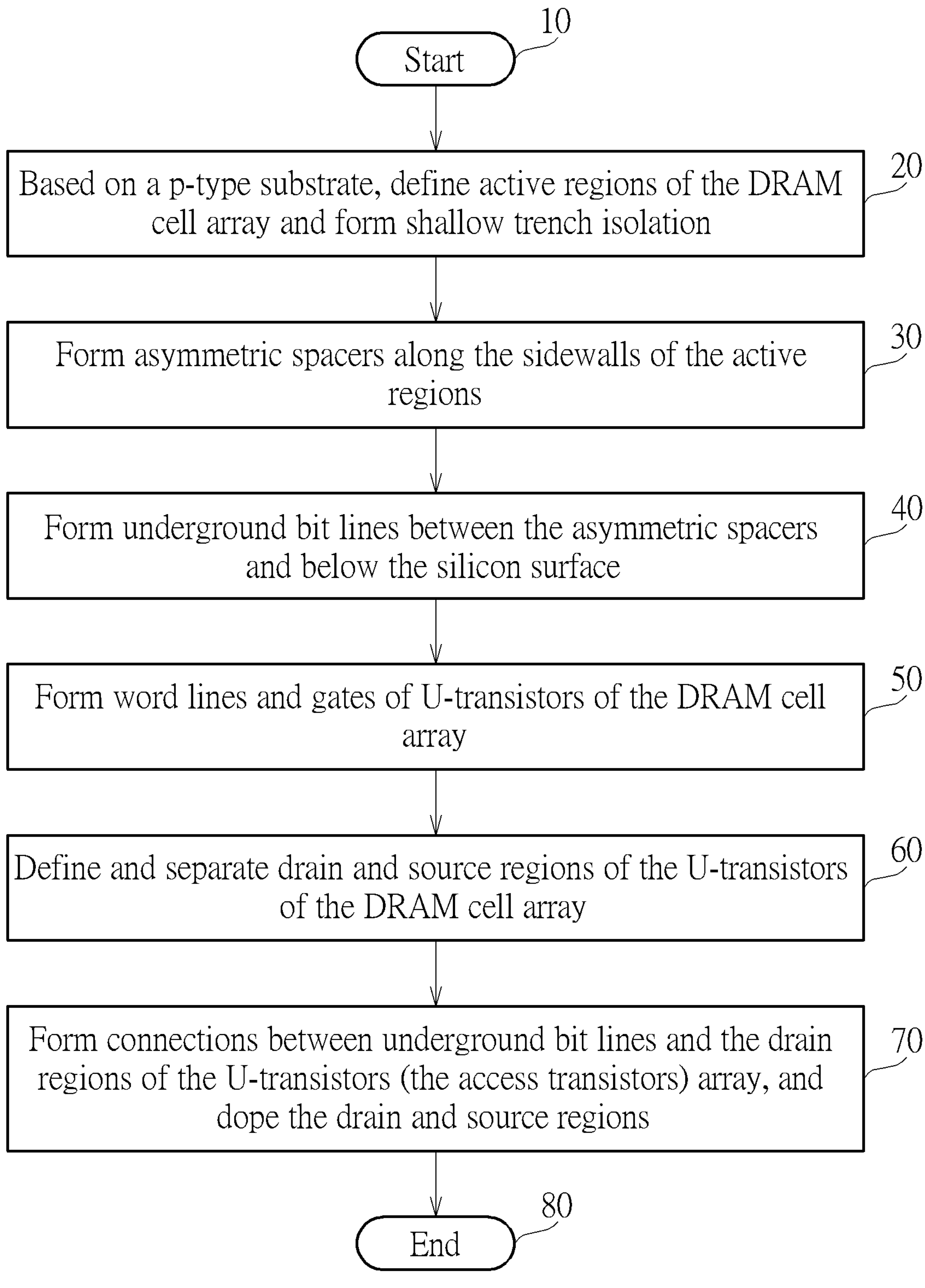
FIG. 1A is a flowchart illustrating a manufacturing method of a DRAM cell (1T1C cell) array according to an embodiment of the present invention.

In order to illustrate the present invention for integrated circuits including logic, digital, analog, memory, etc., a focus on memories is first selected in the following description of the present invention to make core principle of the present invention be easily grasped. There are many semiconductor memories which use different type of memory cells: for examples, dynamic random access memory (DRAM), static RAM, nonvolatile flash memories including NOR, NAND, 3D NAND, etc. All of the above-mentioned memories need to have bit lines and word lines. In addition, the present invention further discloses a new architecture for arranging the bit lines and the word lines; a core principle of the new architecture can be considered well to be applied to all of the above-mentioned memories. In the following embodiment of the present invention, the present invention takes a DRAM as an example to illustrate the core principle of the present invention and as one method of implementations of using the present invention. One of the most commonly used DRAM cells is 1T1C cell in which a gate of an access transistor (1T) included in the 1T1C cell is connected to a word line, a drain of the access transistor (1T) is connected to a bit line, and a source of the access transistor (1T) is connected to a capacitor (1C) included in the 1T1C cell.

In order to increase memory chip density, the 1T1C cell needs to be scaled down, that is, all geometrical dimensions of the 1T1C cell need to be shrunk to a smaller size and a design of the capacitor has been evolved into a three-dimensional (3D) structure to increase a capacitance of the capacitor, such as forming either a stacked capacitor above the access transistor (1T) or a trench capacitor below a surface of the access transistor (1T). Then, some difficulties are encountered, which become more difficult to be resolved as both technology and device are scaled down: (1) due to related cell geometries being shrunken, a total cell area of the 1T1C cell is reduced so that there is much smaller surface area to allow various necessary contacts to be formed, such as a contact between the capacitor and the source of the access transistor (1T), a contact between the bit line and the drain of the access transistor (1T); (2) the capacitance is reduced even if the capacitor (1C) is made by the 3D structure, for examples, if a stacked capacitor is made which becomes too tall above the surface of the access transistor (1T) so as to cause very rough and bad surface topography above the 1T1C cell, and if a trench capacitor is used, then the trench capacitor needs to be made very deep so as to cause difficulties in etching and refilling processes; (3) three structures of the word line, the bit line, and the capacitor are very difficult to be laid out on the same plane, especially geometrical conduction mechanism requires that the three structures are perpendicular or nearly perpendicular to one another, and sequences of forming one another among the three structures can make an efficient cell layout difficult, such as either a sequence of forming the capacitor after the bit line (COB) or a sequence of forming the bit line after the capacitor (BOC), respectively; (4) because the above-mentioned (3) causes a very small connecting area from the capacitor to the source of the access transistor (1T), especially it's hard to achieve some self-alignment among different structures which need to be connected; and (5) when the cell geometries continue to be scaled, a cell integration processes is getting much harder to achieve critical layers and geometrical patterns with self-alignment characteristics instead of fully depending upon lithographic scaling and alignments, and so forth.

Therefore, the present invention will disclose (1) a new structure of the bit line below the silicon surface (HSS), (2) a new structure for connecting the gate of the access transistor (1T) and the word line to critical vertical connections with self-alignment possibility, (3) a new structure of a vertical bridge material connecting the drain of the access transistor (1T) to a underground interconnection (VBDI), (4) a new structure of making the drain self-aligned to a channel with a desired distance created by spacers surrounding the word line, and (5) a new structure of isolating VBDI from all other conductive layers by making an insulator cap above the VBDI by self-alignment, and (6) all novel processing methods to achieve the present invention.

Please refer to FIG. 1A, FIG. 1B, FIG. 1C, FIG. 1D, FIG. 1E, FIG. 1F, FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24A, FIG. 24B, FIG. 25A, FIG. 25B, FIG. 26, FIG. 27, FIG. 28, wherein FIG. 1A is a flowchart illustrating a manufacturing method of a DRAM cell (1T1C cell) array according to an embodiment of the present invention.

Step 10: Start.

Step 20: Based on a p-type substrate, define active regions of the DRAM cell array and form shallow trench isolation (STI).

Step 30: Form asymmetric spacers along the sidewalls of the active regions.

Step 40: Form underground bit lines between the asymmetric spacers and below the silicon surface (HSS).

Step 50: Form word lines and gates of U-transistors (or the access transistors) of the DRAM cell array.

Step 60: Define and separate drain (i.e., first conductive regions) and source regions (i.e., second conductive regions) of the U-transistors of the DRAM cell array.

Step 70: Form connections between underground bit lines and drains structure of the U-transistors (the access transistors) array, and dope the drain and source regions.

Step 80: End.

Figure 1B:
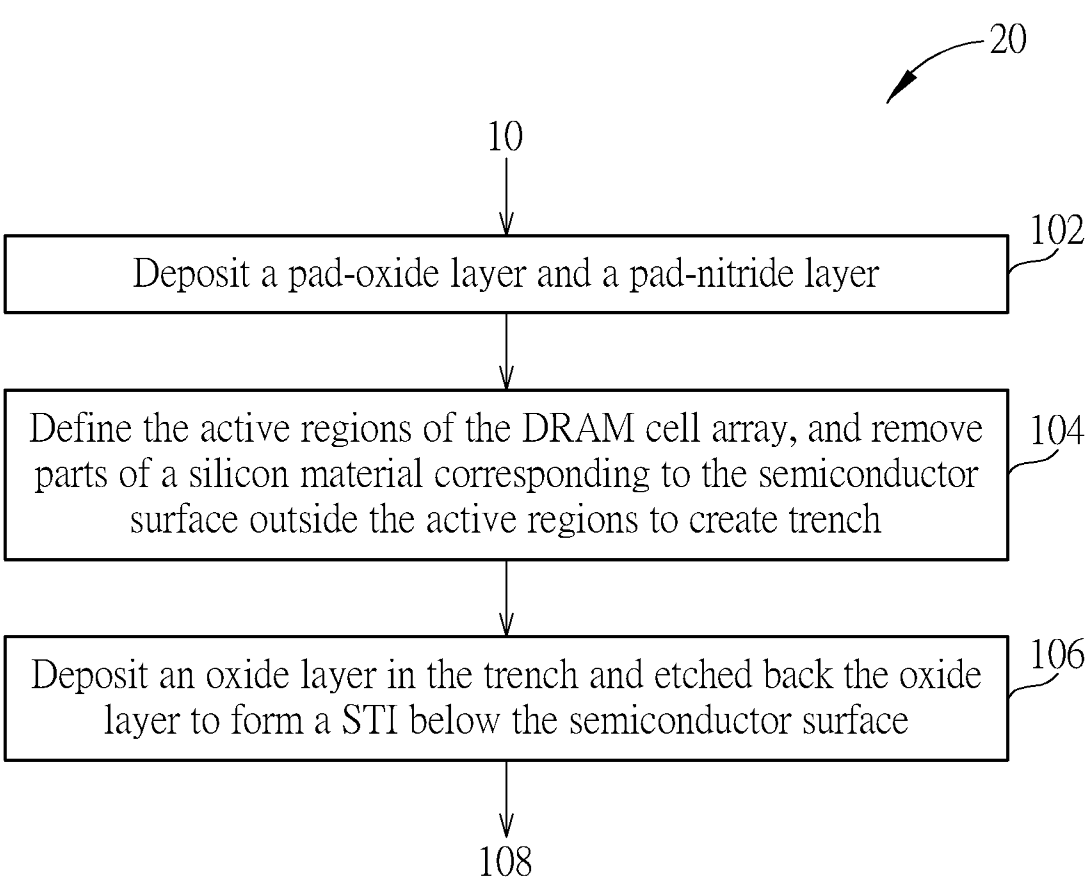
FIG. 1B, FIG. 1C, FIG. 1D, FIG. 1E, FIG. 1F, and FIG. 1G are diagrams illustrating FIG. 1A.
Figure 1C:
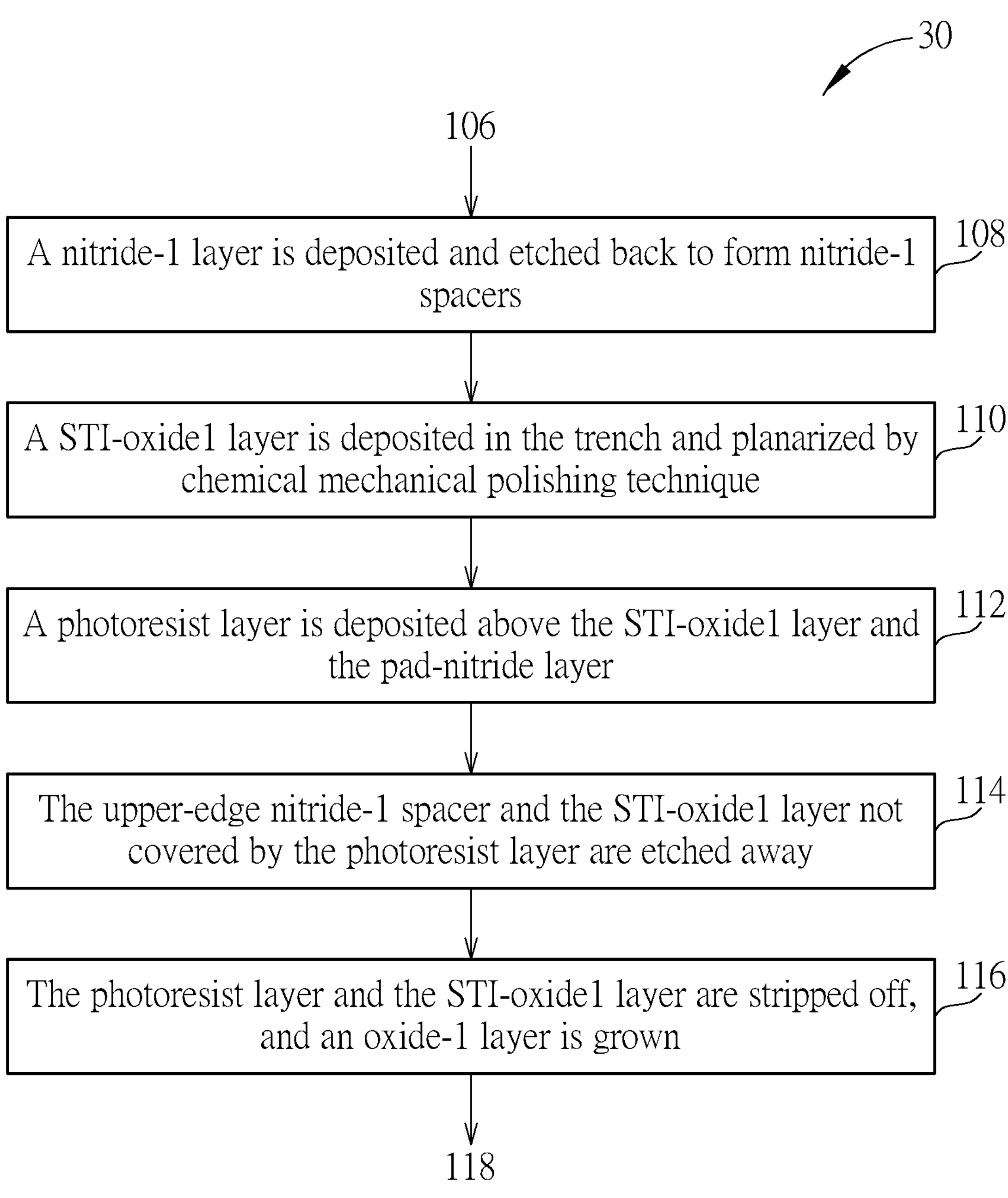
Figure 1D:
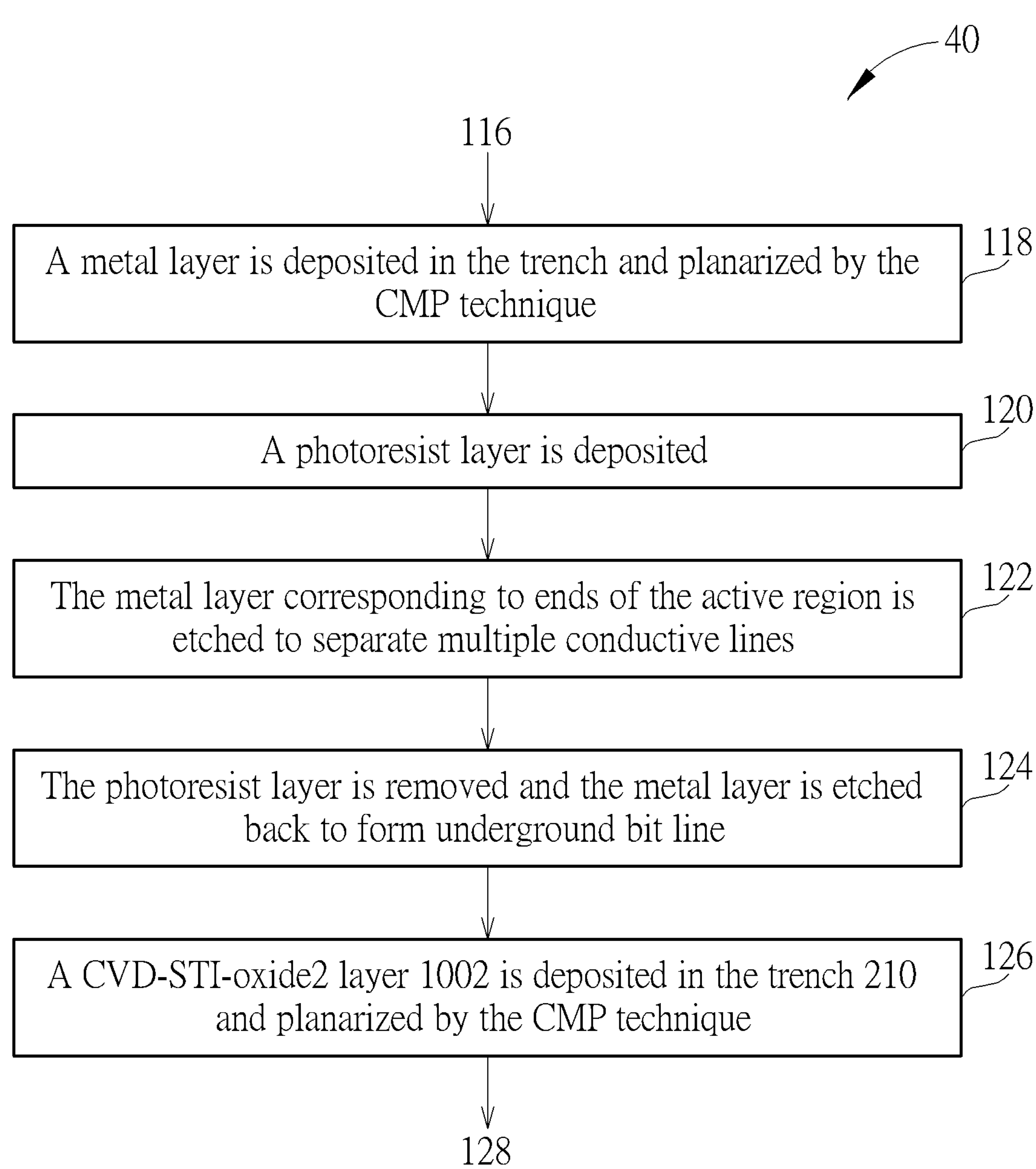
Figure 1E:
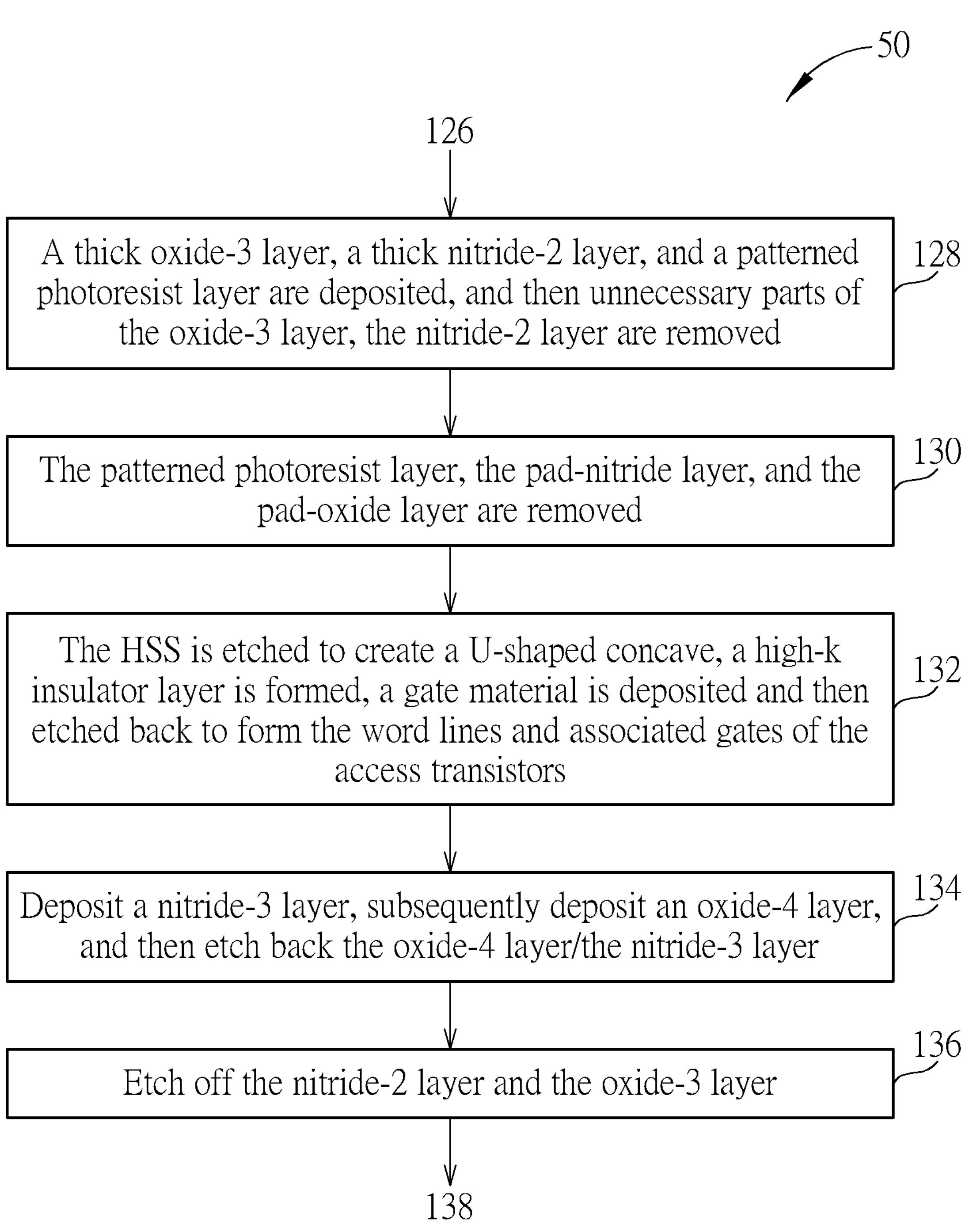
Figure 1F:
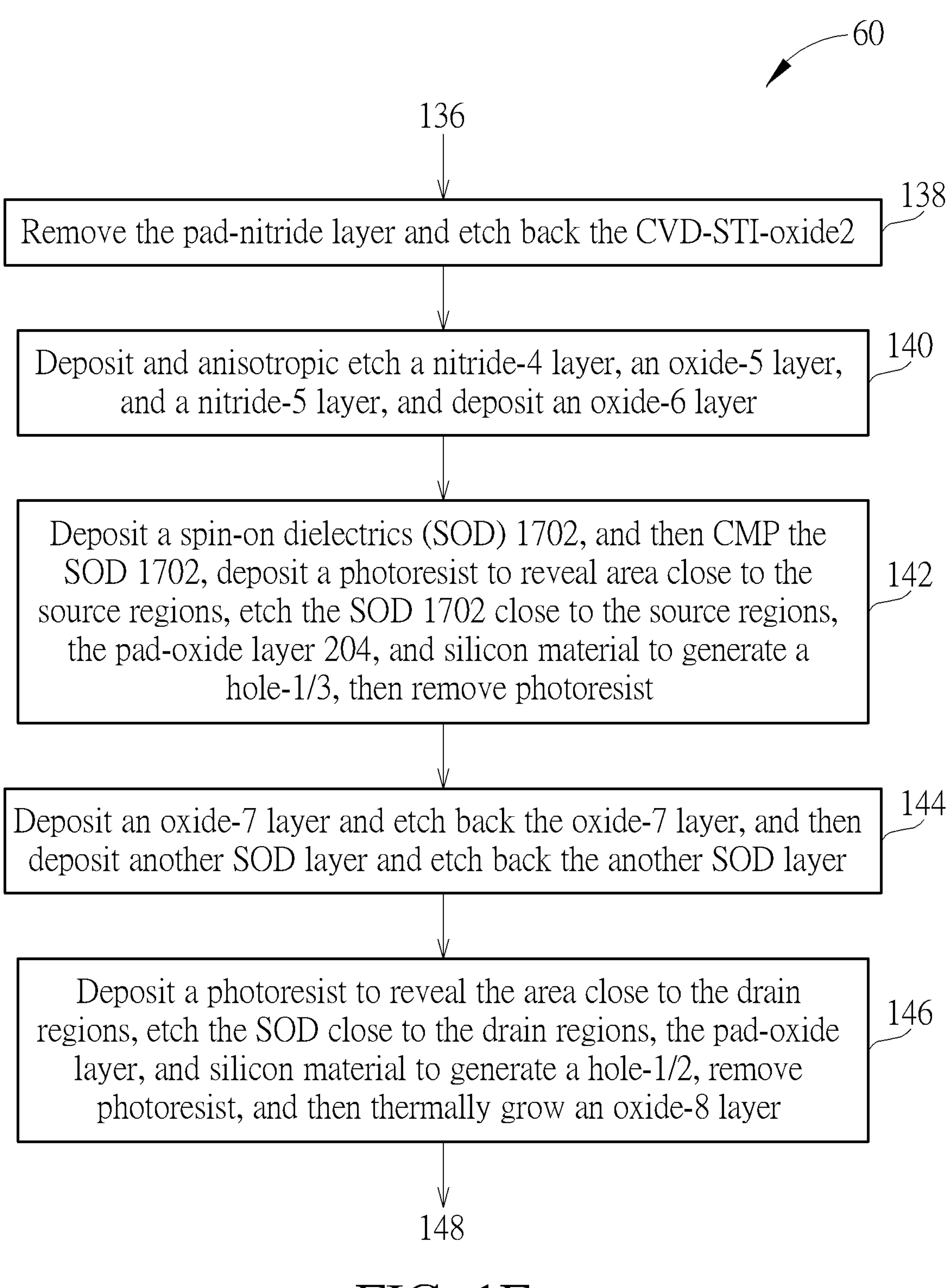
Figure 1G:
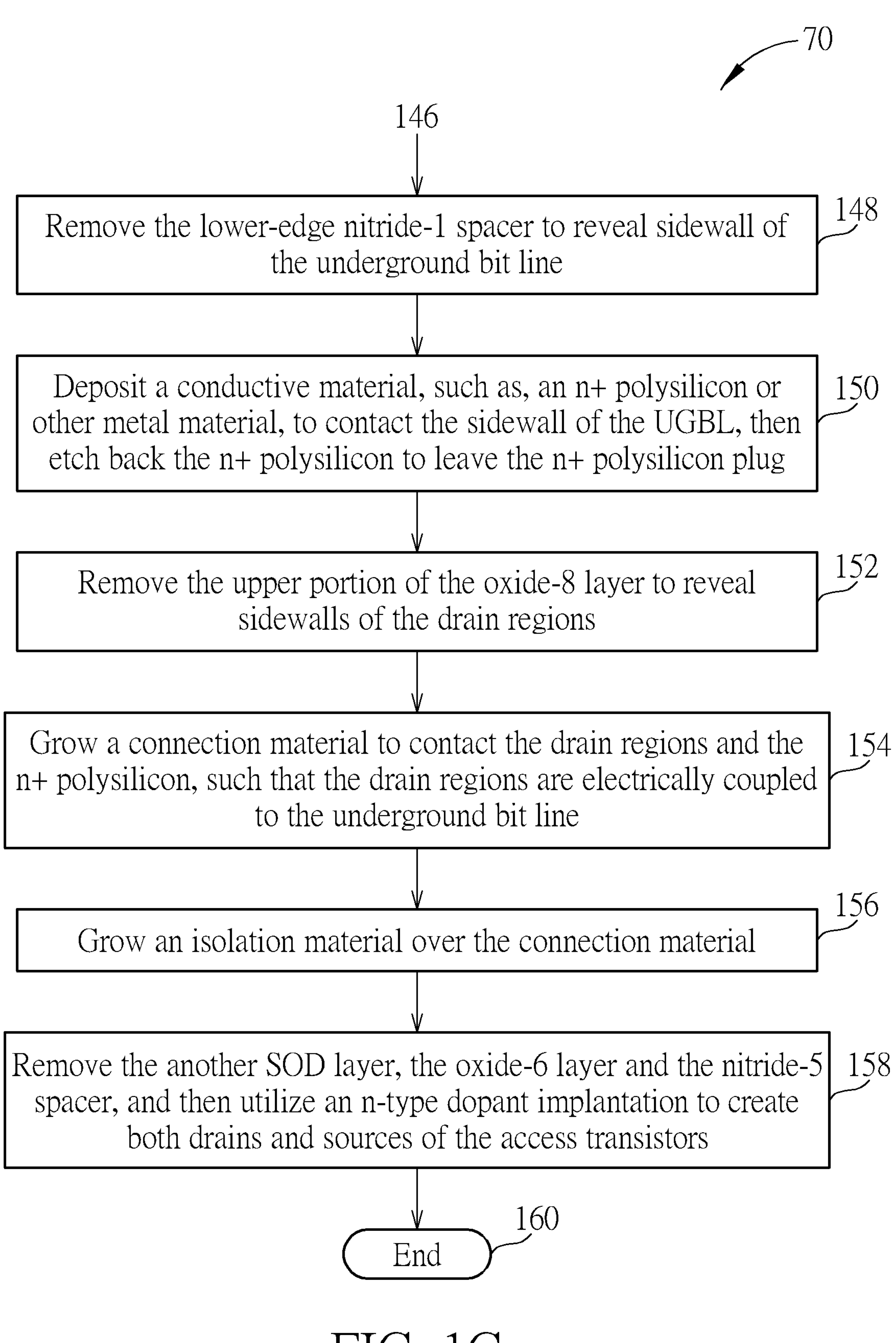
Figure 2:
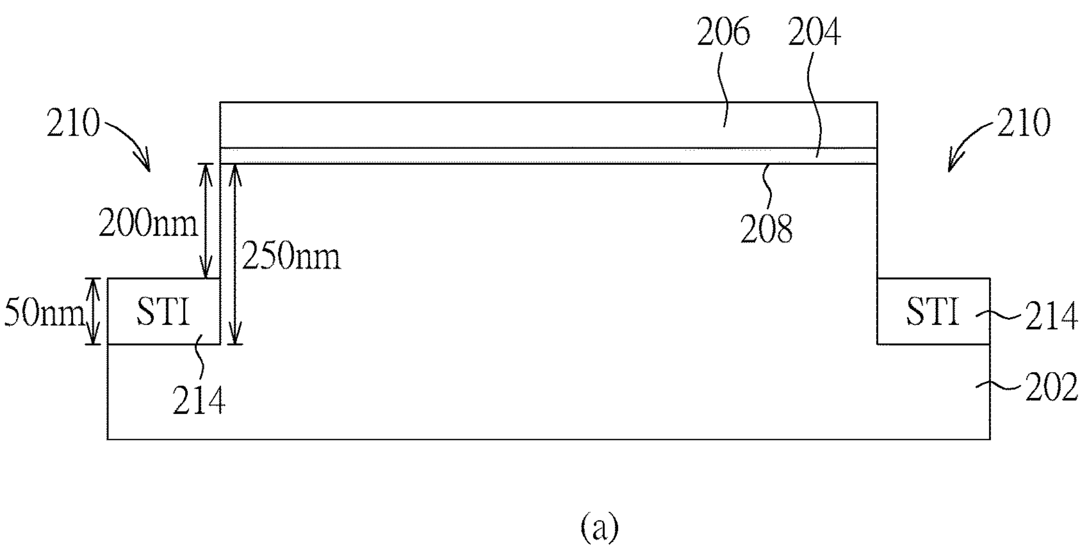
FIG. 2 is a diagram illustrating a top view and a cross-section view along an X direction after the pad-nitride layer and the pad-Oxide layer deposited and the STI is formed.
Figure 2:
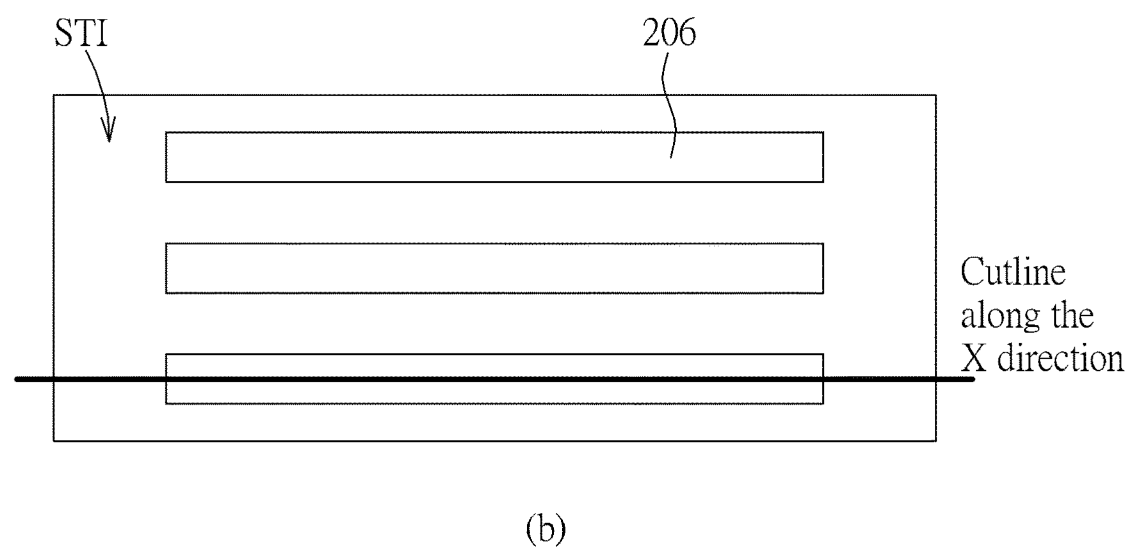

Please refer to FIG. 1B and FIG. 2. Step 20 could include:

Step 102: Deposit a pad-oxide layer 204 and a pad-nitride layer 206.

Step 104: Define the active regions of the DRAM cell array, and remove parts of a silicon material corresponding to the semiconductor surface 208 outside the active regions to create trench 210.

Step 106: Deposit an oxide layer 214 in the trench 210 and etched back the oxide layer 214 to form a shallow trench isolation (STI) below the semiconductor surface 208.

Please refer to FIG. 1C and FIG. 3, FIG. 4, FIG. 5. Step 30 could include:

Step 108: A nitride-1 layer is deposited and etched back to form nitride-1 spacers.

Step 110: A STI-oxide1 layer 304 is deposited in the trench 210 and planarized by chemical mechanical polishing (CMP) technique.

Step 112: A photoresist layer 306 is deposited above the STI-oxide1 layer 304 and the pad-nitride layer 206.

Step 114: The upper-edge nitride-1 spacer and the STI-oxide1 layer 304 not covered by the photoresist layer 306 are etched away.

Step 116: The photoresist layer 306 and the STI-oxide1 layer 304 are stripped off, and an oxide-1 layer 502 is grown.

Please refer to FIG. 1D and FIG. 6, FIG. 7, FIG. 8, FIG. 9, FIG. 10. Step 40 could include:

Step 118: A metal layer 602 is deposited in the trench 210 and planarized by the CMP technique.

Step 120: A photoresist layer 702 is deposited.

Step 122: The metal layer 602 corresponding to ends of the active region is etched to separate multiple conductive lines.

Step 124: The photoresist layer 702 is removed and the metal layer 602 is etched back to form underground bit lines 902.

Step 126: A CVD-STI-oxide2 layer 1002 is deposited in the trench 210 and planarized by the CMP technique.

Please refer to FIG. 1E and FIG. 11, FIG. 12, FIG. 13, FIG. 14, FIG. 15. Step 50 could include:

Step 128: A thick oxide-3 layer 1102, a thick nitride-2 layer 1104, and a patterned photoresist layer 1106 are deposited, and then unnecessary parts of the oxide-3 layer 1102, the nitride-2 layer 1104 are removed.

Step 130: The patterned photoresist layer 1106, the pad-nitride layer 206, and the pad-oxide layer 204 are removed.

Step 132: The HSS is etched to create a U-shaped concave, a high-k insulator layer 1304 is formed, a gate material 1306 is deposited and then etched back to form the word lines and associated gates of the access transistors.

Step 134: Deposit a nitride-3 layer 1402, subsequently deposit an oxide-4 layer 1404, and then etch back the oxide-4 layer 1404/the nitride-3 layer 1402.

Step 136: Etch off the nitride-2 layer 1104 and the oxide-3 layer 1102.

Please refer to FIG. 1F and FIG. 16, FIG. 17, FIG. 18, FIG. 19, FIG. 20. Step 60 could include:

Step 138: Remove the pad-nitride layer 206, and etch back the CVD-STI-oxide2 to HSS.

Step 140: Deposit and anisotropic etch a nitride-4 layer 1602, an oxide-5 layer 1604, and a nitride-5 layer 1606, and deposit an oxide-6 layer 1608.

Step 142: Deposit a spin-on dielectrics (SOD) 1702, and then CMP SOD, deposit a photoresist to reveal area close to source regions, etch the SOD 1702 close to the source regions, the pad-oxide layer 204, and silicon material to generate a hole-1/3, then remove photoresist.

Step 144: Deposit an oxide-7 layer 1802 and etch back the oxide-7 layer 1802, and then deposit another SOD layer 1804 and etch back the another SOD layer 1804.

Step 146: Deposit a photoresist to reveal the area close to the drain regions, etch the SOD 1702 close to the drain regions, the pad-oxide layer 204, and silicon material to generate a hole-1/2, remove photoresist, and then thermally grow an oxide-8 layer 1902.

Please refer to FIG. 1G and FIG. 21, FIG. 22, FIG. 23, FIG. 24A, FIG. 24B, FIG. 25A, FIG. 25B, FIG. 26. Step 70 could include:

Step 148: Remove the lower-edge nitride-1 spacer to reveal sidewall of the underground bit line.

Step 150: Deposit a conductive material, such as, an n+ polysilicon 2202 or other metal material, to contact the sidewall of the UGBL, then etch back the n+ polysilicon 2202 to leave the n+ polysilicon plug.

Step 152: Remove the upper portion of the oxide-8 layer 1902 to reveal sidewalls of the drain regions.

Step 154: Grow a connection material to contact the drain regions and the n+ polysilicon 2202, such that the drain regions are electrically coupled to the underground bit line.

Step 156: Grow an isolation material (such as, a thin oxide-9 layer 2502) over the connection material.

Step 158: Remove the another SOD layer 1804, the oxide-6 layer 1608 and the nitride-5 spacer 1606, and then utilize an n-type dopant implantation to create both drains and sources of the access transistors.

Step 160: End.

Detailed description of the aforesaid manufacturing method is as follows. Start with a p-type silicon wafer (i.e., the p-type substrate 202). In Step 102, as shown in FIG. 2(*a*), the pad-oxide layer 204 is formed above a semiconductor surface 208 (i.e., a horizontal silicon surface (HSS)) and then the pad-nitride layer 206 is deposited above the pad-oxide layer 204.

In Step 104, the active regions of the DRAM cell array can be defined by a photolithographic mask technique, wherein as shown in FIG. 2(*a*), an active region of the DRAM cell array correspond to the pad-oxide layer 204 and the pad-nitride layer 206, and the semiconductor surface 208 outside the active region pattern is exposed accordingly. Because the semiconductor surface 208 outside the active region pattern is exposed, the parts of the silicon material corresponding to the semiconductor surface 208 outside the active region pattern can be removed by an anisotropic etching technique to create the trench (or canal) 210, wherein for example, the trench 210 can be 250 nm deep below the HSS.

In Step 106, the oxide layer 214 is deposited to fully fill the trench 210 and then the oxide layer 214 is etched back such that the STI inside the trench 210 is formed below the HSS. In addition, FIG. 2 (*b*) is a top view corresponding to FIG. 2(*a*), wherein FIG. 2 (*a*) is a cross-section view along an X direction shown in FIG. 2(*b*). In addition, as shown in FIG. 2(*a*), as an example the STI has a thickness about 50 nm and a top surface of the STI is about 200 nm deep below the HSS if the trench 210 is 250 nm deep below the HSS.

Figure 3:
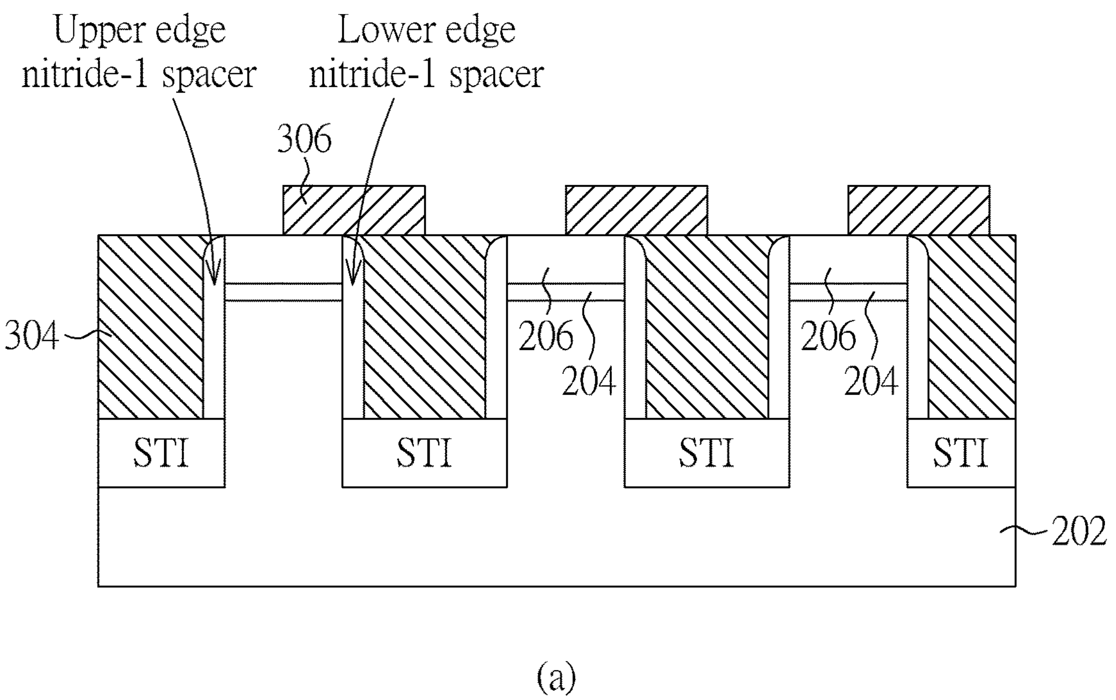
FIG. 3 is a diagram illustrating depositing and etching back the nitride-1 layer to form nitride-1 spacers, and depositing the STI-oxide1 layer and the photoresist layer.
Figure 3:
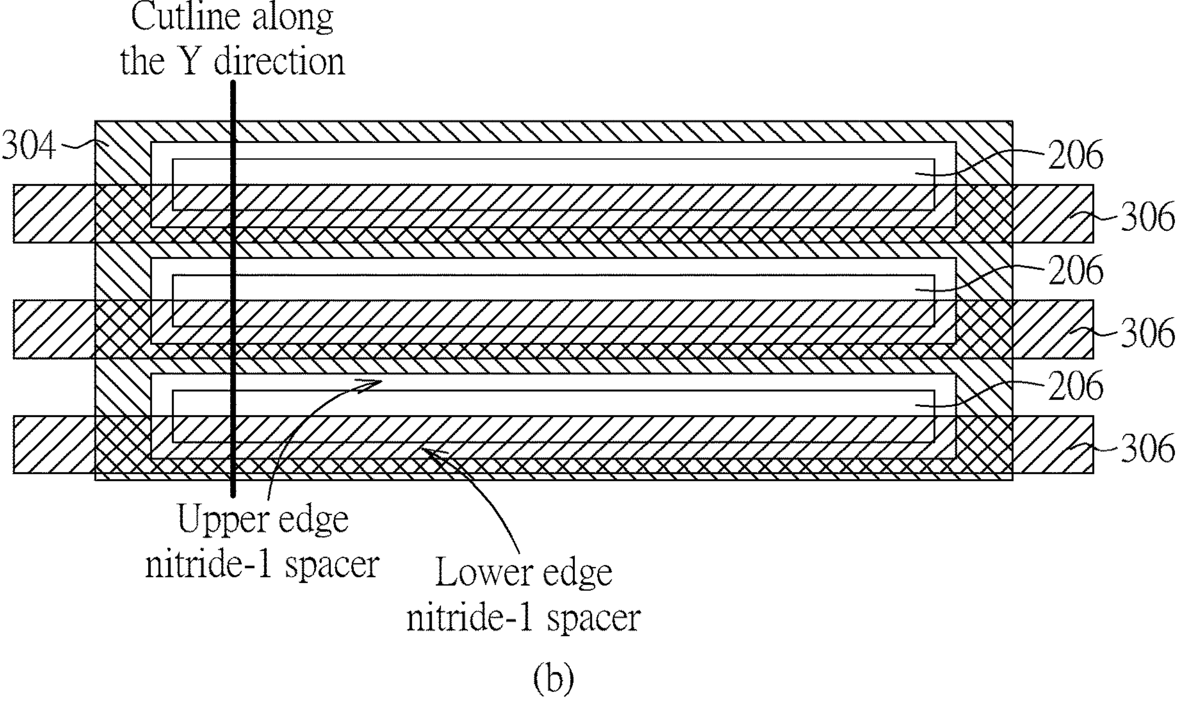

In Step 108, as shown in FIG. 3(*a*), the nitride-1 layer is deposited and etched back by the anisotropic etching so as to create the nitride-1 spacers along both edges (i.e., an upper edge and a lower edge) of the trench 210. In Step 110, as shown in FIG. 3(*a*), the STI-oxide1 layer 304 is deposited in the trench 210 above the STI to fill the trench 210. Then, the STI-oxide1 layer 304 is planarized by CMP technique to make a top surface of the STI-oxide1 layer 304 as high as a top surface of the pad-nitride layer 206.

Figure 4:
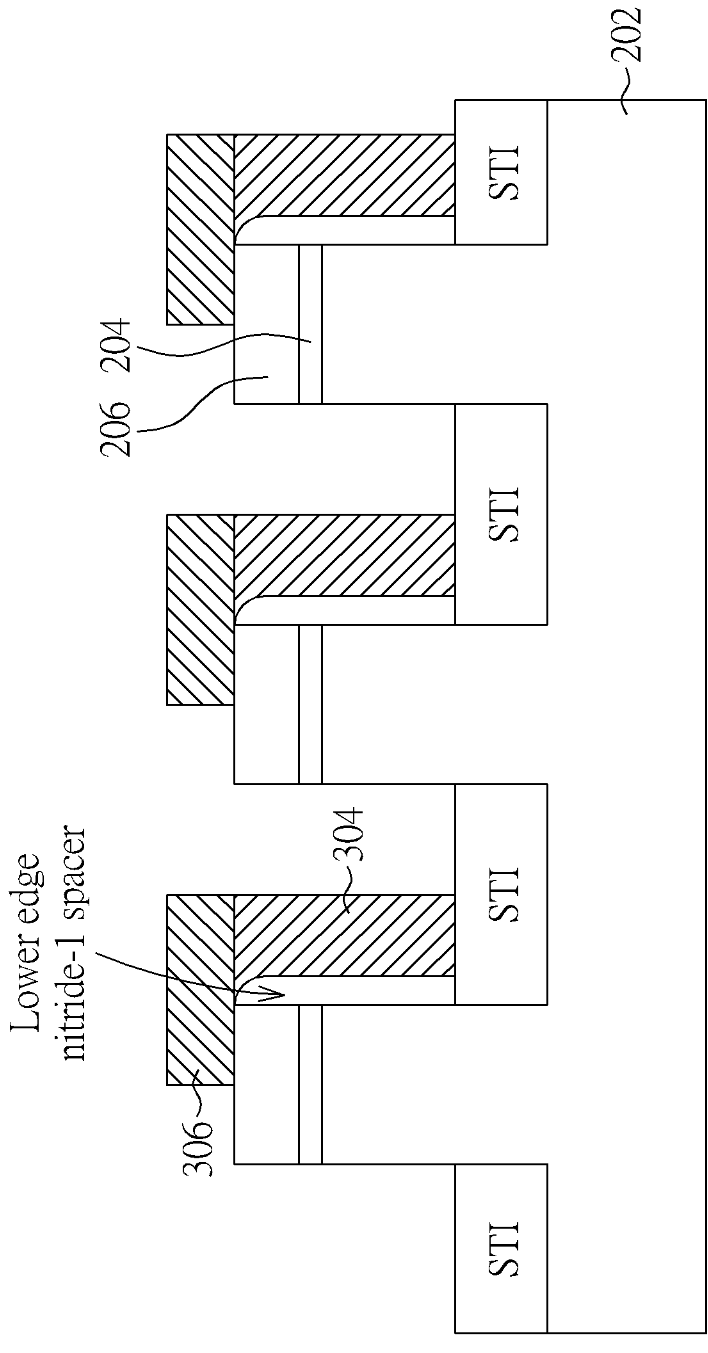
FIG. 4 is a diagram illustrating etching away the upper-edge nitride-1 spacer and the STI-oxide1 layer not covered by the photoresist layer.

In Step 112, as shown in FIG. 3(*a*), a lower-edge nitride-1 spacer of the nitride-1 spacers along the lower edge of the trench 210 are protected by utilizing a photolithographic technique through the photoresist layer 306, but an upper-edge nitride-1 spacer of the nitride-1 spacers along the upper edge of the trench 210 are removed. That is, after the photoresist layer 306 is deposited above the STI-oxide1 layer 304 and the pad-nitride layer 206, because a part of the photoresist layer 306 above the upper-edge nitride-1 spacer is removed but a part of the photoresist layer 306 above the lower-edge nitride-1 spacer is kept, the lower-edge nitride-1 spacer can be protected and the upper-edge nitride-1 spacer can be removed. In addition, FIG. 3(*b*) is a top view corresponding to FIG. 3(*a*), wherein FIG. 3(*a*) is a cross-section view along a cut line of a Y direction shown in FIG. 3(*b*). In Step 114, as shown in FIG. 4, the upper-edge nitride-1 spacer and the STI-oxide1 layer 304 not covered by the photoresist layer 306 are etched away by an etching process.

Figure 5:
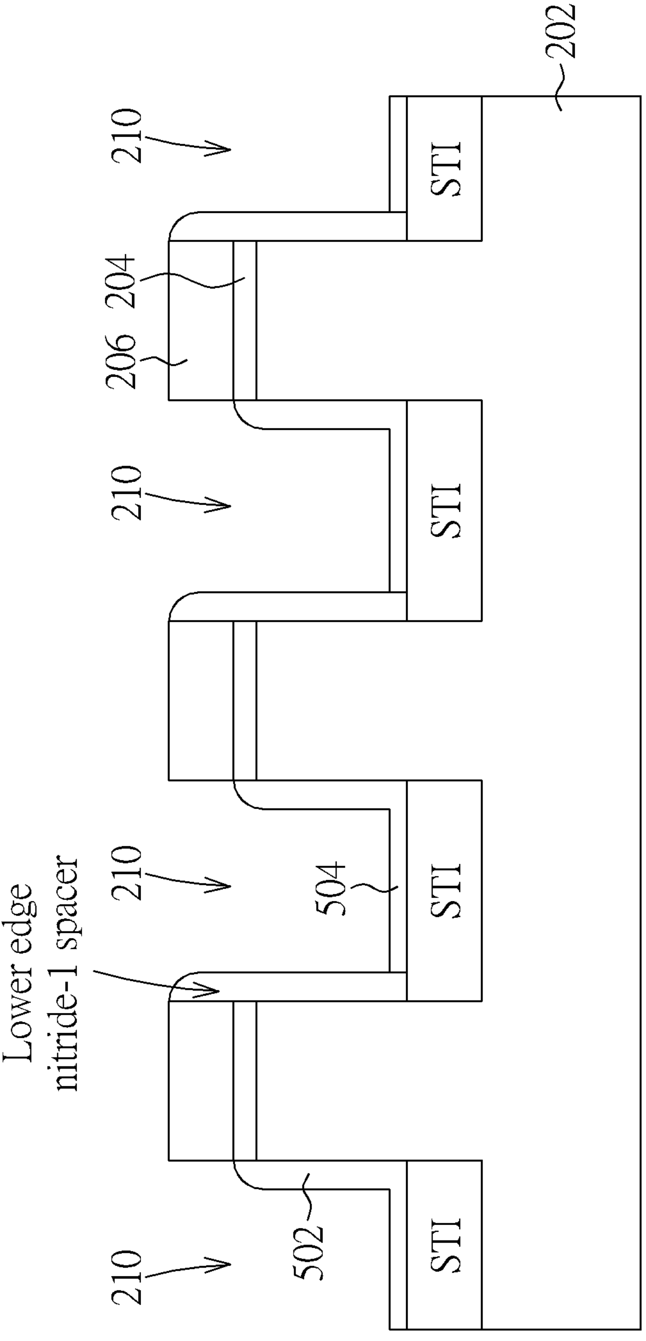
FIG. 5 is a diagram illustrating stripping off the photoresist layer and the STI-oxide1 layer, and growing the oxide-1 layer 502.

In Step 116, as shown in FIG. 5, both the photoresist layer 306 and the STI-oxide1 layer 304 are stripped off, wherein the STI-oxide1 layer 304 has much higher etching rate than that of thermal oxide and some deposited oxide. Then, the oxide-1 layer 502 is grown thermally to form oxide-1 spacer to cover the upper edge of the trench 210, wherein the oxide-1 layer 502 is not grown over the pad-nitride layer 206, and the STI may have only much thinner oxide layer (called as an oxide-1/STI layer 504) added over it. As shown in FIG. 5, Step 116 results in asymmetric spacers (the lower-edge nitride-1 spacer and the oxide-1 spacer) on two symmetrical edges (the upper edge and the lower edge) of the trench 210, respectively. For example, a thickness of the oxide-1 spacer is 4 nm and a thickness of the lower-edge nitride-1 spacer is 3 nm. In other words, the asymmetric spacers are formed along the sidewalls of active regions. A structure of the asymmetric spacers (shown in FIG. 5) and the above-mentioned related steps are a first key characteristic of the present invention, which is named as asymmetric spacers on two symmetrical edges of a trench or a canal (ASoSE).

Figure 6:
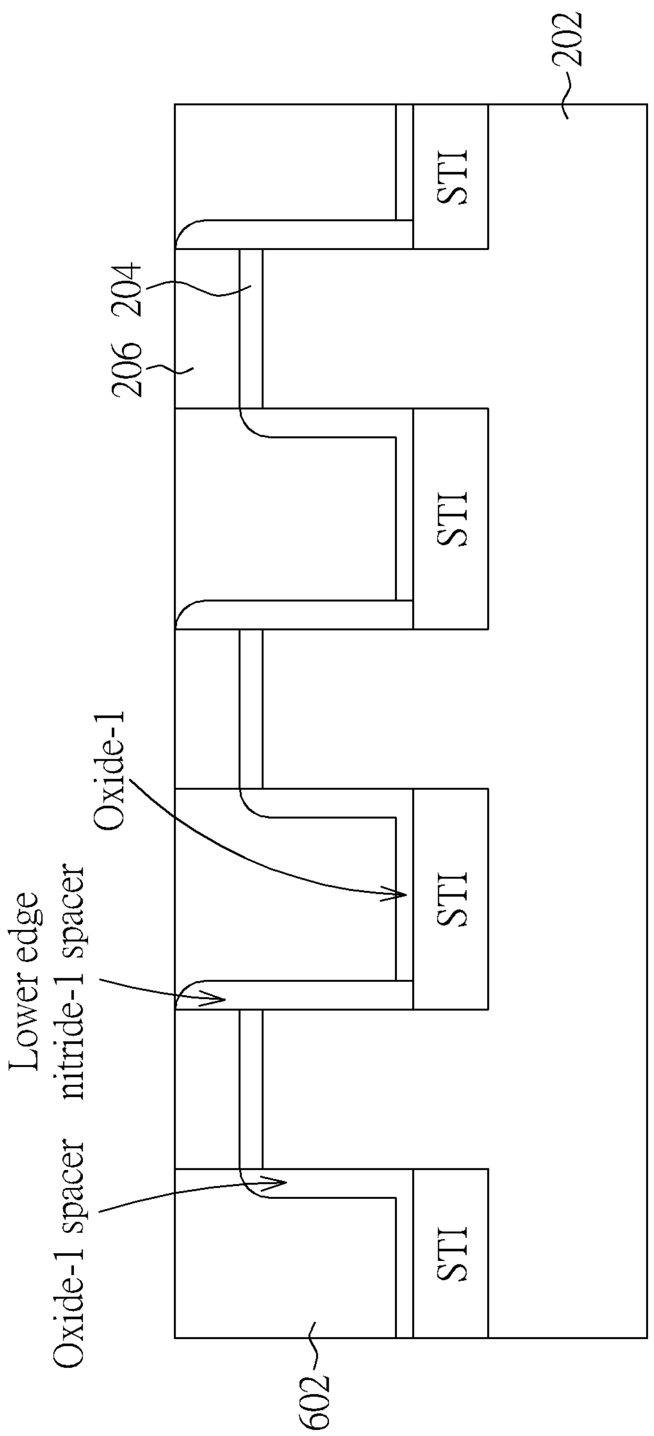
FIG. 6 is a diagram illustrating the metal layer 602 being deposited in the trench and planarized by the CMP technique.

In Step 118, as shown in FIG. 6, the metal layer 602 (or a conductive material which needs to sustain the subsequent processing conditions) is deposited to fully fill the trench 210 and planarized by the CMP technique to make a top surface of the metal layer 602 be leveled off equally with the top surface of the pad-nitride layer 206 (shown in FIG. 6). In addition, in one embodiment of the present invention, the metal layer 602 can be Tungsten which is abbreviated as W.

Figure 7:
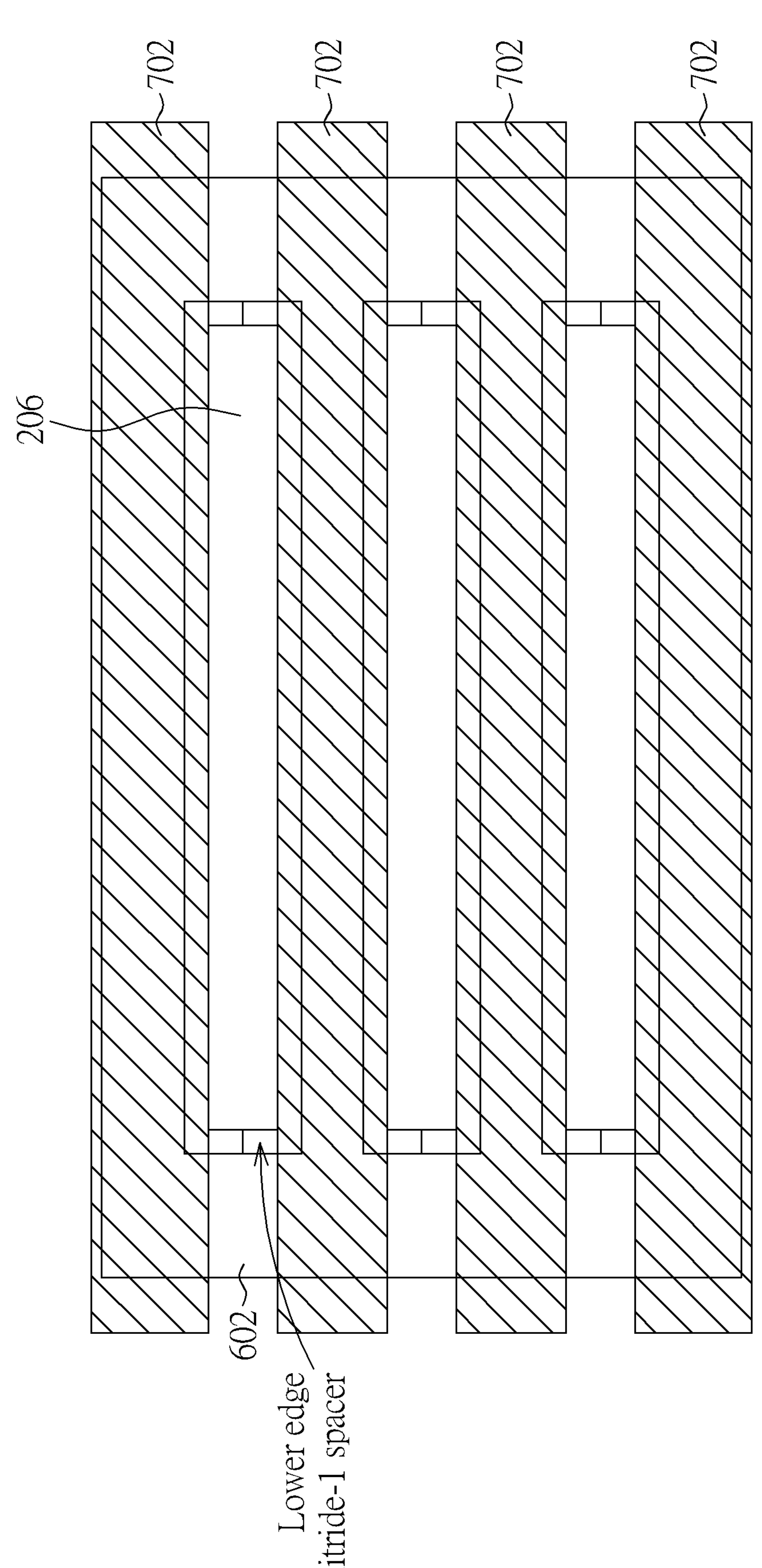
FIG. 7 is a diagram illustrating the photoresist layer being deposited.

In Step 120, as shown in FIG. 7, the photoresist layer 702 is deposited cover both the lower edge nitride-1 spacer and the oxide-1 spacer but to expose two edges of the lower edge nitride-1 spacer and the oxide-1 spacer corresponding to the ends of the active region.

Figure 8:
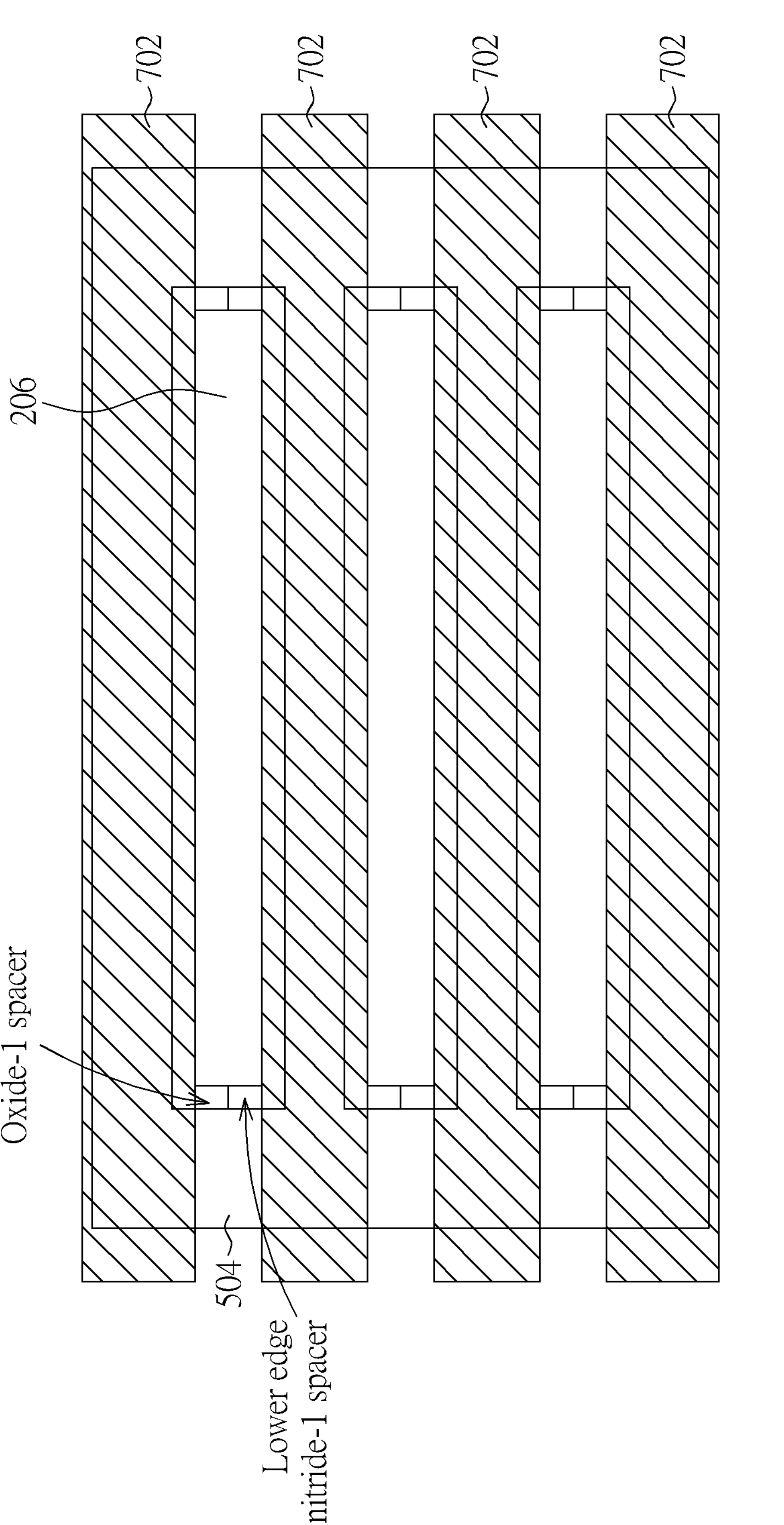
FIG. 8 is a diagram illustrating the metal layer corresponding to ends of the active region being etched.

In Step 122, as shown in FIG. 8, the metal layer 602 corresponding to the ends of the active region is etched until a top surface of the oxide-1/STI layer 504 is exposed to separate the multiple conductive lines (i.e., the metal layer 602).

Figure 9:
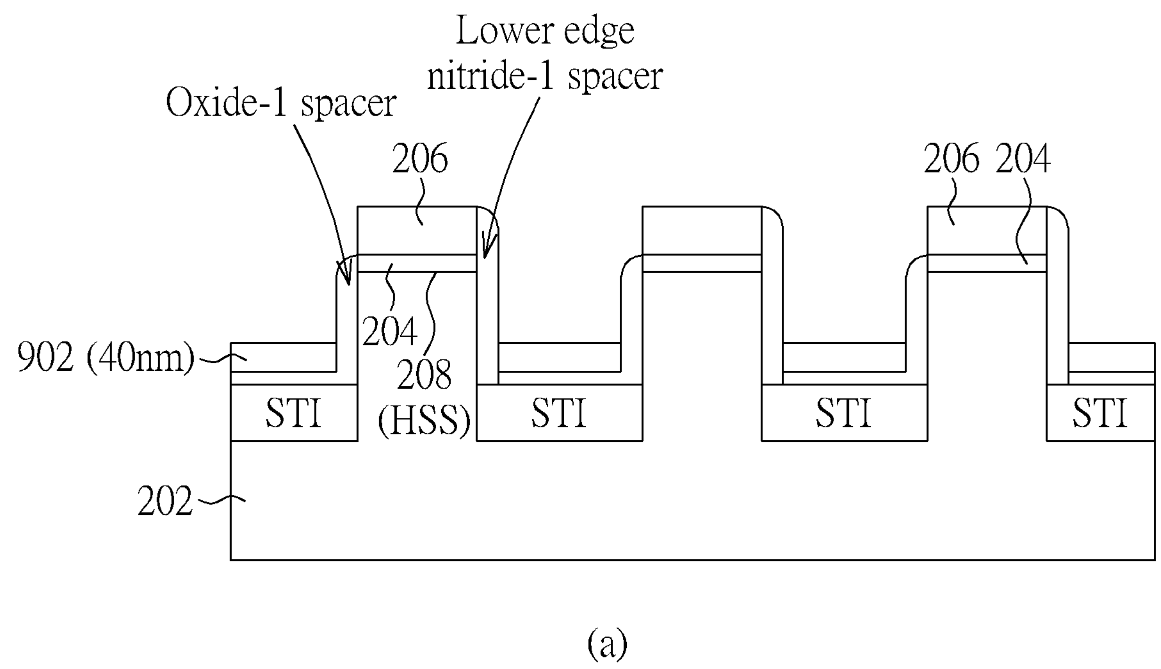
FIG. 9 is a diagram illustrating the photoresist layer being removed and the metal layer being etched back to form underground bit line.
Figure 9:
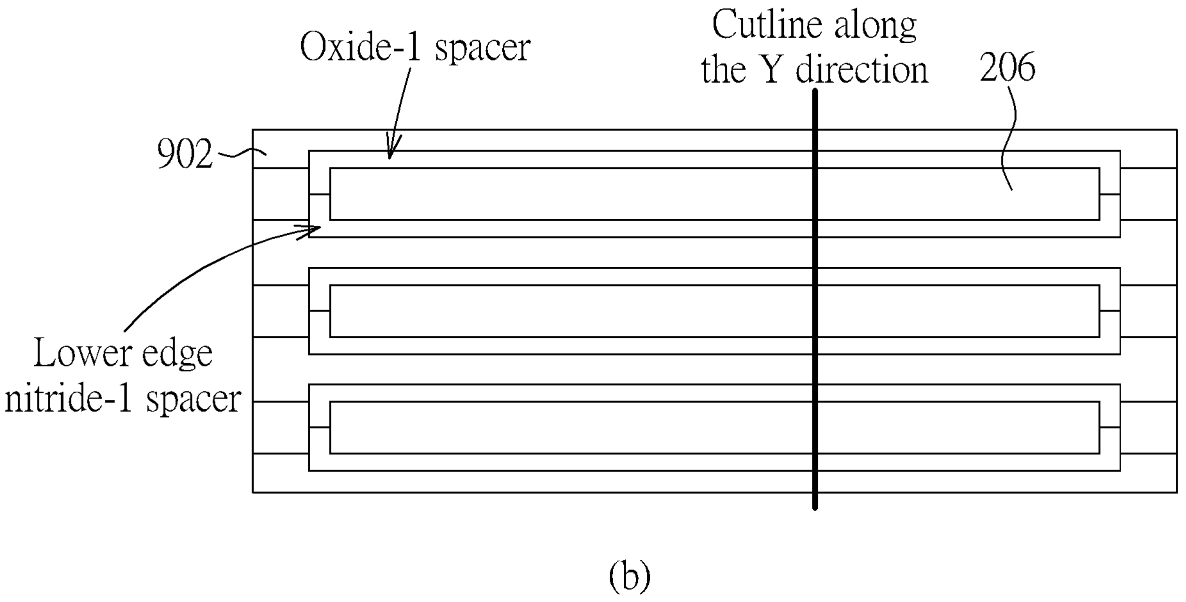

In Step 124, as shown in FIG. 9 (*a*), after the photoresist layer 702 is removed, the metal layer 602 is etched back but left only a reasonable thickness inside the trench 210 to form the underground bit line 902, wherein a top surface of the underground bit line 902 is much lower than the HSS (e.g., a thickness of the underground bit line 902 is about 40 nm). In addition, as shown in FIG. 9 (*a*), the underground bit line 902 is on a top surface of the STI and both sidewalls of the underground bit line 902 are bounded by the asymmetric spacers, that is, the lower edge nitride-1 spacer and the oxide-1 spacer, respectively. In addition, FIG. 9(*a*) is a cross-section view along a Y direction shown in FIG. 9(*b*).

Figure 10:
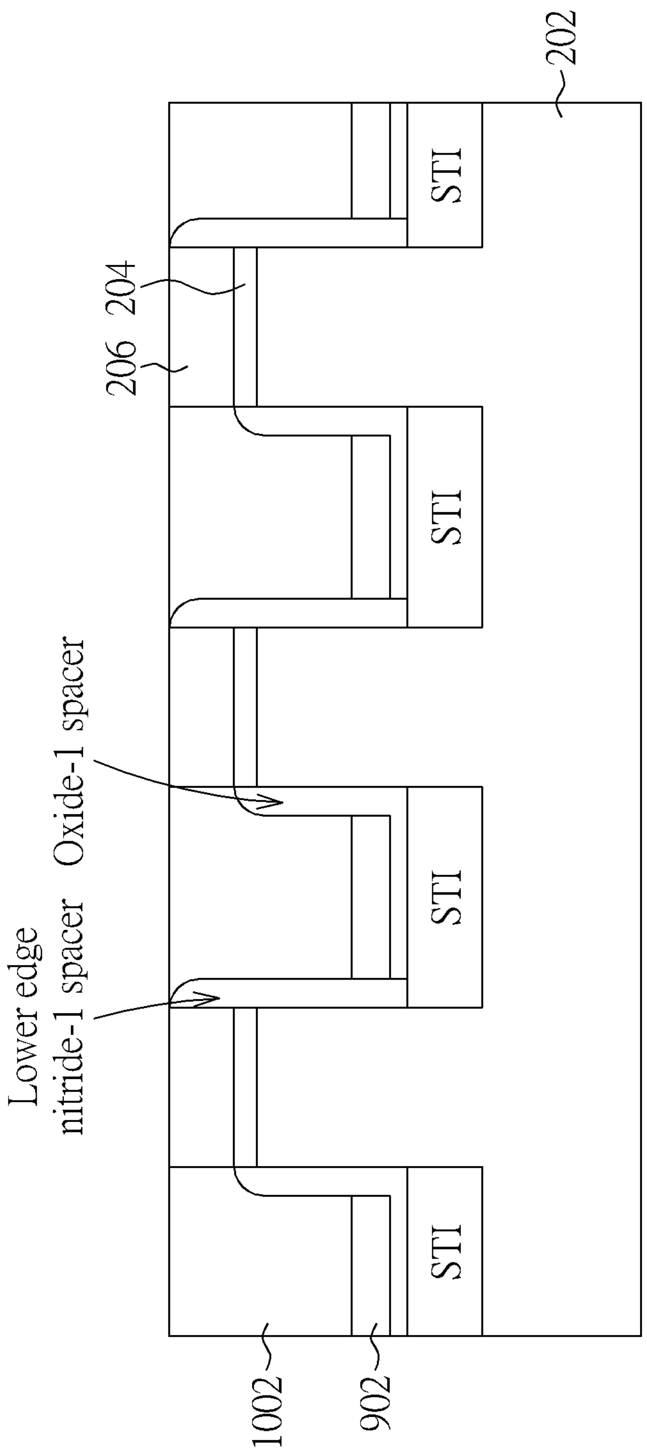
FIG. 10 is a diagram illustrating the oxide-2 layer being deposited in the trench.

In Step 126, as shown in FIG. 10 (the cross-section view along the Y direction shown in FIG. 9(*b*)), the oxide-2 layer 1002 (called as CVD-STI-oxide2) needs to be thick enough to fill the trench 210 over the underground bit line 902, and then the CVD-STI-oxide2 layer 1002 is polished back to reserve some part which is leveled as high as the top surface of the pad-nitride layer 206, bounded by the pad-nitride layer 206, and covers both the lower edge nitride-1 spacer and the oxide-1 spacer. As shown in FIG. 10, Step 126 can make the underground bit line 902 (i.e., an interconnection) embedded and bounded by all insulators (i.e., an isolation region) inside the trench 210 (and later the underground bit line 902 will be connected to drains of access transistors of the DRAM cell array) which is named as underground bit-lines surrounded by insulators (UGBL). The UGBL is a second key characteristic of the present invention.

The following descriptions introduce how to form both the access transistors and word lines of the DRAM cell (1T1C cell) array and the word lines connect all associated gates of the access transistors simultaneously by a self-alignment method and thus both the gates and the word lines are connected as one body of metal such as Tungsten (W).

Figure 11:
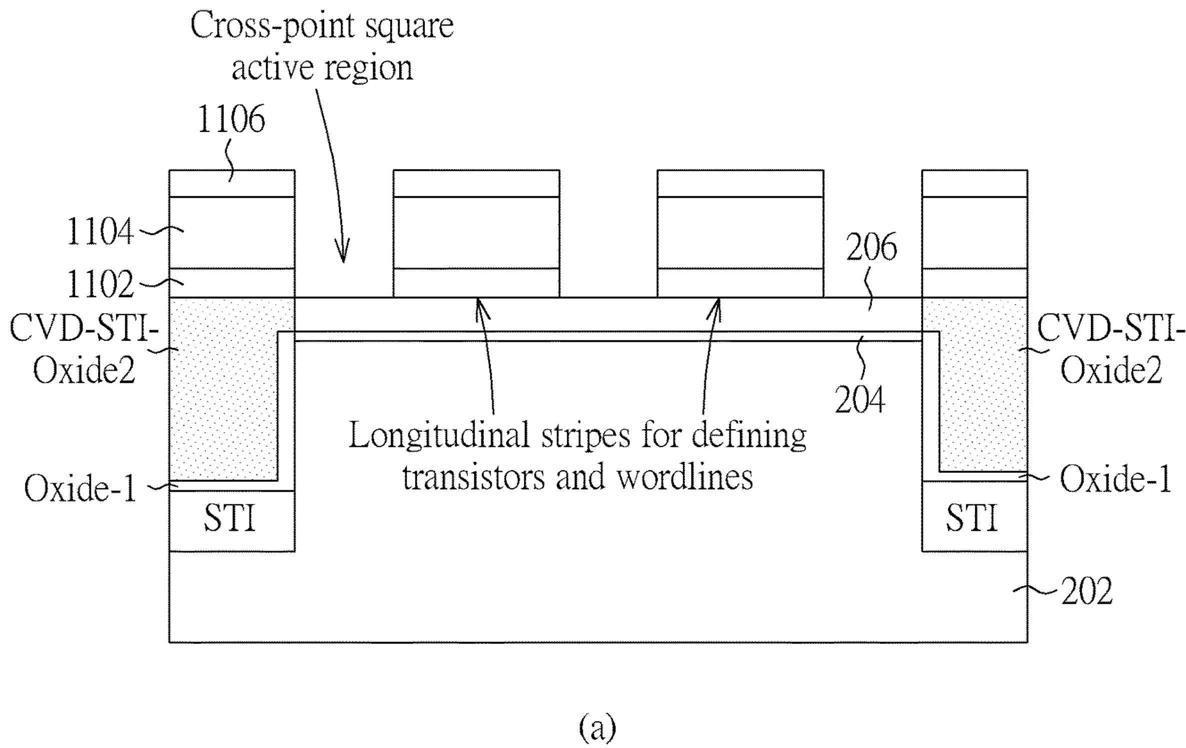
FIG. 11 is a diagram illustrating the oxide-3 layer, the nitride-2 layer, and the photoresist being deposited, and then the unnecessary parts of the oxide-3 layer, the nitride-2 layer, and the photoresist being removed.
Figure 11:
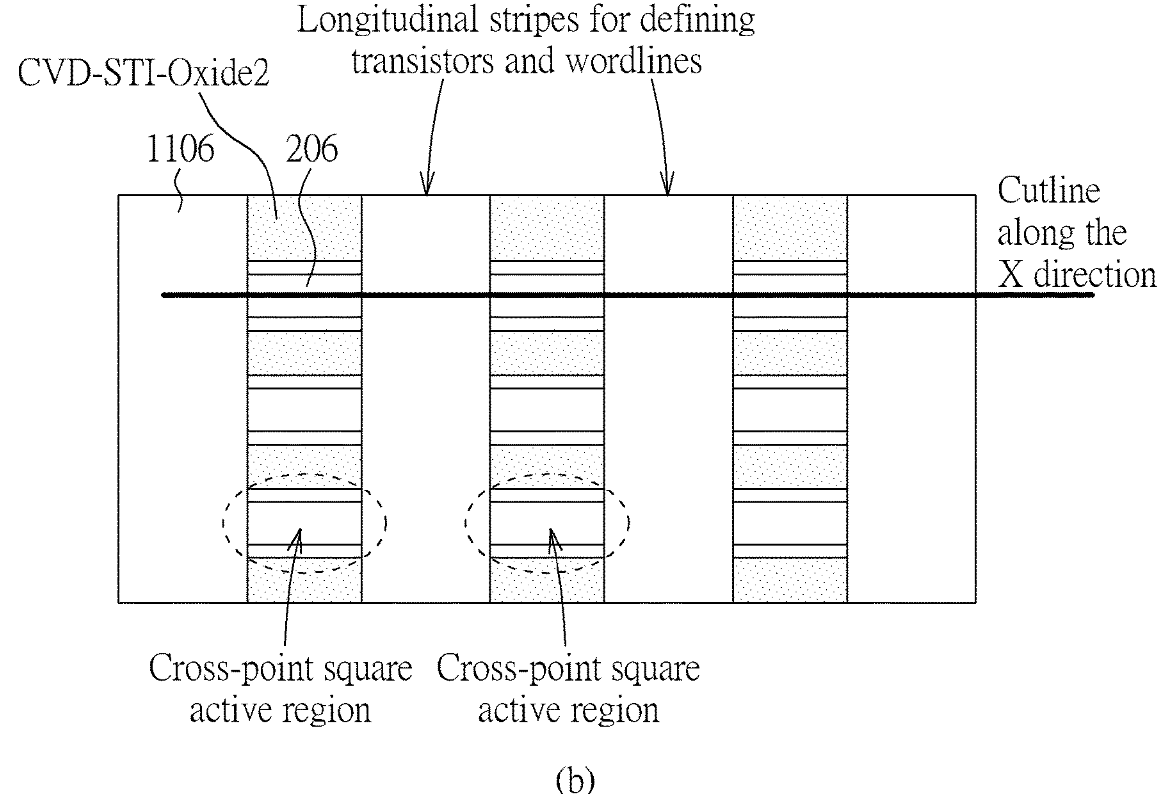

In Step 128, as shown in FIG. 11 (*a*), first, the thick oxide-3 layer 1102, the thick nitride-2 layer 1104, and the patterned photoresist 1106 are deposited. Then, the unnecessary parts of the oxide-3 layer 1102, the nitride-2 layer 1104 are removed by using the photolithographic technique. A transistor/word line pattern will be defined by the composite layers of the oxide-3 layer 1102 and the nitride-2 layer 1104, wherein the composite layers of the oxide-3 layer 1102 and the nitride-2 layer 1104 consists of multiple stripes in a direction perpendicular to a direction of the active region. Therefore, as shown in FIG. 11(*a*) and FIG. 11(*b*), longitudinal (the Y direction) stripes (the oxide-3 layer 1102 and the nitride-2 layer 1104) for defining the access transistors, and word lines and the active region (cross-point square) are formed, wherein the active region (cross-point square) is located at cross-point space between the longitudinal stripes, wherein FIG. 11 (*a*) is a cross-section view along the X direction shown in FIG. 11(*b*).

As shown in FIG. 11(*b*), a top view reveals fabric-like checkerboard patterns with the longitudinal stripes of the oxide-3 layer 1102 and the nitride-2 layer 1104 over the pad-nitride layer 206 and the pad-oxide layer 204, and both the active region (covered by the pad-nitride layer 206 and the pad-oxide layer 204) and the STI are in a horizontal direction (i.e., the X direction shown in FIG. 11(*b*)). The active region allows the access transistors to be made by a kind of a self-alignment technique. Such a checkerboard fabric proposal for making self-aligned structures of making gates of the access transistors and the word lines in one processing step is a third key characteristic of the present invention.

Figure 12:
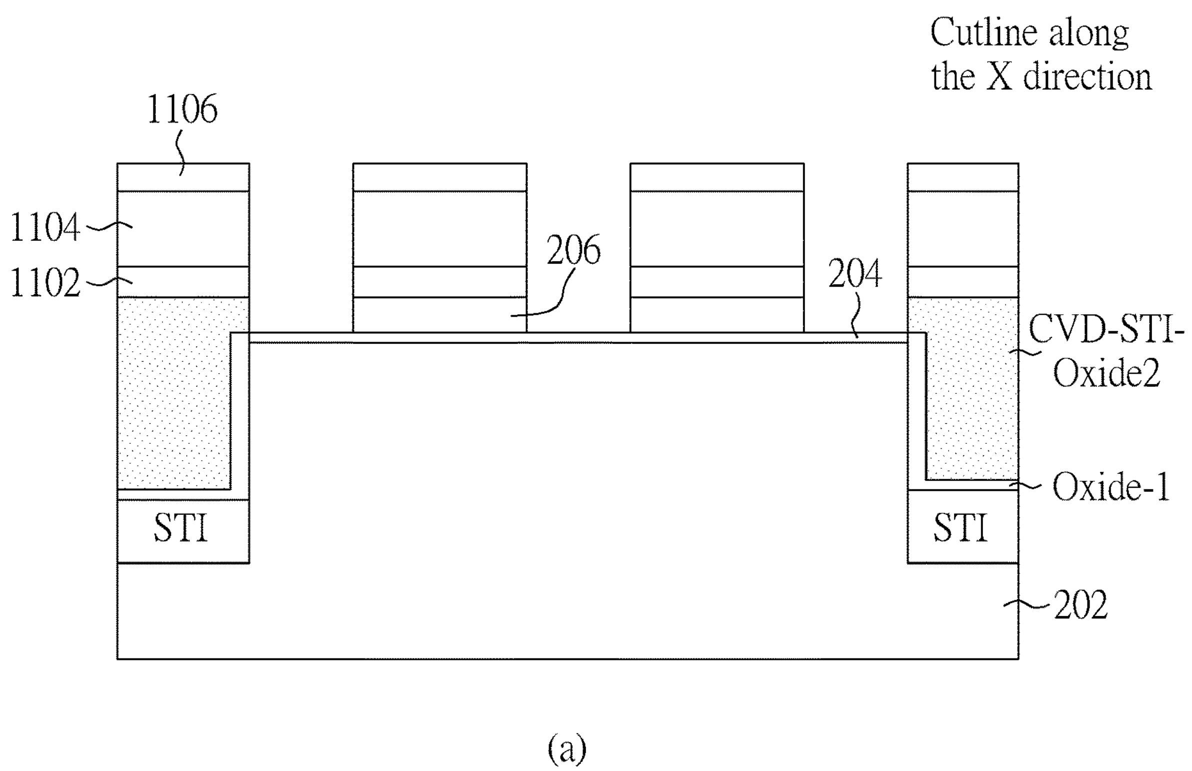
FIG. 12 is a diagram illustrating the pad-nitride layer being etched but the pad-oxide layer being retained.
Figure 12:
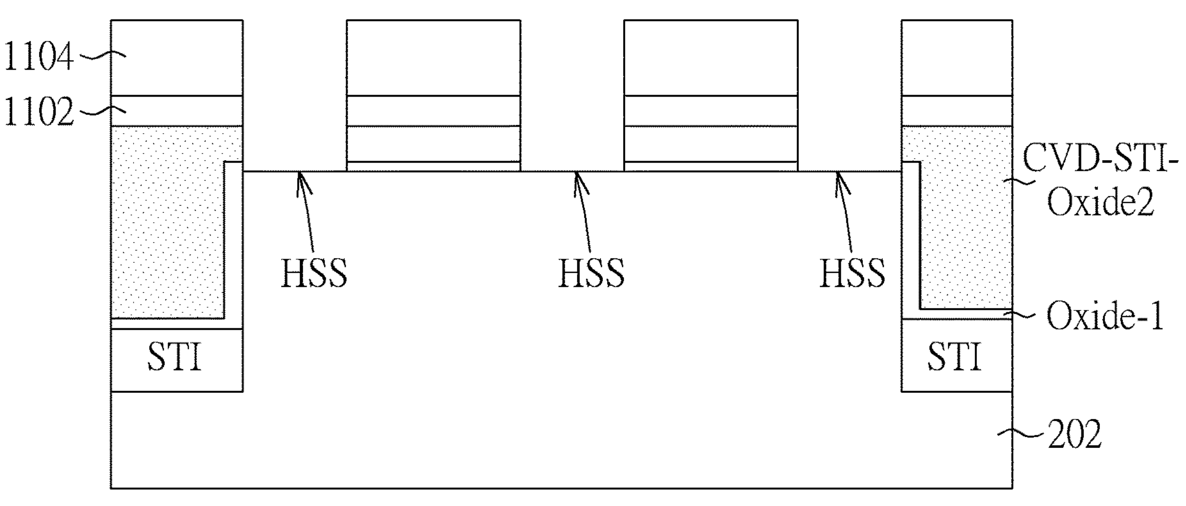

In Step 130, as shown in FIG. 12 (*a*), the photoresist layer 1106 is kept so as to the pad-nitride layer 206 is etched but the pad-oxide layer 204 is retained, and as shown in FIG. 12(*b*), both the photoresist layer 1106 and the pad-oxide layer 204 are removed. As a result, the HSS is exposed at cross-point square areas (shown in FIG. 12(*b*)) corresponding to the active regions (cross-point square shown in FIG. 11(*a*) and FIG. 11(*b*)).

Figure 13:
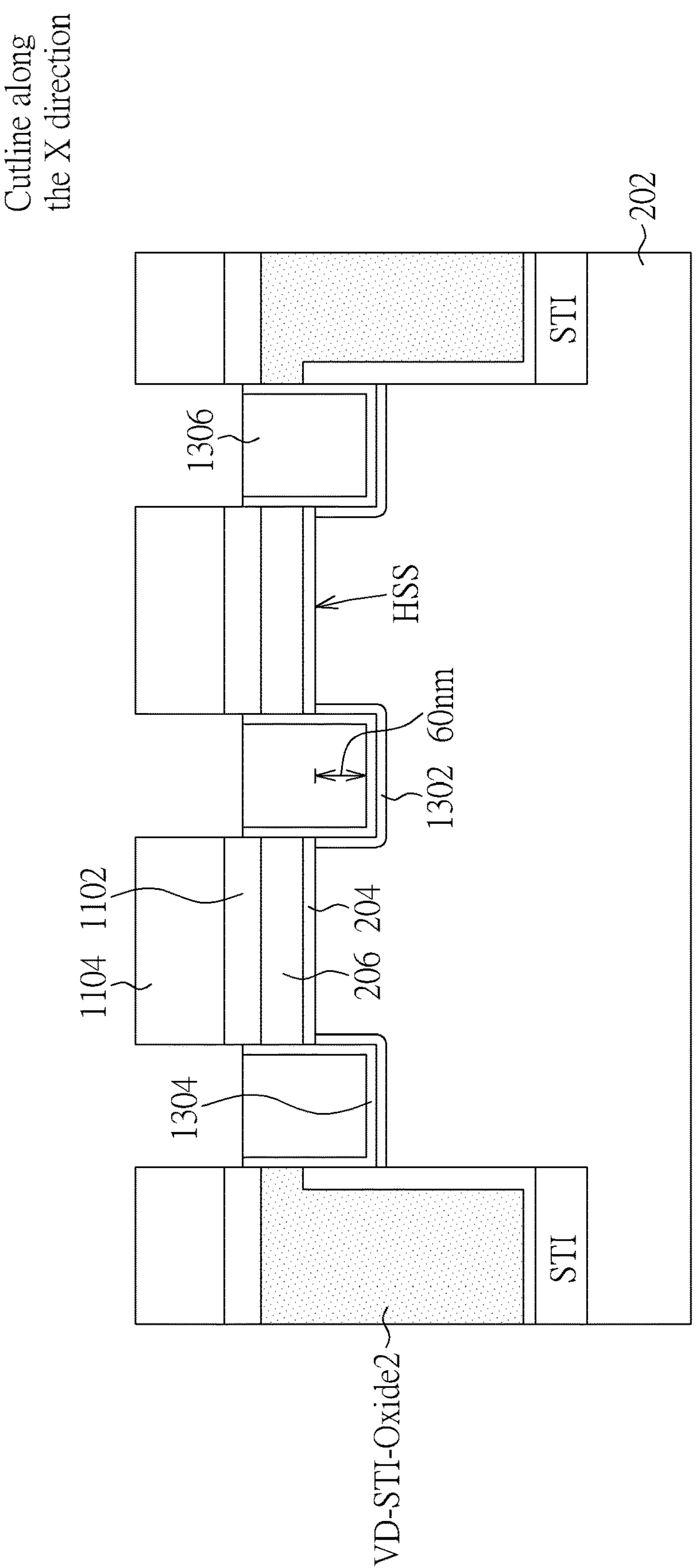
FIG. 13 is a diagram illustrating creating the U-shaped concave and the high-k insulator layer being formed as the gate dielectric layer of the access transistor.

In Step 132, as shown in FIG. 13, the HSS exposed at the cross-point square areas is etched by the anisotropic etching technique to create the U-shaped concave, wherein the U-shaped concave is for a U-shaped channel 1302 of the access transistor, and for example, a vertical depth of the U-shaped concave can be around 60 nm from the HSS. Since the U-shaped concave of the access transistor is exposed, a channel doping design can be achieved by somewhat well-designed boron (p-type dopant) concentration to dope the channel 1302 of the U-shaped concave for a desired threshold voltage of the access transistor after a subsequent high-k metal-gate structure formation. The suitable high-k insulator layer 1304 is formed as a gate dielectric layer of the access transistor, wherein a top surface of two edges of the high-k insulator layer 1304 is higher than the HSS. Afterwards select a suitable gate material 1306 that is appropriate for a word line conductance and can achieve a targeted work-function performance for the access transistor to have a lower threshold voltage (a goal of selecting the suitable gate material is to reduce a boosted word line voltage level to be as low as possible but provide sufficient device drive in completing enough amount of charges to be restored into the capacitor and, on the other hand, in facilitating faster charge transfer for signal sensing).

The gate material 1306 (i.e., the suitable gate material) is deposited, wherein the gate material 1306 is thick enough to fill in the U-shape concaves (shown in FIG. 13) between two adjacent longitudinal stripes (the oxide-3 layer 1102 and the nitride-2 layer 1104). Then, the gate material 1306 is etched back to result in a longitudinal (the Y direction) word line which is sandwiched between two adjacent longitudinal stripes (the oxide-3 layer 1102 and the nitride-2 layer 1104). For example, the gate material 1306 can be Tungsten (W) of forming the high-k metal-gate structure which allows a design of desired lower threshold voltage of the access transistor if with a suitable channel doping concentration.

The newly proposed access transistor (hereafter called as U-transistor) with the U-shaped channel 1302 is different from a recessed transistor commonly used in the state-of-the-art buried word line design. The U-transistor has its body with two sides bounded by the CVD-STI-oxide2 along the Y direction (i.e., a channel width direction) and its channel length including a depth of one edge of the U-shaped channel 1302 on a side corresponding to a drain of the U-transistor, a length of a bottom of the U-shaped channel 1302, and a depth of another edge of the U-shaped channel 1302 on a side corresponding to a source of the U-transistor. For example, if the vertical depth of the U-shaped concave is around 60 nm and a U opening of the U-shaped concave is around 7 nm along the X direction (i.e., a channel-length direction), a total channel length of the U-transistor is around 127 nm. In contrast, a channel length of the recessed transistor must be more dependent on how deep a gate material of the recessed transistor be recessed and how deep a source and a drain junctions of the recessed transistor be formed.

Due to a structure difference between the U-transistor and the recessed transistor, the channel length of the U-transistor can be much better controlled especially when the channel length of the U-transistor does not depend on a height of the gate of the U-transistor. In addition, since the HSS is fixed, the dopant concentration profiles of the drain and the source of the U-transistor, respectively, are much more controllable with less device-design-parameter variations as revealed more clearly as to be described later about how to complete the drain and the source of the U-transistor. In addition, forming simultaneously the gate of the U-transistor and the word line in the longitudinal direction by self-alignment between the two adjacent longitudinal stripes (the oxide-3 layer 1102 and the nitride-2 layer 1104) is such a way that the word line is not below the HSS, wherein that the word line is not below the HSS presents quite different design and performance parameters from the commonly used buried word line. In addition, a height of the word line (i.e., the gate material 1306) is designed to be lower than that of the composite layers (composed of the oxide-3 layer 1102 and the nitride-2 layer 1104) by using the etching-back technique (shown in FIG. 13). A structure design of the gate of the U-transistor connected in self-alignment to the word line is a fourth key characteristic of the present invention.

Figure 14:
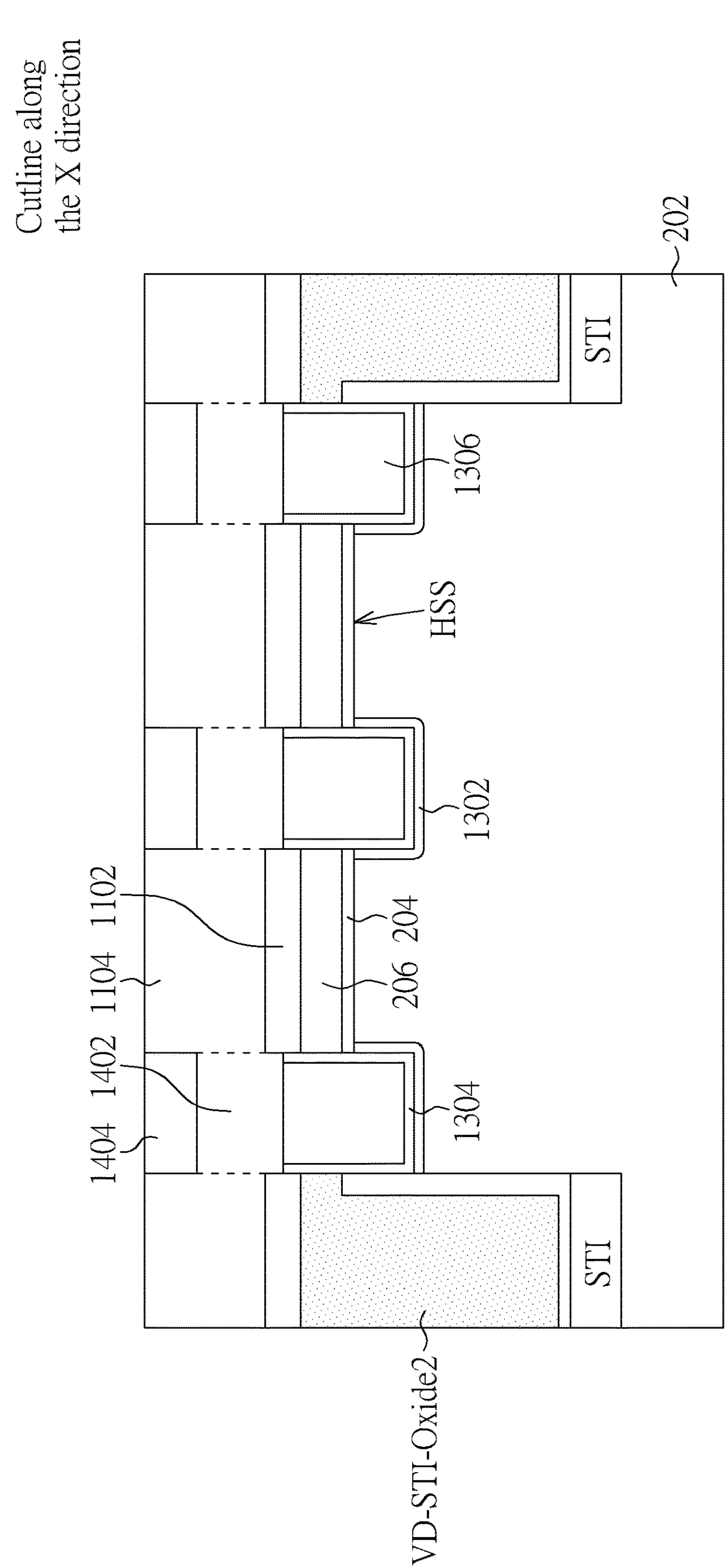
FIG. 14 is a diagram illustrating the nitride-3 layer and the oxide-4 layer being deposited and then polishing back the nitride-3 layer and the oxide-4 layer.

In Step 134, as shown in FIG. 14, the nitride-3 layer 1402 is deposited and the oxide-4 layer 1404 is subsequently deposited, wherein the nitride-3 layer 1402 and the oxide-4 layer 1404 are stacked up with total thickness being large enough to fill the vacancy between the two adjacent longitudinal stripes (the oxide-3 layer 1102 and the nitride-2 layer 1104). Then, the oxide-4 layer 1404 and the nitride-3 layer 1402 are etched back (or polished back) to be leveled off to a top surface of the nitride-2 layer 1104 so as to form a composite stack composed of the oxide-4 layer 1404 and the nitride-3 layer 1402 directly above the word line (i.e., the gate material 1306).

Figure 15:
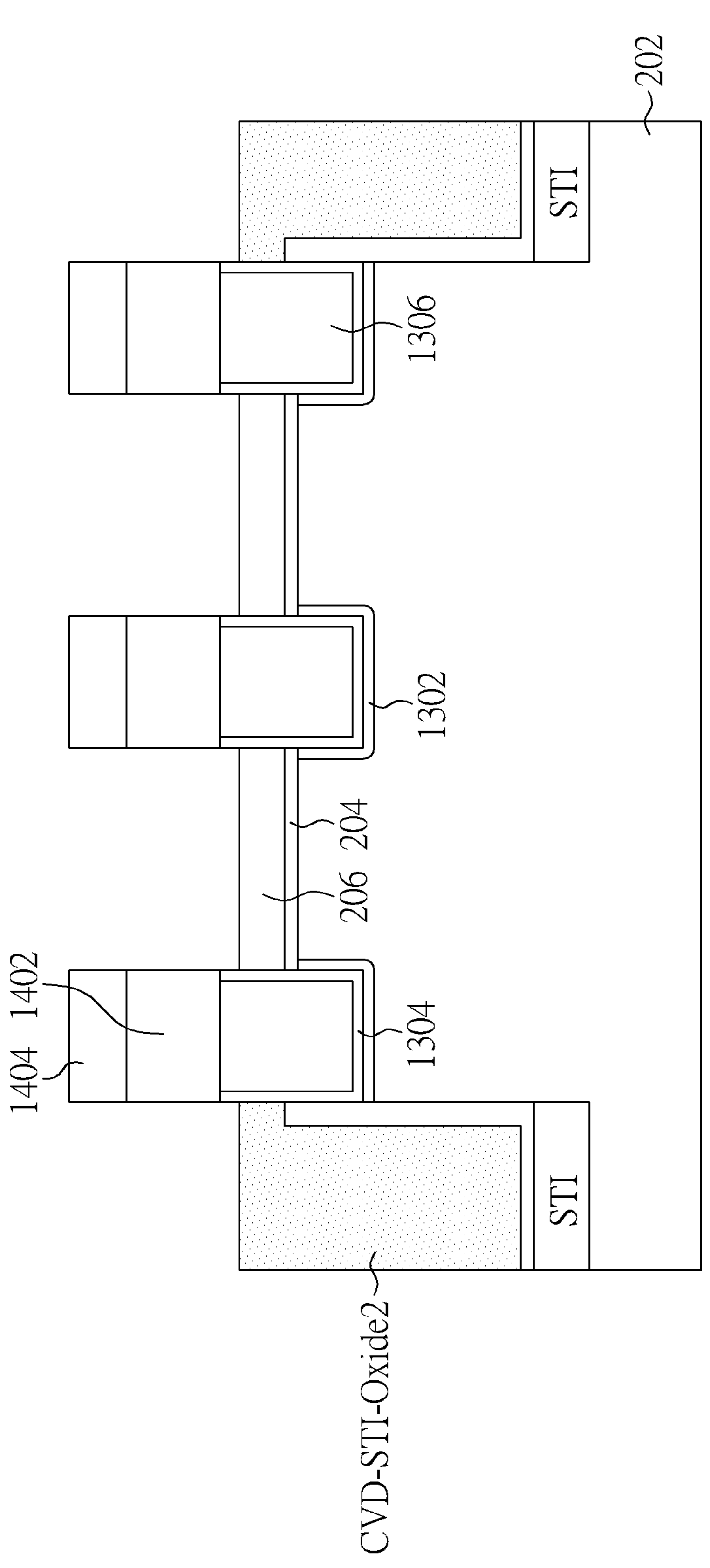
FIG. 15 is a diagram illustrating the nitride-2 layer and the oxide-3 layer being etched off.

In Step 136, as shown in FIG. 15, the nitride-2 layer 1104 is etched off by the anisotropic etching technique and the oxide-4 layer 1404/the nitride-3 layer 1402 are left above the word line. Then, the oxide-3 layer 1102 is also etched off by the anisotropic etching to expose the pad-nitride layer 206. The gate structure (such as, the oxide-4 layer 1404/the nitride-3 layer 1402/the gate material 1306) is achieved for both the gate of the U-transistor inside the U-shaped concave and the word line in the longitudinal direction (i.e., the Y direction).

Figure 16:
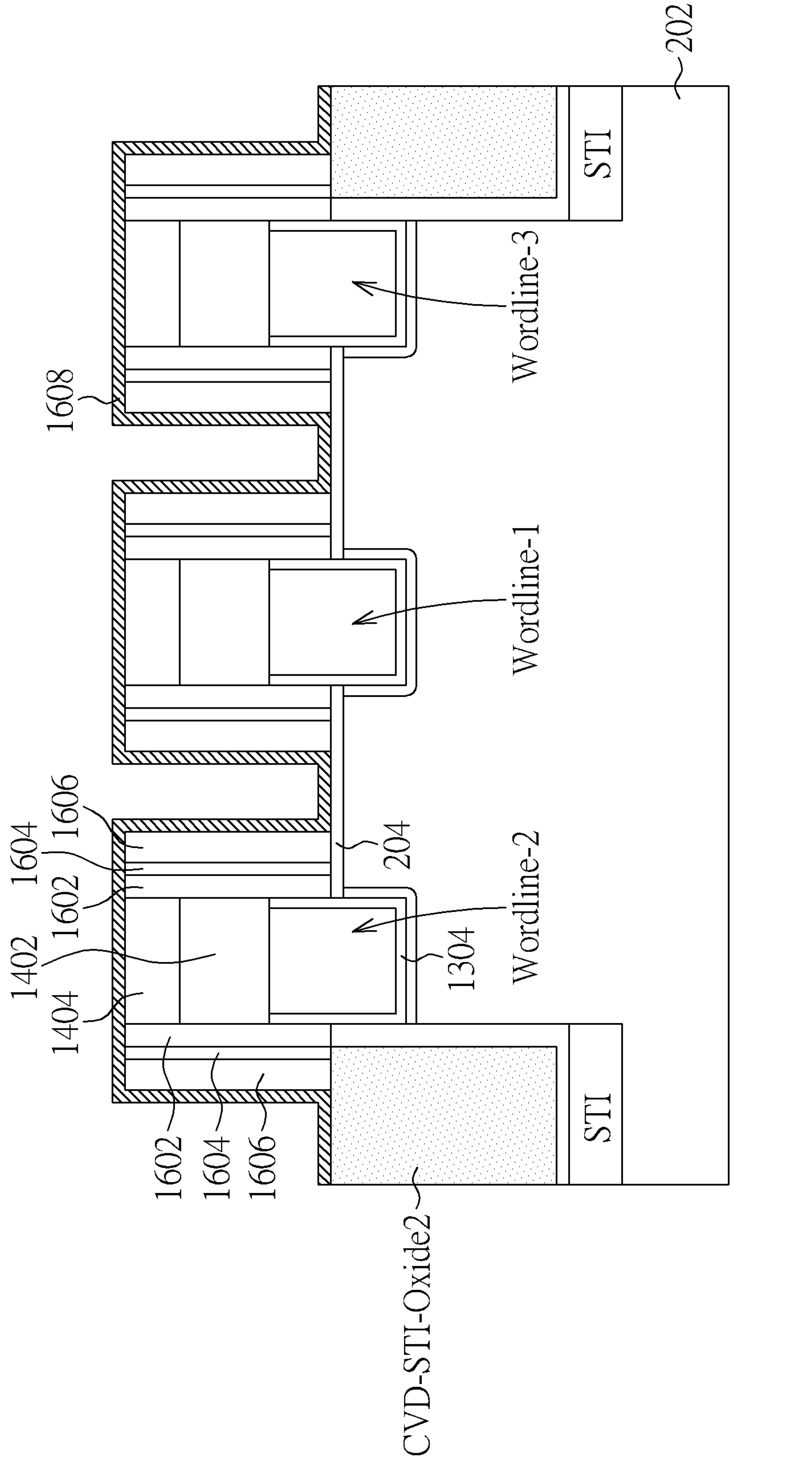
FIG. 16 is a diagram illustrating the nitride-4 layer, the oxide-5 layer, and the nitride-5 layer being deposited and etched by the anisotropic etching technique, and the oxide-6 layer being deposited.

In Step 138, as shown in FIG. 16, the pad-nitride layer 206 is removed everywhere to leave the pad-oxide layer 204. The CVD-STI-oxide2 (i.e., the oxide-2 layer 1002) is etched back to be leveled off a top surface of the pad-oxide layer 204.

In Step 140, as shown in FIG. 16, the nitride-4 layer 1602 is deposited and etched by the anisotropic etching technique to create nitride-4 spacer with well-designed suitable thickness. Then, the oxide-5 layer 1604 is deposited and etched by the anisotropic etching technique to create oxide-5 spacer. Then, the nitride-5 layer 1606 is deposited and etched by the anisotropic etching technique to create nitride-5 spacer. Then, the oxide-6 layer 1608 is deposited over an entire surface shown in FIG. 16. Therefore, in summary, there are the oxide-6 layer 1608 is outside the nitride-5 spacer, the nitride-5 spacer is outside the oxide-5 spacer, and the oxide-5 spacer is outside the nitride-4 spacer and all the above-mentioned spacers are surrounding and along the gate structure (such as, the oxide-4 layer 1404/the nitride-3 layer 1402/the gate material 1306).

Figure 17:
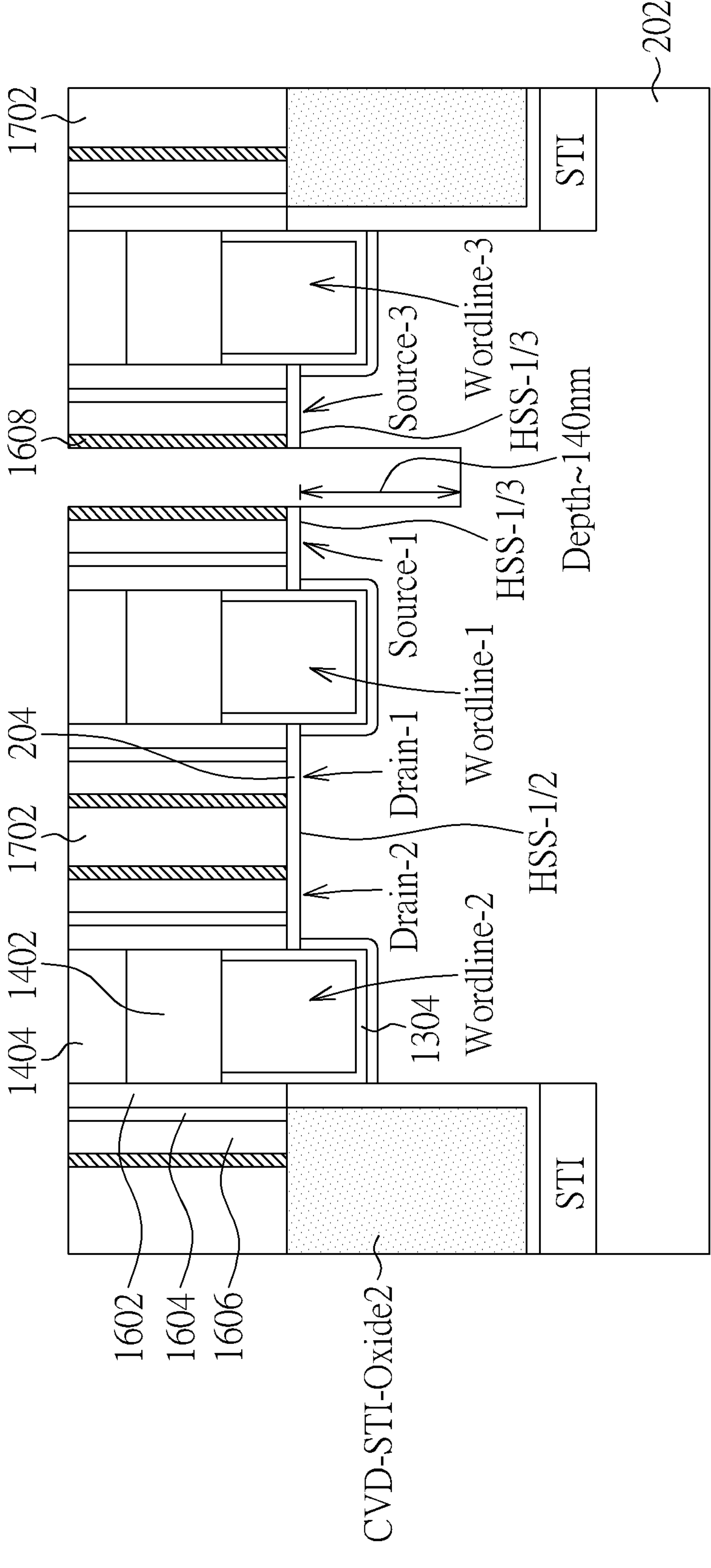
FIG. 17 is a diagram illustrating the spin-on dielectrics (SOD) being deposited and generating the hole.

As shown in FIG. 16, FIG. 17, for convenience and clarity of describing the DRAM cell array with word lines and bit lines, the word line located at a center is labeled word line-1 (corresponding to the access transistor AQ1), the word line next to a left side of the word line-1 is labeled word line-2 (corresponding to an access transistor AQ2 next to a left side of the access transistor AQ1), and drain regions (drain-1 and drain-2) between the word line-1 and the word line-2 still covered by the pad-oxide layer 204 are reserved for the drain of the access transistor AQ1 and a drain of the access transistor AQ2. The word line next to a right side of the word line-1 is labeled word line-3 (corresponding to an access transistor AQ3 next to a right side of the access transistor AQ1), and source regions (source-1 and source-3) between the word line-1 and the word line-3 still covered by the pad-oxide layer 204 are reserved for the source of the access transistor AQ1 and a source of the right access transistor AQ3. In addition, taking the word line-1 and the access transistor AQ1 as an example, as shown in FIG. 16, the word line 1 is obviously coupled to the gate structure of the access transistor AQ1, wherein the word line 1 includes an upper portion above the semiconductor surface 208 of the p-type substrate 202, and a sidewall of the upper portion of the word line 1 is obviously aligned with a sidewall of the gate structure.

In Step 142, as shown in FIG. 17, the spin-on dielectrics (SOD) 1702 is deposited, wherein the SOD 1702 is thick enough to fill into vacancies (corresponding to the drain region and the source region) among the word lines and the SOD 1702 is polished to a flat level with a top surface of the oxide-4 layer 1404 by the CMP technique. In addition, the oxide-6 layer 1608 is also polished to make a top surface of the oxide-6 layer 1608 be leveled off equally with the top surface of the oxide-4 layer 1404. A photoresist is deposited on a flat surface to cover the SOD 1702 corresponding to the drain region (the drain-1 and the drain-2), and to expose the SOD 1702 corresponding to the source region (the source-1 and the source-3) for subsequent processes. Then, the oxide-6 layer 1608 surrounding the word lines can act as a self-alignment mask to remove the SOD 1702 corresponding to the source region (the source-1 and the source-3), and the pad-oxide layer 204 at a center of the source region is etched away so as to expose the HSS. Then, as shown in FIG. 17, silicon material corresponding to the HSS-1/3 is dug and removed by the anisotropic etching to generate a hole-1/3 (e.g. as deep as 140 nm) which is surrounded by the lower-edge nitride-1 spacer and the oxide-1 spacer on two opposite sides and by the p-type substrate 202 on the other two opposite sides, respectively.

As shown in FIG. 17, the HSS (called as HSS-1/2) between the word line-1 and the word line-2 will be used as a location for the drain-1 (i.e., the drain of the access transistor AQ1) and the drain-2 (i.e., the drain of the access transistor AQ2), and also as a location for connecting the access transistors AQ1, AQ2 vertically to the UGBL. In addition, the HSS (called as HSS-1/3) between the word line-1 and the word line-3 will be used for the source-1 (i.e., the source of the access transistor AQ1) and the source-3 (i.e., the source of the access transistor AQ3), but the source-1 and the source-3 are separate and cannot be connected as the source-1 and the source-3 will be connected to extra cell storage nodes CSN1, CSN3, respectively. In addition, using SOD is because SOD has very high etching rate to be removed without hurting other existing materials and the SOD is resistant to other thermal processes than photoresist. All the unnecessary photoresist are removed as the desired pattern has been transferred to the SOD 1702 and thus the SOD 1702 is planarized as shown in FIG. 17.

Figure 18:
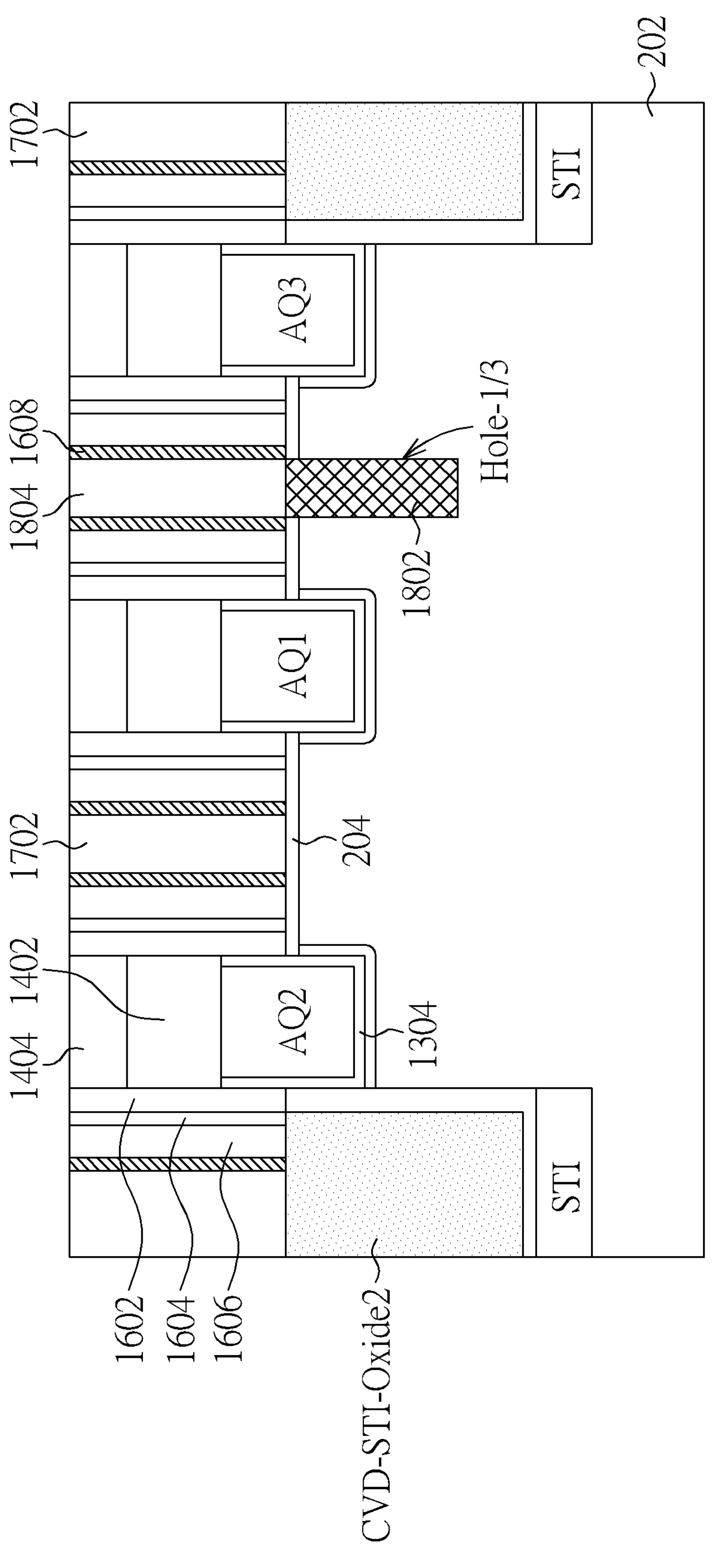
FIG. 18 is a diagram illustrating the oxide-7 layer being deposited in the hole and the another SOD layer being deposited above the oxide-7 layer.

In Step 144, as shown in FIG. 18, the oxide-7 layer 1802 is deposited, wherein the oxide-7 layer 1802 is thick enough to fill in the hole-1/3 and all the oxide-7 layer 1802 over the HSS is precisely removed by the isotropic etch but leave a newly formed oxide-7-vertical-isolaton to fill the hole-1/3 with a flat surface to the HSS. Then, the another SOD layer 1804 is deposited, wherein the SOD layer 1804 is thick enough to fill into the vacancy on a top surface of the oxide-7 layer 1802 in the hole-1/3, and top SOD material of the SOD layer 1804 is removed by the CMP technique until a top surface of the another SOD layer 1804 is leveled off as high as the top surface of the oxide-4 layer 1404.

Figure 19:
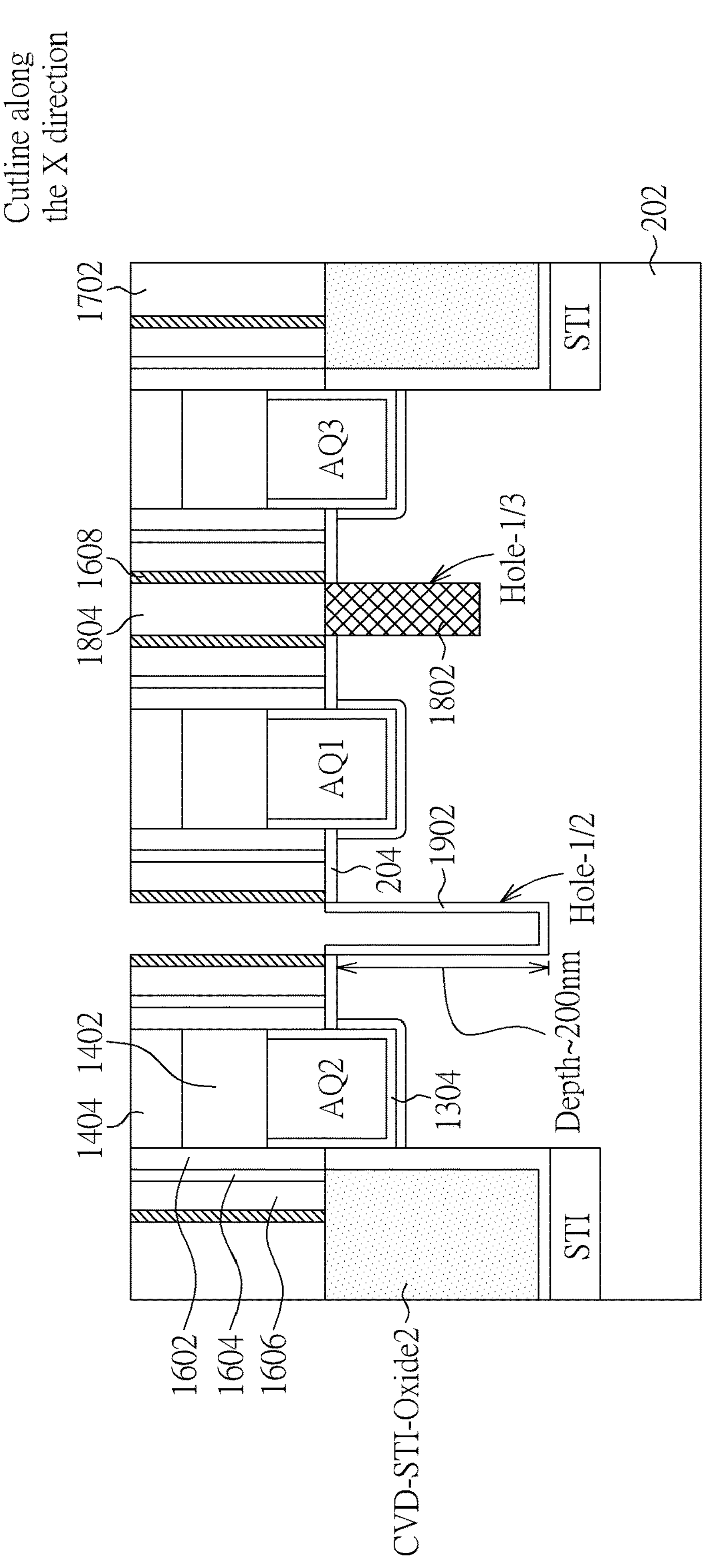
FIG. 19 is a diagram illustrating the SOD layer, the pad-oxide layer, and silicon material being removed to generate another hole.
Figure 20:
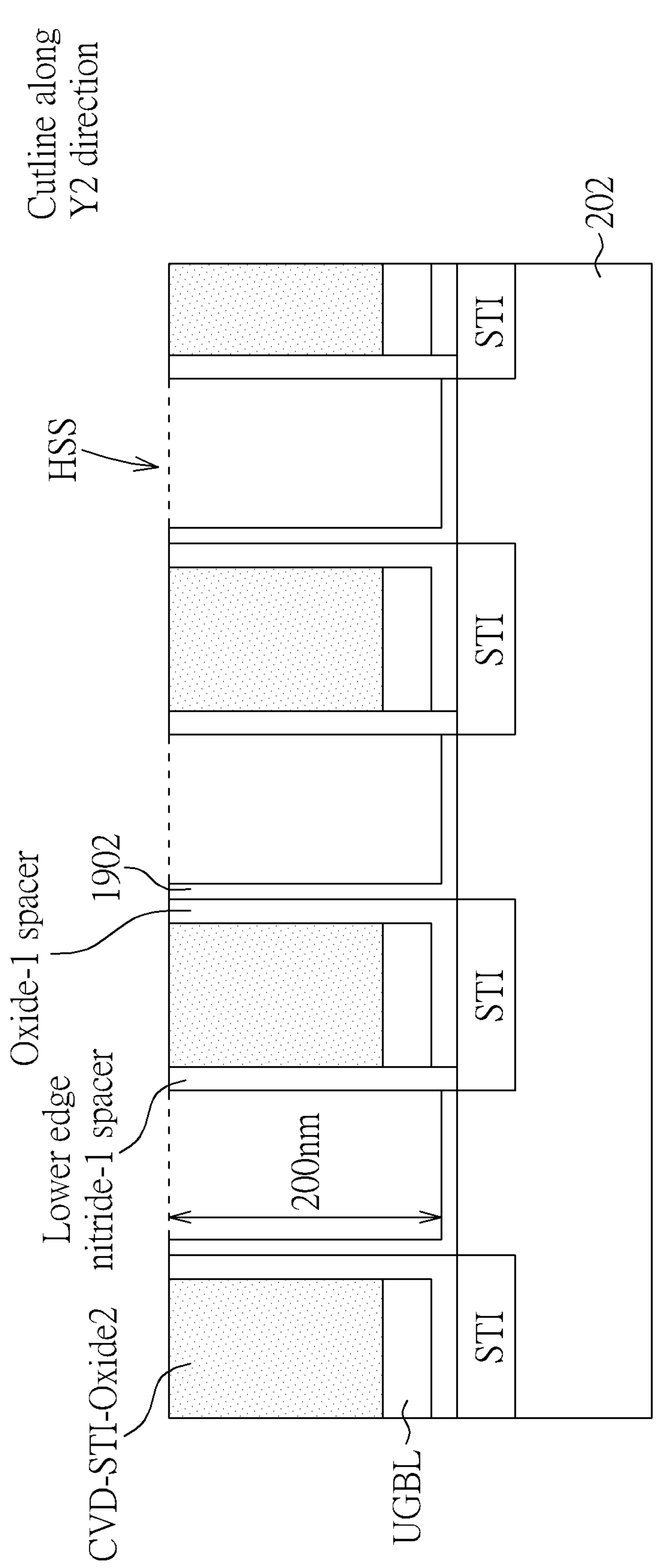
FIG. 20 is a diagram illustrating a cross-section view along a Y2 direction which is extended along the center of the hole-1/2 and perpendicular to the X direction.

In Step 146, as shown in FIG. 19, the patterned photoresist is deposited to cover an area corresponding to the source region and to expose an area reserved for the drain region. Then, the SOD 1702 in the hole-1/2 and the pad-oxide layer 204 underneath are removed to expose the HSS. Then, silicon material corresponding to the HSS-1/2 is dug and removed by the anisotropic etching to generate a hole-1/2 (e.g. as deep as 200 nm) which is physically surrounded by two opposite sides of the p-type substrate 202, respectively, a third side by the lower-edge nitride-1 spacer and a fourth side by the oxide-1 spacer, wherein both the third side and the fourth side are further bounded outside by the CVD-STI-oxide2. Then, the photoresist is removed and the oxide-8 layer 1902 is thermally grown to cover three inner sidewalls of four sidewalls of the hole-1/2 and a bottom of the hole-1/2, wherein another inner sidewall different from the three sidewalls is covered by the lower-edge nitride-1 spacer. FIG. 20 is a diagram illustrating a cross-section view of the DRAM cell array along a Y2 direction which is extended along the center of the hole-1/2 and perpendicular to the X direction, wherein as shown in FIG. 20, the active region is sandwiched by the CVD-STI-oxide2, the bit line (UGBL), the oxide-1 spacer, and the lower edge nitride-1 spacer.

Figure 21:
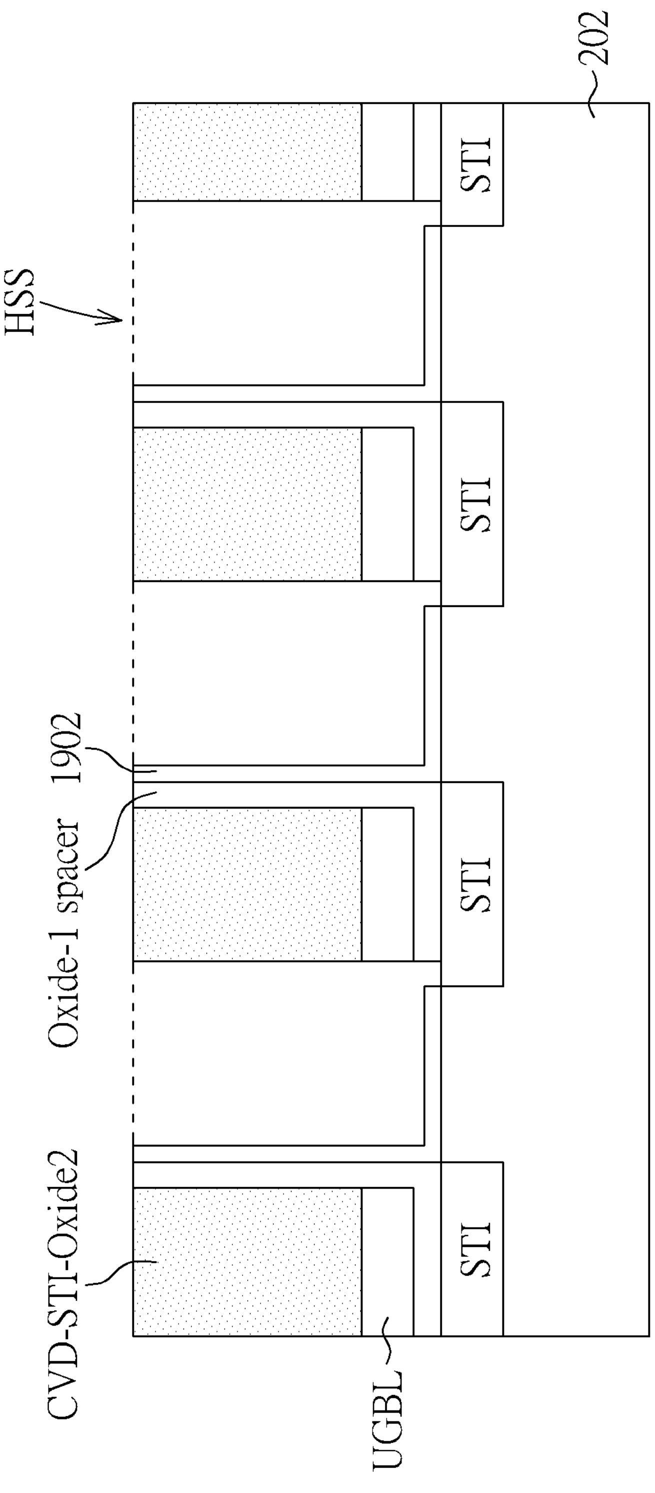
FIG. 21 is a diagram illustrating the lower-edge nitride-1 spacer on the another sidewall inside the another hole being removed.

In Step 148, as shown in FIG. 21, the lower-edge nitride-1 spacer on the another sidewall inside the hole-1/2 is removed by the isotropic etching technique (since the lower edge nitride-1 spacer is so thin so that the isotropic etching technique should not hurt the other structures over the HSS as the oxide-6 layer 1608 is also a good protection on the nitride-5 spacer (corresponding to the nitride-5 layer 1606), and should neither remove the oxide-8 layer 1902 inside the hole-1/2).

Figure 22:
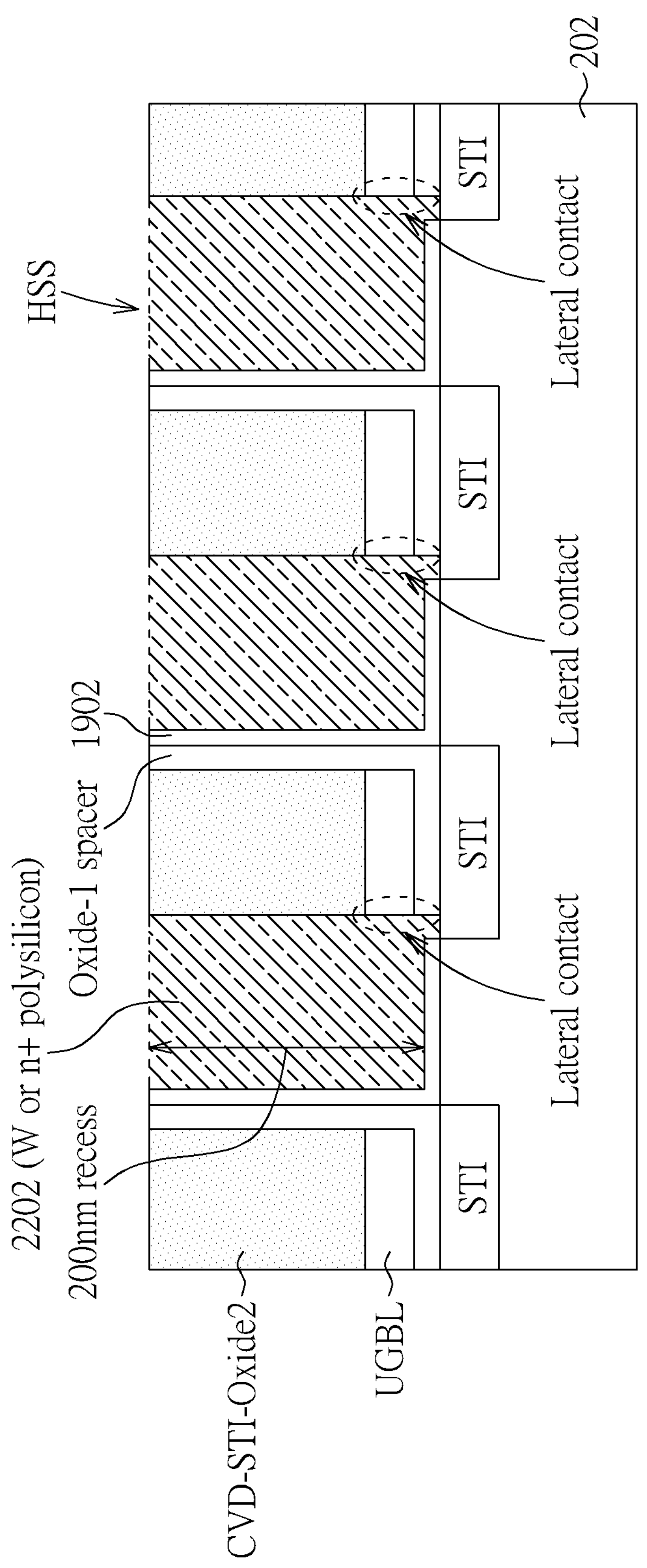
FIG. 22 is a diagram illustrating the n+ polysilicon being deposited and etched to leave the n+ polysilicon plug inside the another hole.

In Step 150, as shown in FIG. 22, the very heavily doped n+ polysilicon 2202 is deposited, wherein the n+ polysilicon or Tungsten (W) 2202 is thick enough to fill in the hole-1/2 so as to form a flat surface above and then all n+ polysilicon (or Tungsten) over the HSS is removed by the isotropic etching to leave the n+ polysilicon (or Tungsten) plug inside the hole-1/2. As shown in FIG. 22, the n+ polysilicon (or Tungsten) plug is connected to the UGBL from its sidewall of the n+ polysilicon (or Tungsten) plug to a sidewall of the UGBL inside the hole-1/2, and such connection is a fifth key characteristic of the present invention, wherein both the n+ polysilicon (or Tungsten) plug and the UGBL are conductive materials to be connected in a sidewall self-alignment way, but are kept fully isolated by the oxide-8 layer 1902 from the p-type substrate 202.

Figure 23:
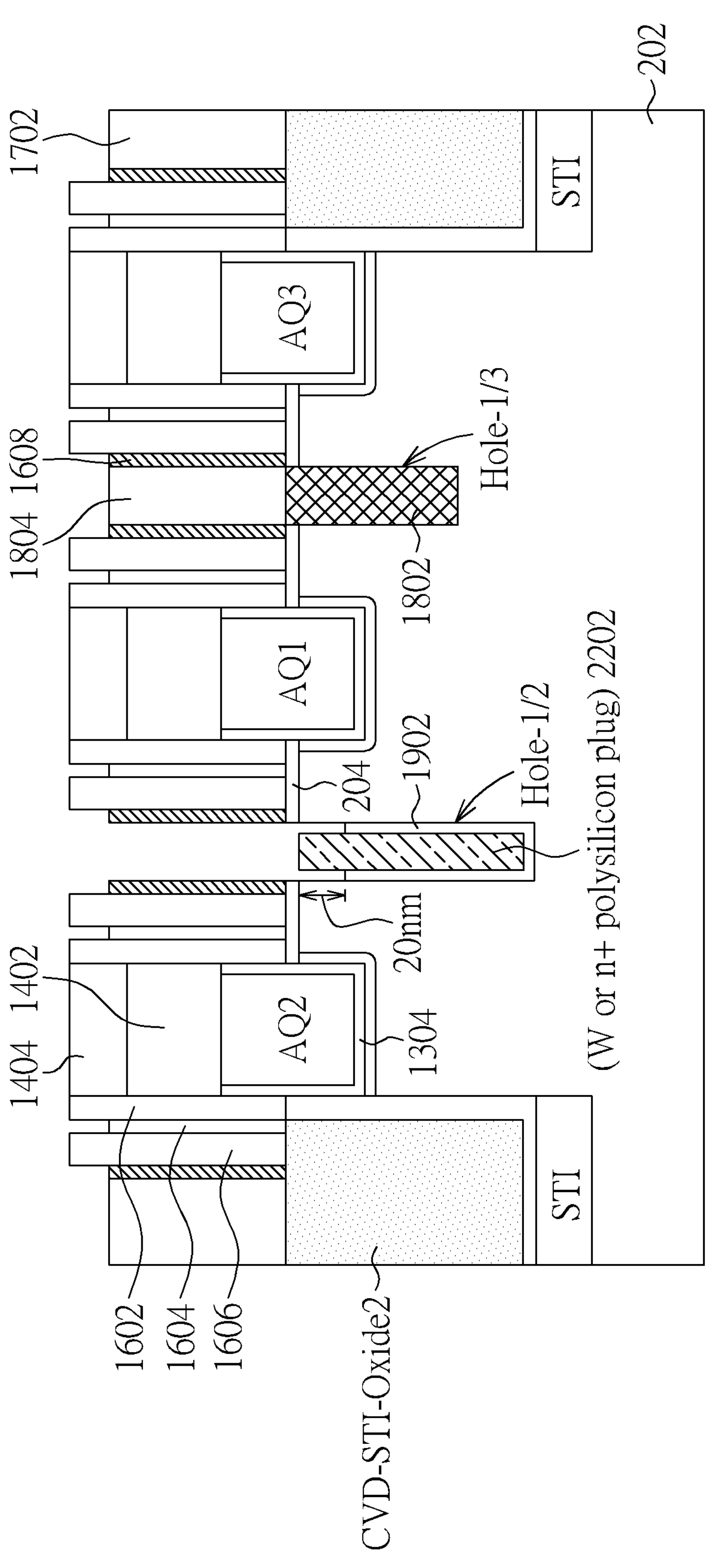
FIG. 23 is a diagram illustrating the upper oxide-8 layer being removed to generate the oxide-8 spacer inside the another hole.

In Step 152, as shown in FIG. 23, the upper oxide-8 layer 1902 is removed by an appropriate amount (such as a height of 20 nm below the HSS) through the anisotropic etching technique to generate the oxide-8 spacer inside the hole-1/2, wherein the oxide-8 spacer has a lower height than that of the n+ polysilicon (or Tungsten) plug (e.g., about 20 nm from the HSS).

Figure 24A:
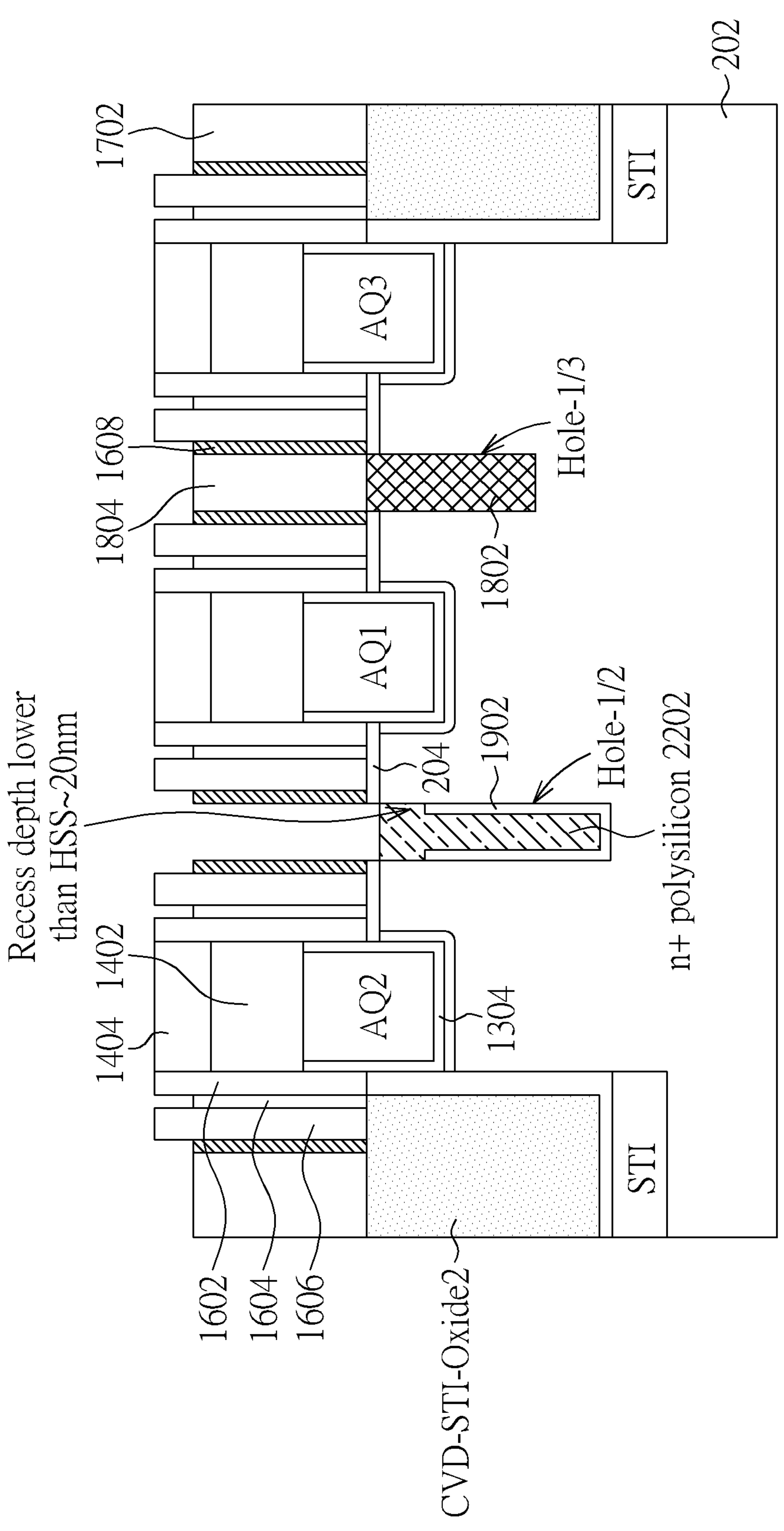
FIG. 24A is a diagram illustrating the neck-type surrounding conductive n+ polysilicon and the n+ polysilicon plug being generated.
Figure 25A:
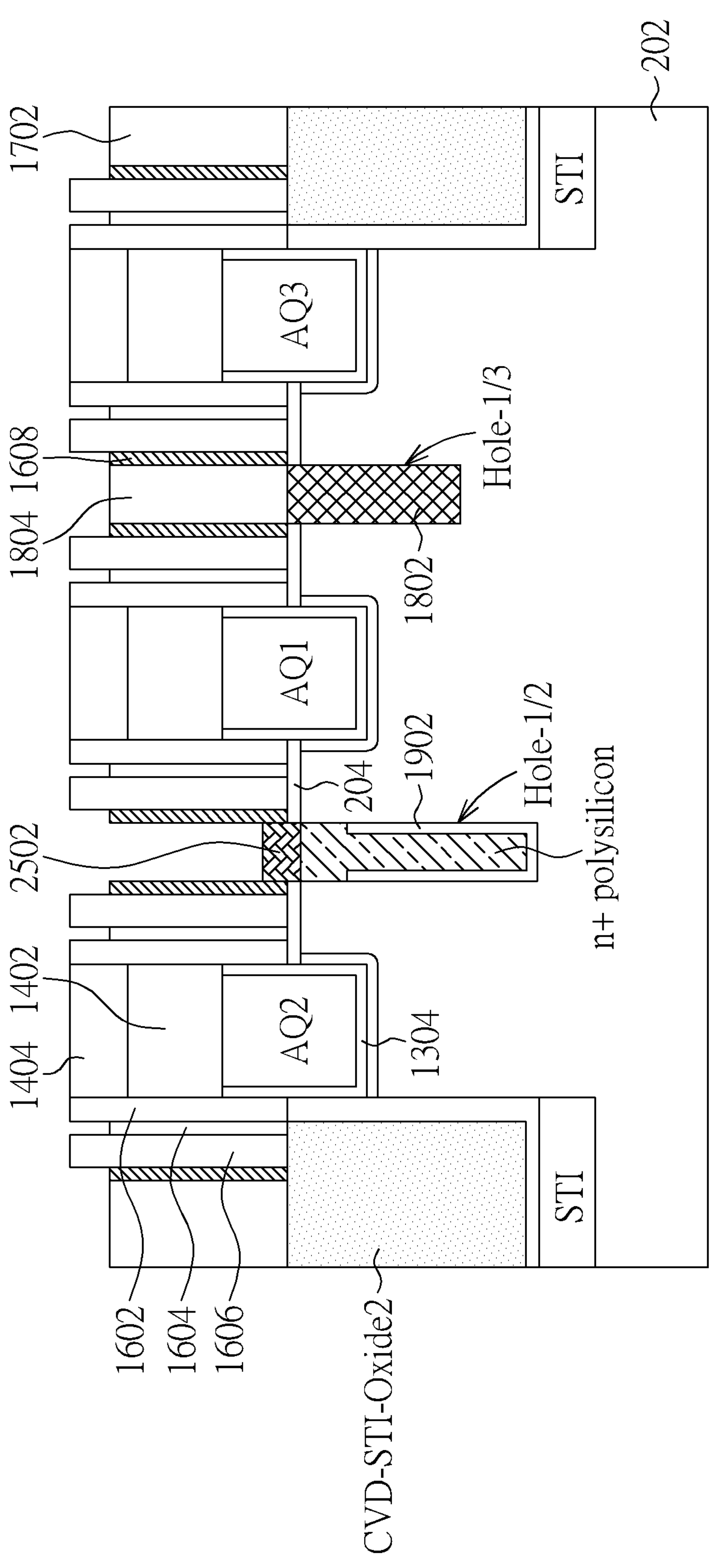
FIG. 25A is a diagram illustrating the thin oxide-9 layer being thermally grown locally over the n+ polysilicon plug.

In Step 154, as shown in FIG. 24A, when the n+ polysilicon plug is used as example, the thin layer of n+ polysilicon material is grown by using silicon seeds provided by the n+ polysilicon plug and the selective epitaxy growth (SEG) technique, thus resulting in a neck-type surrounding conductive n+ polysilicon (i.e., the thin layer of n+ polysilicon material) connecting to the HSS on two sides of the hole-1/2 as the drain-1 and the drain-2 of the access transistors AQ1, AQ2, respectively, and also as a conductive bridge contact between the UGBL and the access transistors AQ1, AQ2, wherein the neck-type surrounding conductive n+ polysilicon is also named as n+ Collar. Then, in Step 156, as shown in FIG. 25A, the thin oxide-9 layer 2502 (i.e., an isolation cap) is thermally grown locally over the n+ polysilicon plug to cap the HSS-1/2 but leave the n+ collar existing to be (or contact) the drain-1 of the access transistor AQ1 and the drain-2 of the access transistor AQ2. The above connection method of making an underlined bridge contact between the UGBL and the drain-1 (the drain-2) is a sixth key characteristic of the present invention, wherein the drain-1 and the drain-2 are oxide-capped n+ drains.

Figure 24B:
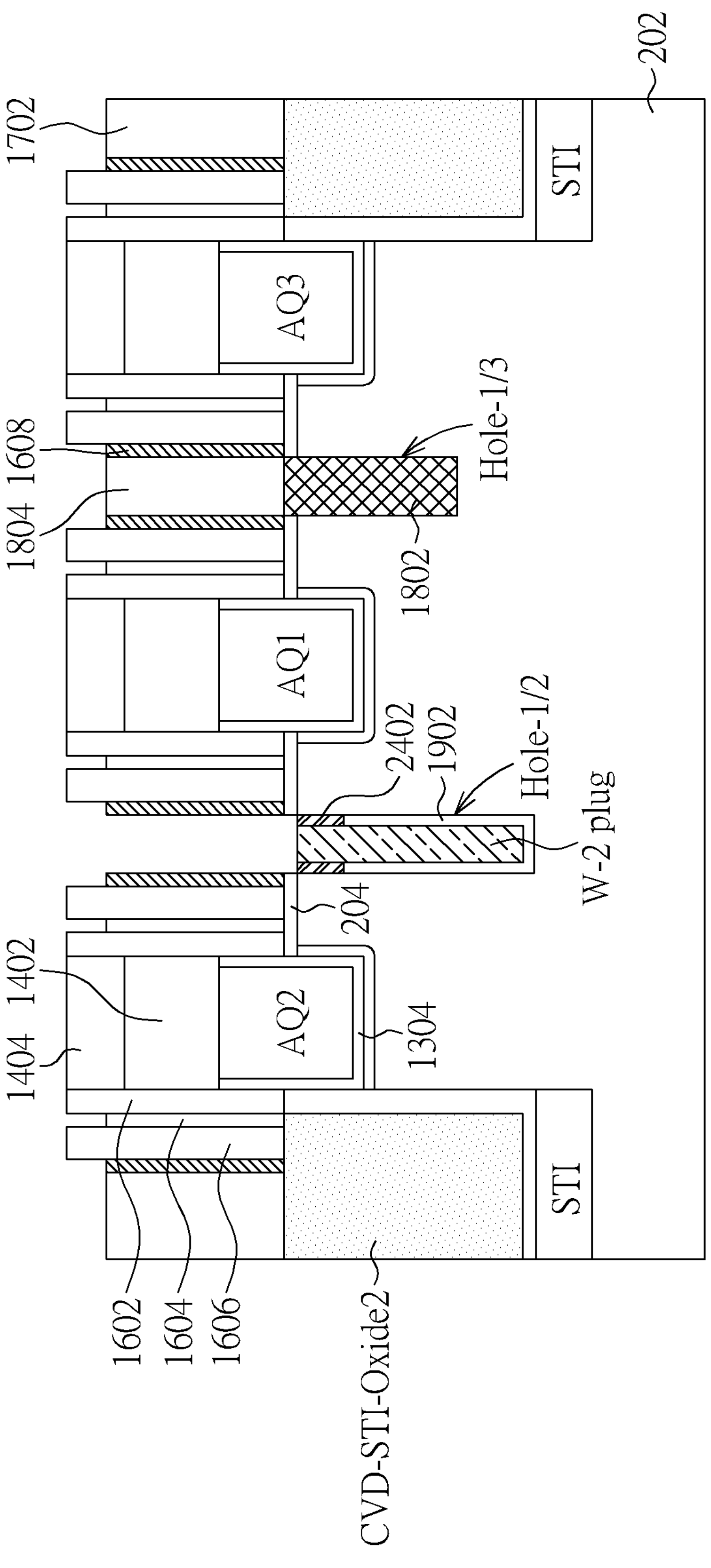
FIG. 24B is a diagram illustrating another way to implement the vertical connection (bridge) and W-2 plug.
Figure 25B:
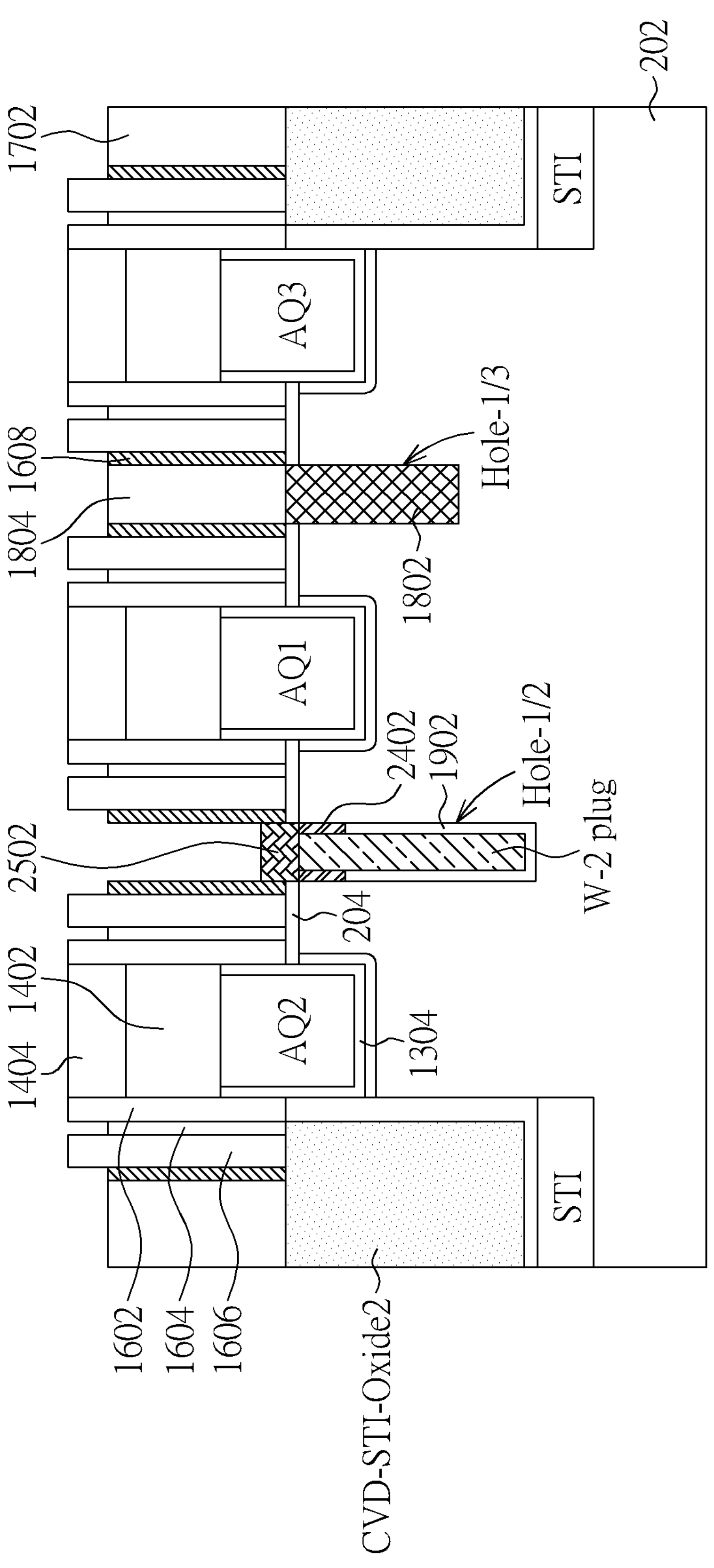
FIG. 25B is a diagram illustrating the thin oxide-9 layer being thermally grown locally over the W-2 plug.

In addition, please refer to FIG. 24B. FIG. 24B is a diagram illustrating another way to implement the vertical connection (bridge) and the drain-1 of the access transistor AQ1 (or the drain-2 of the access transistor AQ2), and how they are connected to the UGBL according to another embodiment of the present invention. By following the processes described above to thermally grow the oxide-8 layer 1902 and to remove the lower edge nitride-1 spacer within the hole-1/2, instead of depositing the n+ poly silicon layer 2202 inside the hole-1/2, a thick layer of Tungsten or other metal material is created (by depositing or any other way) to fill the hole-1/2 and then which is etched back to leave a Plug (called W-2 plug) inside the hole-1/2. The W-2 plug is connected with UGBL through its opening at the sidewall of the hole-1/2 which was covered by the lower edge nitride-1 spacer. A height of the W-2 plug is lower than the HSS by a well-designed distance from the HSS (e.g. about 20 nm). Exposed portion of the oxide-8 layer 1902 within the hole-1/2 but uncovered by the W-2 plug is removed by the anisotropic etching technique. Then, the n+ polysilicon layer 2402 is deposited to fill in the hole-1/2 and then is etched back to be leveled off to the HSS, thus resulting in a neck-type surrounding conductive n+ polysilicon (named as n+ Collar) connecting to the HSS on two sides of the hole-1/2 as the drain-1 and the drain-2 of the access transistors AQ1, AQ2, respectively, and also as a conductive bridge contact between the UGBL and the access transistors AQ1, AQ2. Then, as shown in FIG. 25B, the thin oxide-9 layer 2502 is thermally grown locally over the W-2 plug to cap the HSS-1/2 but leave the n+ collar existing to be the drain-1 of the access transistor AQ1 and the drain-2 of the access transistor AQ2.

The advantages of using the W-2 Plug connecting the UGBL with either an n-type doped or p-type doped drain or source, respectively, are: (1) the same type of the vertical bridge material can be used for connecting both a first conductive region (i.e., a drain) of NMOS (n-type metal-oxide-semiconductor) and a second conductive region (i.e., a drain) of PMOS (p-type metal-oxide-semiconductor) devices in a CMOS (complementary metal-oxide-semiconductor) technology and (2) the contact between the W-2 plug and the UGBL should have lower resistance due to using the same material.

Figure 26:
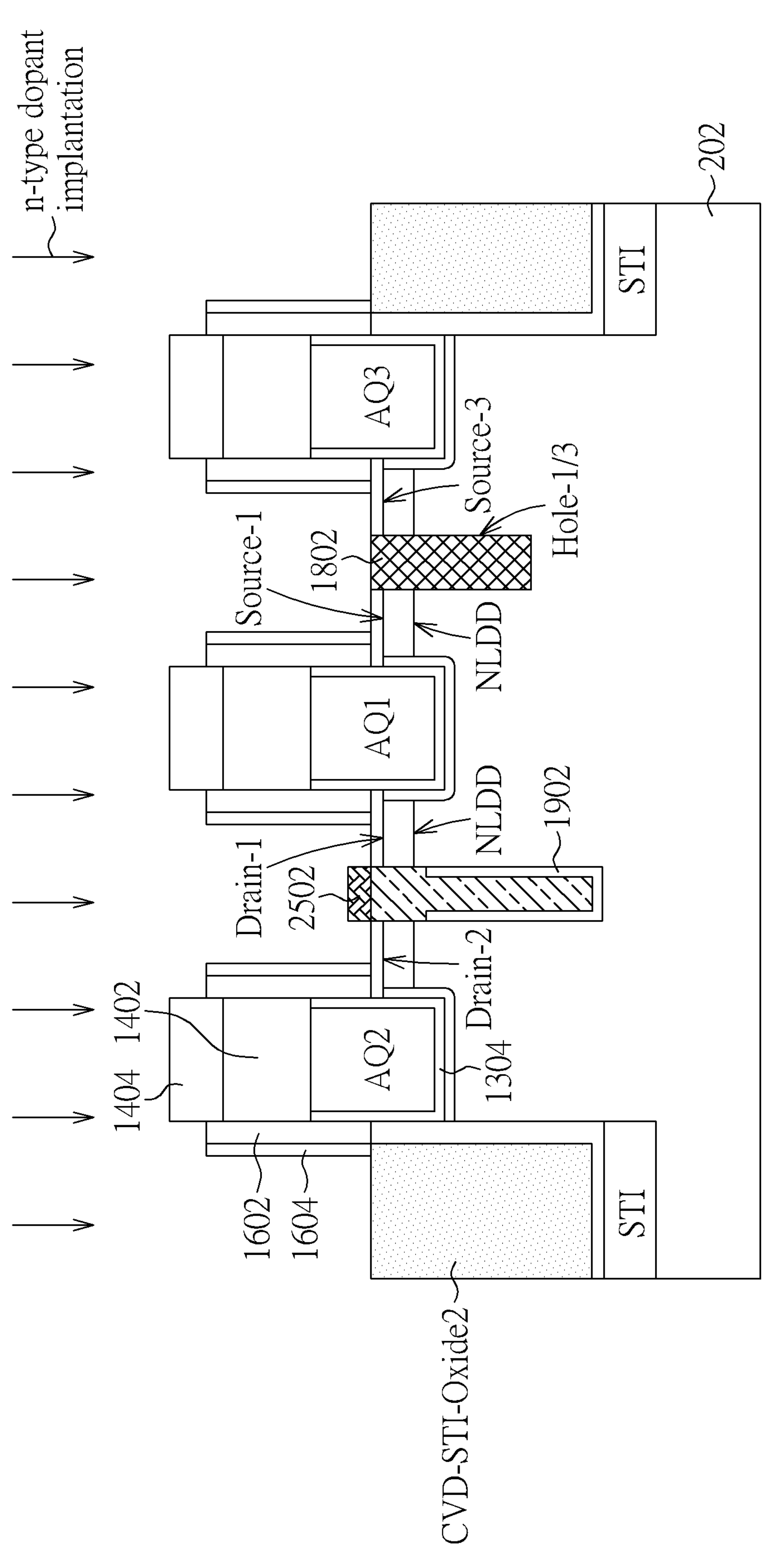
FIG. 26 is a diagram illustrating the oxide-6 layer and the nitride-5 spacer being removed, and then utilizing the n-type dopant implantation to create both the drains and the sources of the access transistors.

In Step 158, as shown in FIG. 26, the oxide-6 layer 1608 and the nitride-5 spacer are removed, and then the n-type dopant implantation through the pad-oxide layer 204 can be used to create both the drains and the sources (i.e., the drain-1 and the source-1 of the access transistor AQ1, the drain-2 of the access transistor AQ2, and the source-3 of the access transistor AQ3) with n-p junctions to the p-type substrate 202. In addition, a rapid thermal annealing (RTA) processing step may be needed to activate the n-type dopant to eliminate any defects due to ion implantation. In addition, n-type lightly doped drains (NLDD) can be formed under the oxide-5 spacer and the nitride-4 spacer.

Figure 27:
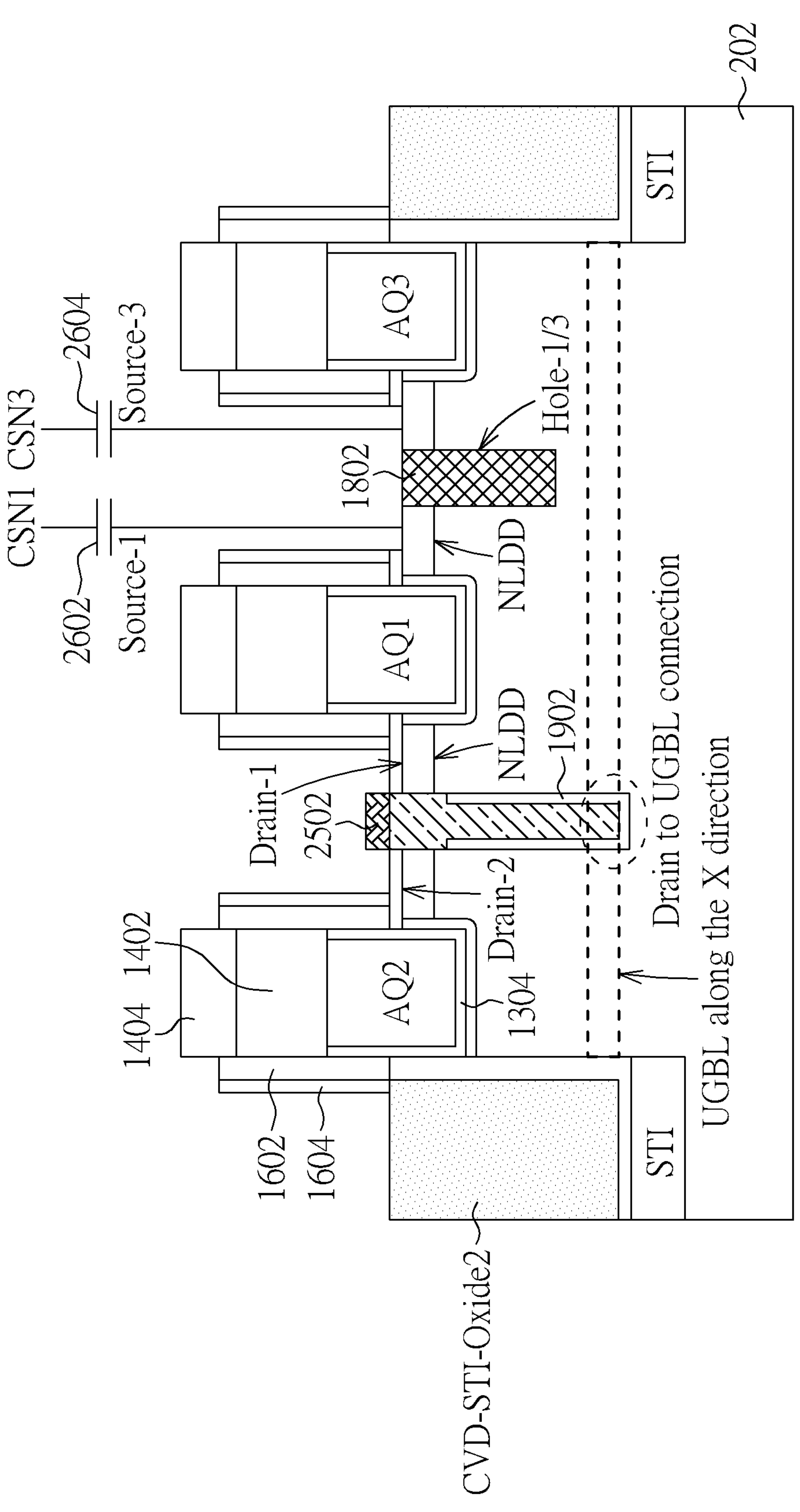
FIG. 27 is a diagram illustrating the principle of achieving an underground interconnection which is connected to drains of the access transistors through a self-aligned vertical connector and sources of the access transistors being connected to capacitors.
Figure 28:
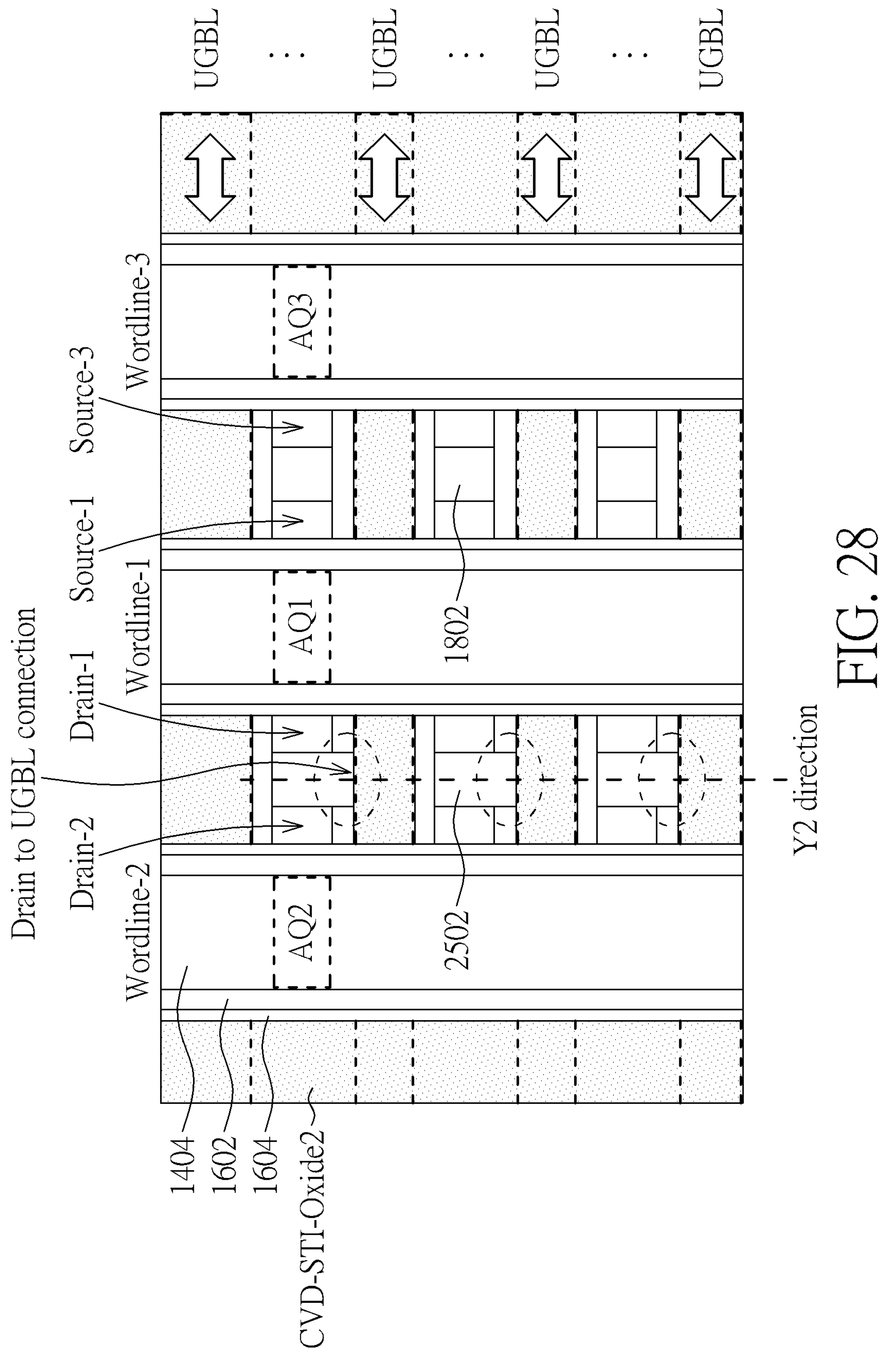
FIG. 28 is a diagram illustrating a top view of the DRAM cell array.

FIG. 27 and FIG. 28 are diagrams illustrating a cross-section and a top view of the DRAM cell array, respectively. As shown in FIG. 27 and FIG. 28, a principle of achieving an underground interconnection which is connected to a drain (e.g., the drain-1 and the drain-2) of an access transistor (e.g., the access transistor AQ1 and the access transistor AQ2) through a self-aligned vertical connector is shown. In addition, the source-1 and the source-3 are connected to capacitors 2602, 2604 respectively, wherein a commonly used method of making a stacked capacitor or a trench capacitor can be employed to generate the capacitors 2602, 2604 to complete a 1T1C cell of the DRAM cell array. In addition, a cross-section view of the DRAM cell array of FIG. 28 along the Y2 direction which can be referred to FIG. 20 could show the location of the UGBL. In addition, another transistor included in the DRAM cell array can be electrically coupled to a signal line (not shown in FIG. 28, e.g., a power line coupled to a voltage source or a ground source), wherein the signal line is distributed under the HSS and separated from the UGBL, and a distance between the HSS and the top surface of the UGBL is different from a distance between the HSS and a top surface of the signal line.

Similarly, by using the aforementioned principle, many other memory cells or device structures can also consider using such the UGBL and/or such the self-aligned connected gate and word line structures to fulfill a desired function by connecting the access transistors AQ1, AQ2 through underground connections to everywhere on the same die effectively. Such well-isolated interconnection/wire in the p-type silicon substrate 202 also could be applied to other types of transistors, such as FinFET (fin field-effect transistor), Tri-gate, and planar transistor, and so on.

Figure 29:
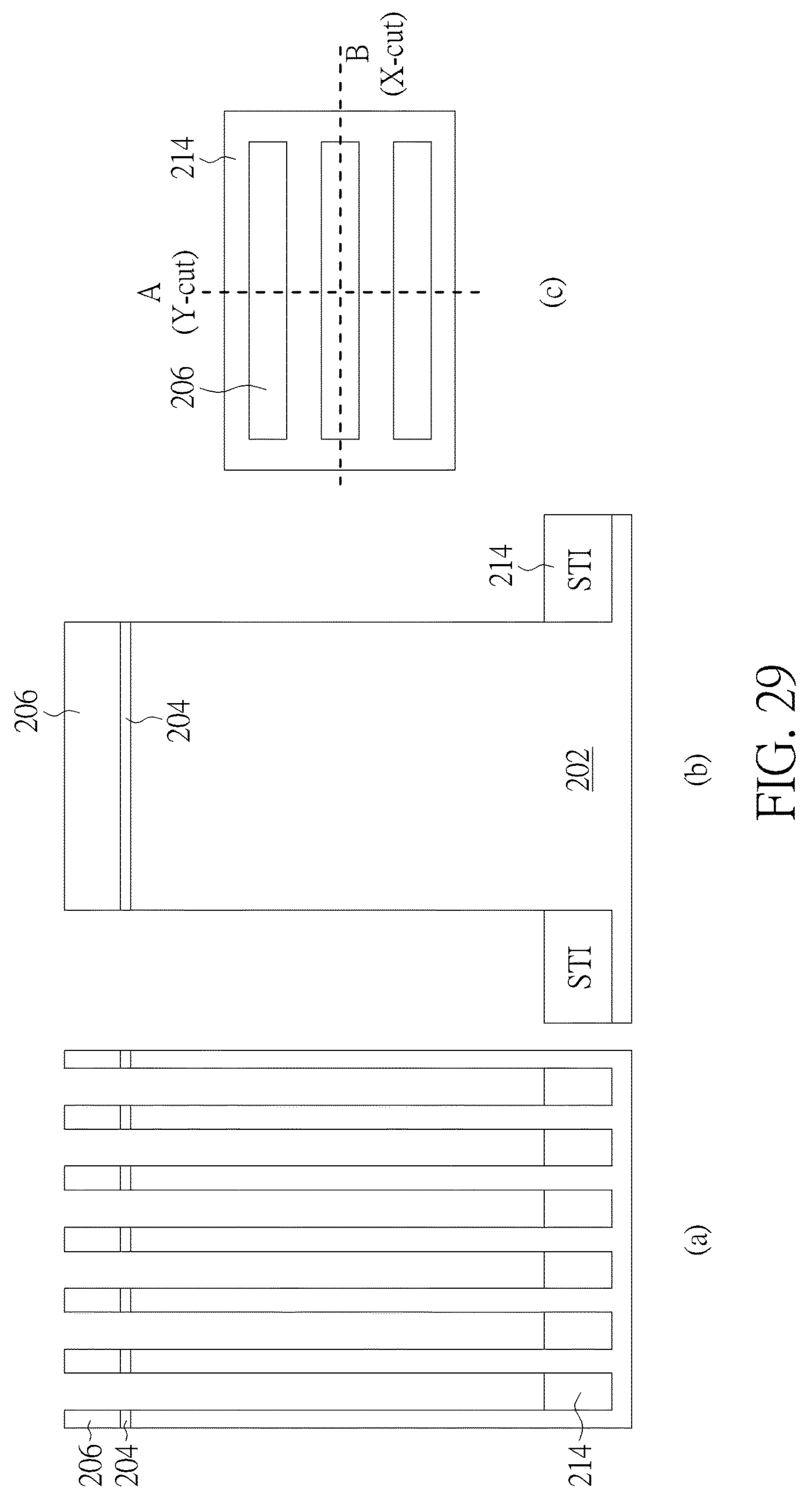
FIG. 29, FIG. 30, FIG. 31, FIG. 32, FIG. 33, FIG. 34, FIG. 35, FIG. 36 illustrate alternative processes to form asymmetric spacers and underground interconnection layers according to another embodiment of the present invention.

As previously mentioned, forming asymmetric spacers along the sidewalls of the active regions and forming underground interconnection lines (such as underground bit line (UGBL) or other conduction line) between the asymmetric spacers and below the silicon surface (HSS) are key inventions of the present application. The following introduces alternative processes to form such asymmetric spacers and underground interconnection lines. First of all, a pad-oxide layer 204 and a pad-nitride layer 206 are deposited to define the active regions, parts of silicon material outside the active regions are removed, and then the oxide layer 214 is deposited and etched back to form a shallow trench isolation (STI) region, see FIG. 29 wherein FIG. 29 (*c*) is a top view of the temporary structure after the STI region is formed, FIG. 29 (*a*) is a cross section view along Y-cut shown in FIG. 29 (*c*), and FIG. 29 (*b*) is a cross section view along X-cut shown in FIG. 29 (*c*).

Figure 30:
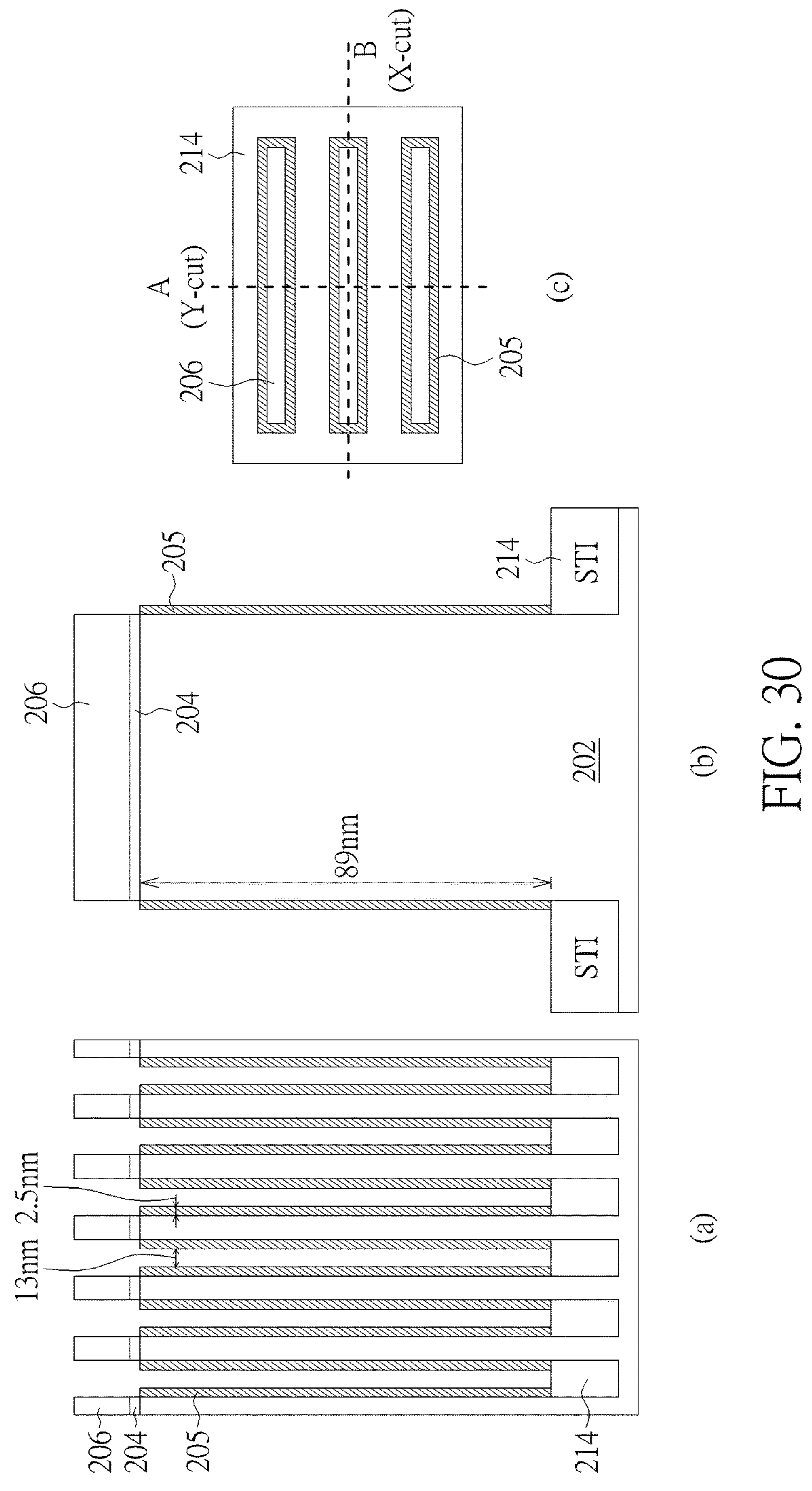
Figure 31:
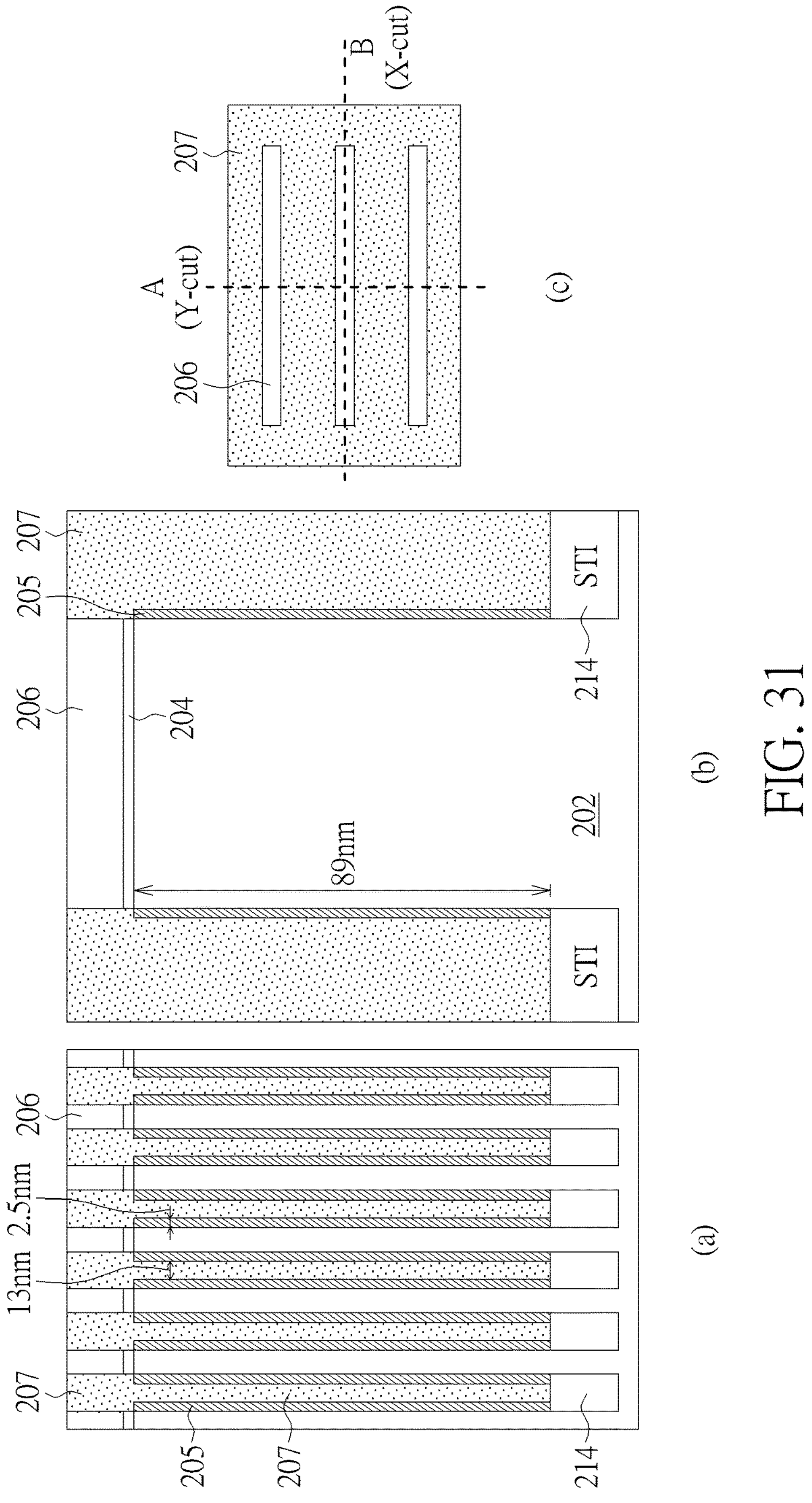

Thereafter, thermal oxide layers 205 are grown along the revealed sidewalls of the active regions, see FIG. 30 wherein FIG. 30 (*c*) is a top view of the temporary structure after the thermal oxide layers 205 are formed, FIG. 30 (*a*) is a cross section view along Y-cut shown in FIG. 30 (*c*), and FIG. 30 (*b*) is a cross section view along X-cut shown in FIG. 30 (*c*). Then, SOD material 207 is deposited and planarized by CMP process, see FIG. 31 wherein FIG. 31 (*c*) is a top view of the temporary structure after the SOD material 207 is planarized, FIG. 31 (*a*) is a cross section view along Y-cut shown in FIG. 31 (*c*), and FIG. 31 (*b*) is a cross section view along X-cut shown in FIG. 31 (*c*).

Figure 32:
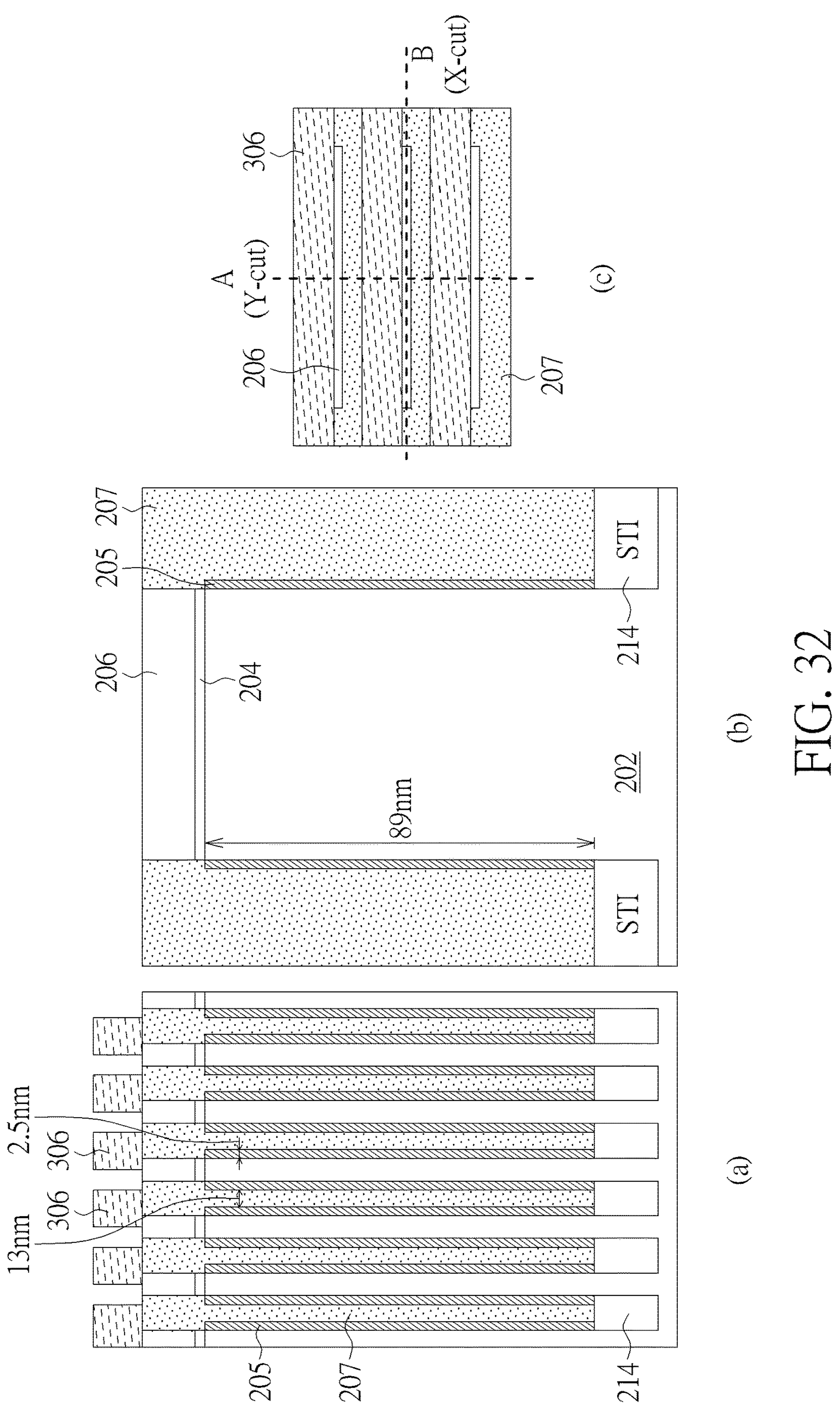
Figure 33:
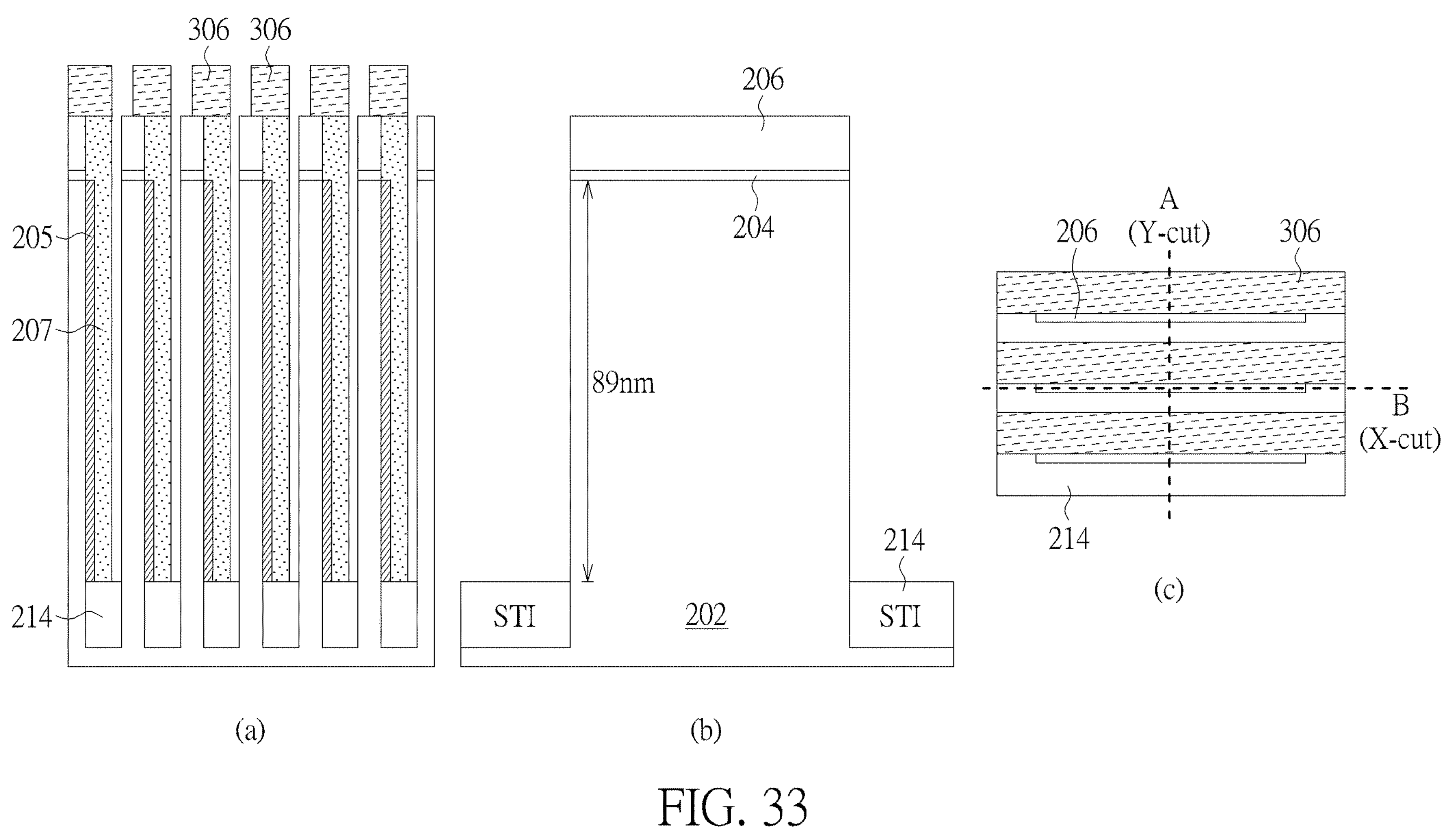

Afterward, a photo-resistance layer 306 is formed and patterned to cover portion (such as 1/2) of the active region and reveal portion of the SOD material 207, see FIG. 32 wherein FIG. 32 (*c*) is a top view of the temporary structure after the portion of the SOD material 207 is revealed, FIG. 32 (*a*) is a cross section view along Y-cut shown in FIG. 32 (*c*), and FIG. 32 (*b*) is a cross section view along X-cut shown in FIG. 32 (*c*). Then, the uncovered SOD material 207 and the thermal oxide 205 under the uncovered SOD material 207 are removed to form narrow slots (the width of the narrow slot is 2~5 nm, such as 3 nm, when the technology node is around 8~20 nm), see FIG. 33 wherein FIG. 33 (*c*) is a top view of the temporary structure after the uncovered SOD material 207 and the thermal oxide 205 are removed, FIG. 33 (*a*) is a cross section view along Y-cut shown in FIG. 33 (*c*), and FIG. 33 (*b*) is a cross section view along X-cut shown in FIG. 33 (*c*). It is noticed that, after the uncovered SOD material 207 and the thermal oxide 205 under the uncovered SOD material 207 are removed, the narrow slot reveals one sidewall of the active region.

Figure 34:
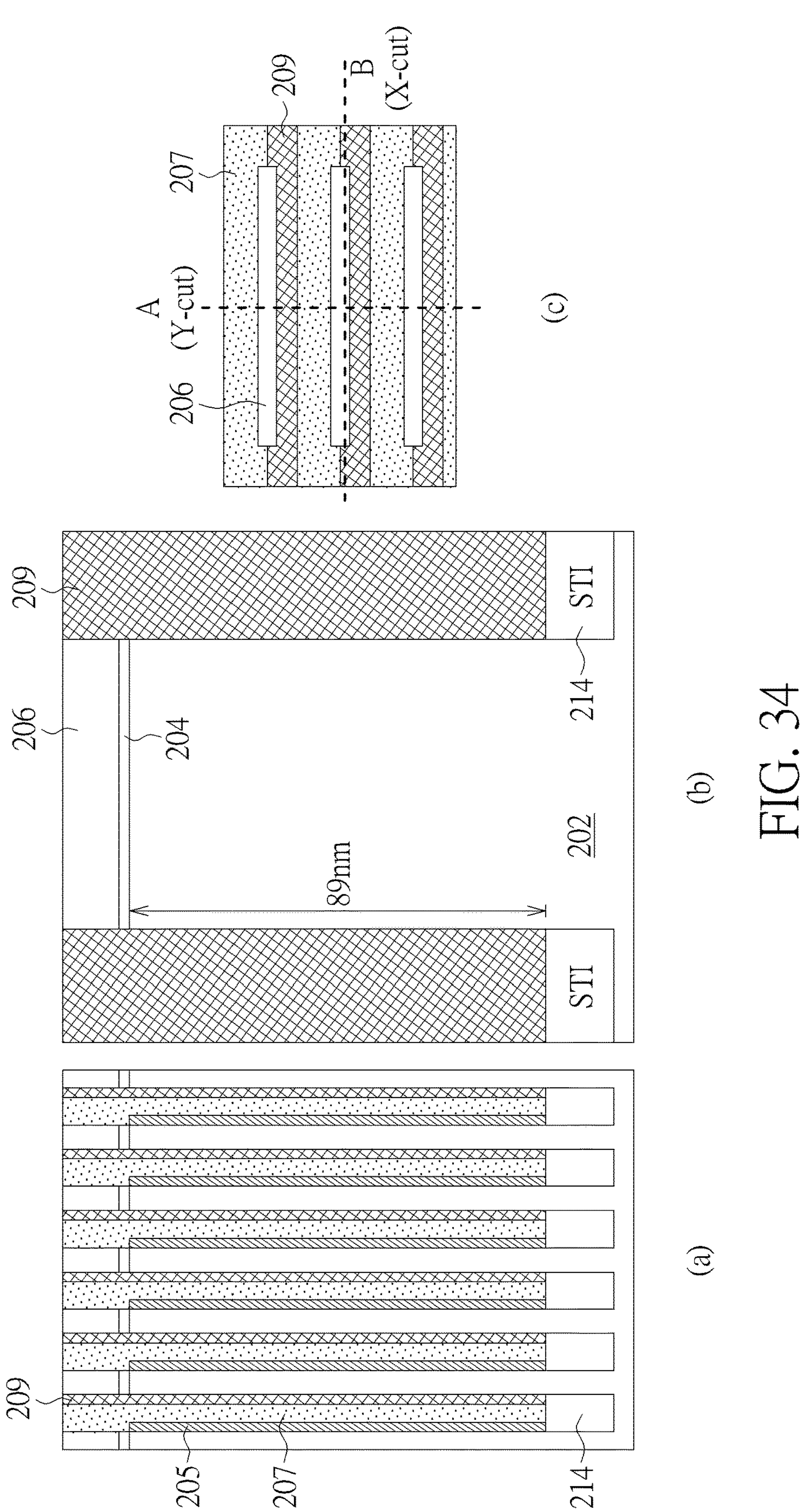

As shown in FIG. 34, after the patterned photo-resistance 306 is removed, SiOCN material 209 is deposited within the narrow slots and planarized. Therefore, asymmetric spacers which include different materials (such as the oxide spacer 205 and the SiOCN spacer 209) within STI region are formed. In another view, such asymmetric spacers also cover two sidewalls of the active region, respectively. Wherein, FIG. 34 (*c*) is a top view of the temporary structure after the SiOCN material 209 is deposited and planarized, FIG. 34 (*a*) is a cross section view along Y-cut shown in FIG. 34 (*c*), and FIG. 34 (*b*) is a cross section view along X-cut shown in FIG. 34 (*c*).

Figure 35:
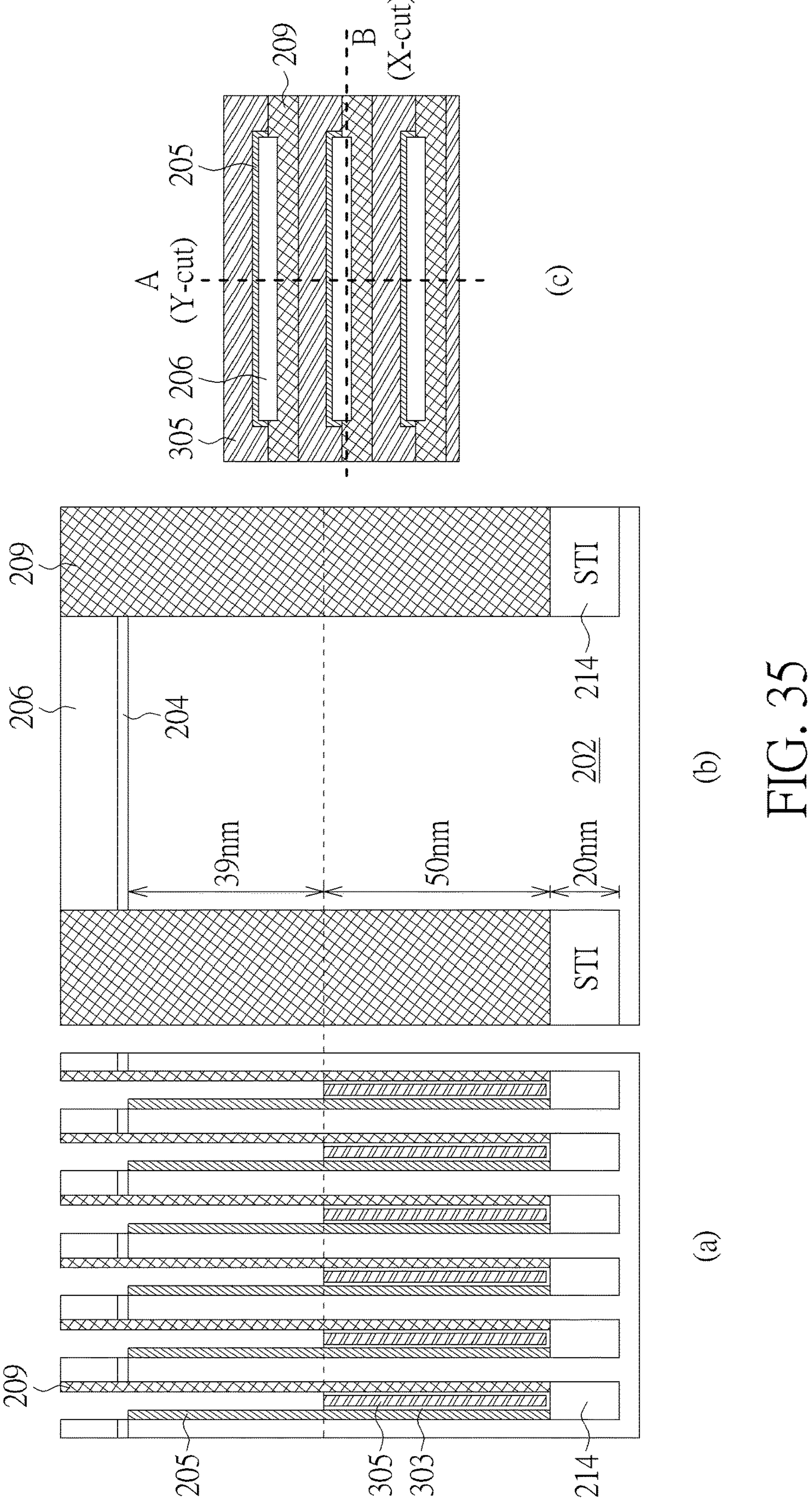
Figure 36:
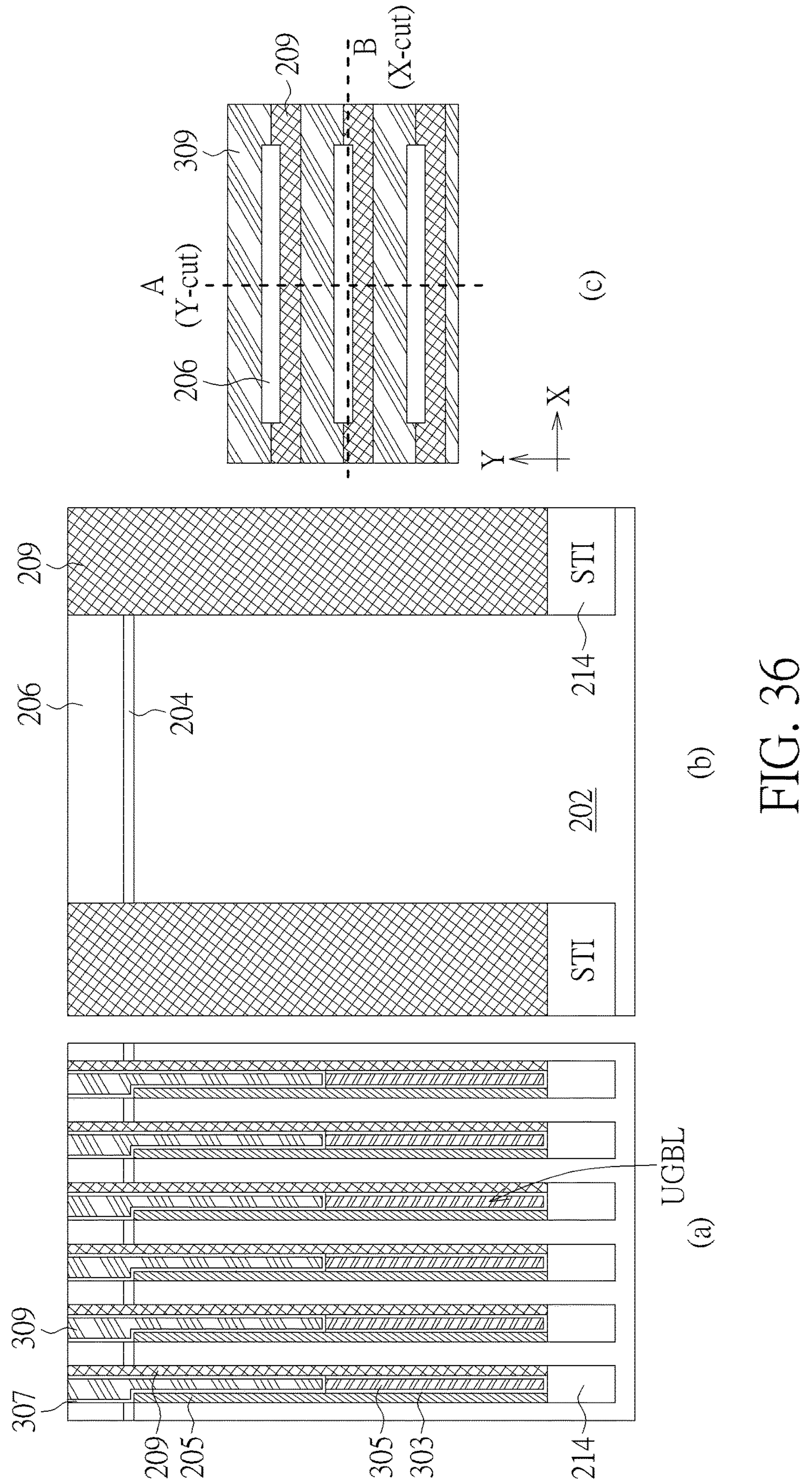
Figure 37:
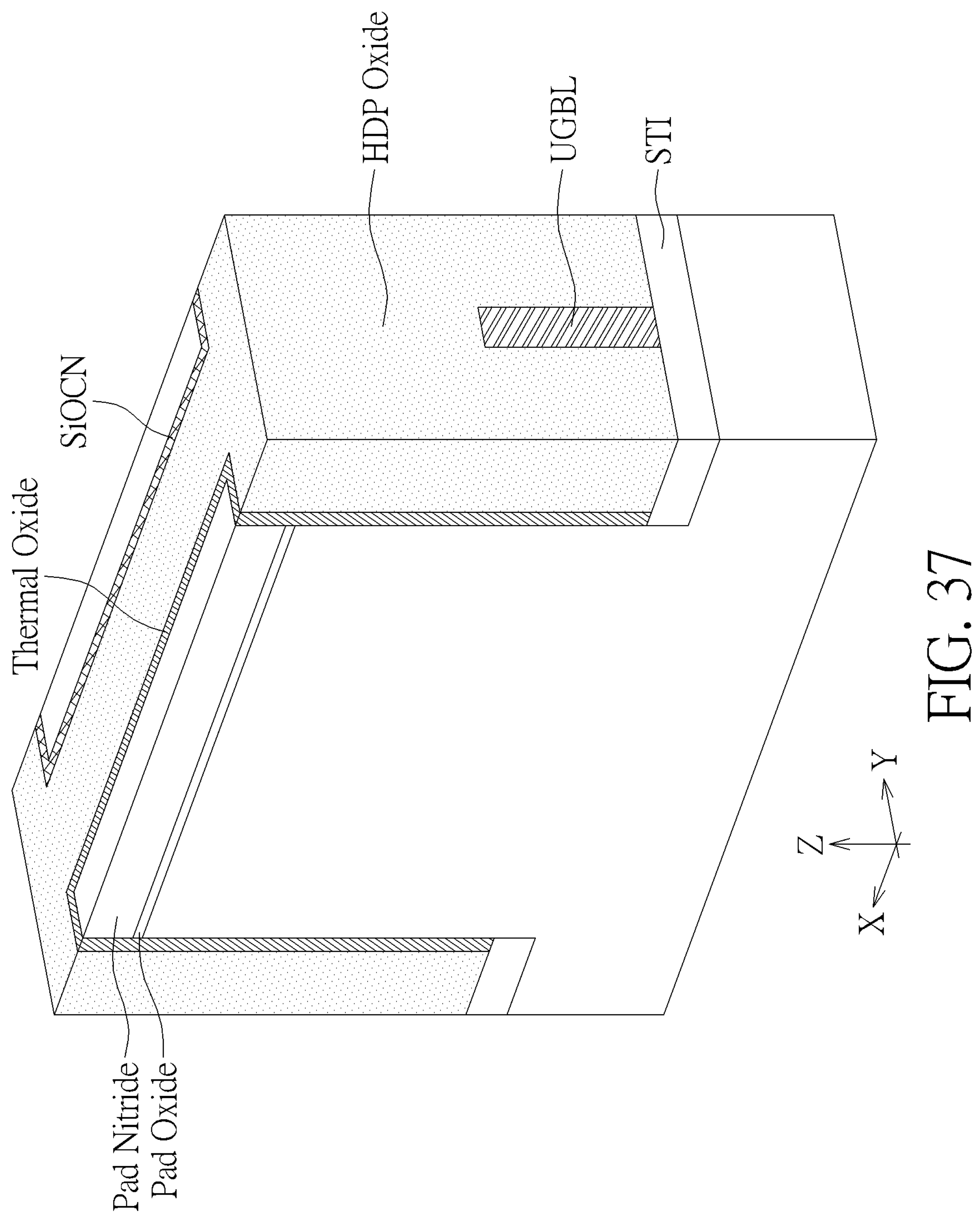
FIG. 37 is a 3D perspective view of the temporary structure shown in FIG. 36.

Afterward, the SOD material 207 is removed, TiN layer 303 and Tungsten layer 305 are deposited between the oxide spacer 205 and SiOCN spacer 209, and then the TiN layer 303 and the Tungsten layer 305 are etched back to form the underground interconnection lines, see FIG. 35 wherein FIG. 35 (*c*) is a top view of the temporary structure after the underground interconnection lines are formed, FIG. 35 (*a*) is a cross section view along Y-cut shown in FIG. 35 (*c*), and FIG. 35 (*b*) is a cross section view along X-cut shown in FIG. 35 (*c*). Then, SiN layer 307 and HDP (high density plasma) oxide layer 309 are formed to cover the underground interconnection lines, see FIG. 36 wherein FIG. 36 (*c*) is a top view of the temporary structure after the SiN layer 307 and the HDP oxide layer 309 are formed, FIG. 36 (*a*) is a cross section view along Y-cut shown in FIG. 36 (*c*), and FIG. 36 (*b*) is a cross section view along X-cut shown in FIG. 36 (*c*). FIG. 37 is a 3D perspective view of the temporary structure in FIG. 36.

To sum up, the present invention introduces a well-isolated interconnection/wire under the silicon surface which enables connecting transistors from their bottom sides inside the silicon substrate in addition to only using interconnections above the transistor surface.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A method forming a semiconductor structure comprising:

preparing a semiconductor substrate with an original surface;

based on the semiconductor substrate, forming a set of active regions and forming a shallow trench isolation region between two adjacent active regions of the set of active regions;

forming asymmetrical spacers within the shallow trench isolation region between the two adjacent active regions, wherein a first spacer of the asymmetrical spacers is an oxide spacer covering a sidewall of a first active region of the two adjacent active regions, and a second spacer of the asymmetrical spacers is deposited within a narrow slot which reveal a sidewall of a second active region of the two adjacent active regions; and forming a first interconnection layer between the asymmetrical spacers; wherein the first interconnection layer is within the shallow trench isolation region and under the original surface of the semiconductor substrate.

2. The method of claim 1, wherein the material of the first spacer is different from that of the second spacer.

3. The method of claim 1, wherein the second spacer is made of SiOCN.

4. The method of claim 1, further comprising:

forming a gate region of a transistor within the second active region and forming a second interconnection layer, wherein the gate region of the transistor is connected to the second interconnection layer; and forming a connection plug in the second active region to electrically connect the first interconnection layer.

5. The method of claim 4, the step of forming the gate region of the transistor and the second interconnection layer comprising:

etching the second active region to create a concave therein;

depositing a high-k insulator layer in the concave; and depositing a first conductive material to form the gate region of the transistor and the second interconnection.

6. The method of claim 4, the step of forming the connection plug comprising:

etching the second active region to create a hole and forming a dielectric layer in the hole;

based on the hole, removing the second spacer to reveal a sidewall of the first interconnection layer; and depositing a second conductive material in the hole to contact the sidewall of the first interconnection layer.

7. The method of claim 4, wherein the semiconductor structure is a DRAM cell, the first interconnection layer is a bit line, the transistor is an access transistor of a DRAM cell, and the second interconnection layer is a word line.

8. The method of claim 1, the step of forming the asymmetrical spacers comprising:

forming the oxide spacer to cover the sidewall of the first active region, and forming a temporary oxide spacer to cover the second active region;

depositing a sacrificial layer over the shallow trench isolation region and covering the oxide spacer and the temporary oxide spacer;

forming the narrow slot by removing a first portion of the sacrificial layer and the temporary oxide spacer to reveal the sidewall of the second active region; and depositing the second spacer within the narrow slot to cover the sidewall of the second active region.

9. The method of claim 8, wherein the narrow slot is fully occupied by the second spacer.

10. The method of claim 8, the step of forming the narrow slot comprising:

forming a patterned photo-resistance layer to reveal the first portion of the sacrificial layer; and removing the first portion of the sacrificial layer and the temporary oxide spacer covered by the first portion of the sacrificial layer to form the narrow slot.

11. The method of claim 8, wherein a width of the narrow slot is 2~5 nm.

* * * * *